(12) United States Patent
DeMartino et al.

(10) Patent No.: US 11,613,103 B2
(45) Date of Patent: *Mar. 28, 2023

(54) GLASS ARTICLES EXHIBITING IMPROVED FRACTURE PERFORMANCE

(71) Applicant: CORNING INCORPORATED, Corning, NY (US)

(72) Inventors: Steven Edward DeMartino, Painted Post, NY (US); Michelle Dawn Fabian, Horseheads, NY (US); Jeffrey Todd Kohli, Corning, NY (US); Jennifer Lynn Lyon, Painted Post, NY (US); Charlene Marie Smith, Corning, NY (US); Zhongzhi Tang, Shenzhen (CN)

(73) Assignee: Corning Incorporated, Corning, NY (US)

( * ) Notice: Subject to any disclaimer, the term of this patent is extended or adjusted under 35 U.S.C. 154(b) by 305 days.

This patent is subject to a terminal disclaimer.

(21) Appl. No.: 16/804,271

(22) Filed: Feb. 28, 2020

(65) Prior Publication Data

US 2020/0201397 A1   Jun. 25, 2020

Related U.S. Application Data

(62) Division of application No. 15/214,602, filed on Jul. 20, 2016, now Pat. No. 10,579,106.
(Continued)

(51) Int. Cl.
*G06F 1/16* (2006.01)
*B32B 17/06* (2006.01)
(Continued)

(52) U.S. Cl.
CPC ........ *B32B 17/10* (2013.01); *B32B 17/10018* (2013.01); *B32B 17/10137* (2013.01);
(Continued)

(58) Field of Classification Search
None
See application file for complete search history.

(56) References Cited

U.S. PATENT DOCUMENTS

| 1,960,121 A | 5/1934 | Moulton |
| 3,107,196 A | 10/1963 | Acloque |

(Continued)

FOREIGN PATENT DOCUMENTS

| AU | 6452265 A | 10/1965 |
| AU | 2011212982 A1 | 8/2012 |

(Continued)

OTHER PUBLICATIONS

Dusil J. et al., "Black Colored Glass Ceramics Based on Beta-Quartz Solid Solutions," Glass 1977: proceedings of the 11th International Congress on Glass, Prague, Czechoslovakia, Jul. 4-8, 1977, vol. 2, pp. 139-149.

(Continued)

*Primary Examiner* — David Sample
(74) *Attorney, Agent, or Firm* — Jeffrey A. Schmidt

(57) ABSTRACT

Embodiments of this disclosure pertain to a strengthened glass article including a first surface and a second surface opposing the first surface defining a thickness (t) of about less than about 1.1 mm, a compressive stress layer extending from the first surface to a depth of compression (DOC) of about 0.1·t or greater, such that when the glass article fracture, it breaks into a plurality of fragments having an aspect ratio of about 5 or less. In some embodiments, the glass article exhibits an equibiaxial flexural strength of about 20 kgf or greater, after being abraded with 90-grit SiC particles at a pressure of 25 psi for 5 seconds. Devices incorporating the glass articles described herein and methods for making the same are also disclosed.

16 Claims, 21 Drawing Sheets

Related U.S. Application Data

(60) Provisional application No. 62/343,320, filed on May 31, 2016, provisional application No. 62/194,994, filed on Jul. 21, 2015.

(51) Int. Cl.
| | |
|---|---|
| *B32B 17/10* | (2006.01) |
| *C03C 21/00* | (2006.01) |
| *C03C 3/085* | (2006.01) |
| *C03C 3/091* | (2006.01) |
| *C03C 3/097* | (2006.01) |
| *C03C 3/093* | (2006.01) |
| *H05K 5/03* | (2006.01) |

(52) U.S. Cl.
CPC .............. *C03C 3/085* (2013.01); *C03C 3/091* (2013.01); *C03C 3/093* (2013.01); *C03C 3/097* (2013.01); *C03C 21/002* (2013.01); *G06F 1/16* (2013.01); *G06F 1/1626* (2013.01); *G06F 1/1637* (2013.01); *G06F 1/1656* (2013.01); *H05K 5/03* (2013.01)

(56) References Cited

U.S. PATENT DOCUMENTS

| | | |
|---|---|---|
| 3,357,876 A | 12/1967 | Rinehart |
| 3,380,818 A | 4/1968 | Smith |
| 3,404,015 A | 10/1968 | Dumbaugh, Jr. |
| 3,410,673 A | 11/1968 | Marusak |
| 3,433,611 A | 3/1969 | Saunders et al. |
| 3,464,880 A | 9/1969 | Rinehart |
| 3,489,097 A | 1/1970 | Gemeinhardt |
| 3,490,984 A | 1/1970 | Petticrew et al. |
| 3,597,305 A | 8/1971 | Giffen |
| 3,625,718 A | 12/1971 | Petticrew |
| 3,639,198 A | 2/1972 | Plumat et al. |
| 3,656,923 A | 4/1972 | Garfinkel et al. |
| 3,660,060 A | 5/1972 | Spanoudis |
| 3,673,049 A | 6/1972 | Giffen et al. |
| 3,737,294 A | 6/1973 | Dumbaugh et al. |
| 3,746,526 A | 7/1973 | Giffon |
| 3,765,855 A | 10/1973 | Larrick |
| 3,798,013 A | 3/1974 | Hasegawa et al. |
| 3,811,855 A | 5/1974 | Stockdale et al. |
| 3,833,388 A | 9/1974 | Ohlberg et al. |
| 3,844,754 A | 10/1974 | Grubb et al. |
| 3,879,183 A | 4/1975 | Carlson |
| 3,907,577 A | 9/1975 | Kiefer |
| 3,931,438 A | 1/1976 | Beall et al. |
| 3,936,287 A | 2/1976 | Beall et al. |
| 3,958,052 A | 5/1976 | Galusha et al. |
| 3,959,000 A | 5/1976 | Nakagawa et al. |
| 4,042,405 A | 8/1977 | Krohn et al. |
| 4,053,679 A | 10/1977 | Rinehart |
| 4,055,703 A | 10/1977 | Rinehart |
| 4,102,664 A | 7/1978 | Dumbaugh |
| 4,130,437 A | 12/1978 | Mazeau et al. |
| 4,148,661 A | 4/1979 | Kerko et al. |
| 4,156,755 A | 5/1979 | Rinehart |
| 4,190,451 A | 2/1980 | Hares et al. |
| 4,192,688 A | 3/1980 | Babcock |
| 4,214,886 A | 7/1980 | Shay et al. |
| 4,240,836 A | 12/1980 | Borrelli et al. |
| 4,242,117 A | 12/1980 | van Ass |
| 4,358,542 A | 11/1982 | Hares et al. |
| 4,407,966 A | 10/1983 | Kerko et al. |
| 4,468,534 A | 8/1984 | Boddicker |
| 4,471,024 A | 9/1984 | Pargamin et al. |
| 4,483,700 A | 11/1984 | Forker et al. |
| 4,537,612 A | 8/1985 | Borrelli et al. |
| 4,608,349 A | 8/1986 | Kerko et al. |
| 4,702,042 A | 10/1987 | Herrington et al. |
| 4,726,981 A | 2/1988 | Pierson et al. |
| 4,757,162 A | 7/1988 | Dumora et al. |
| 4,857,485 A | 8/1989 | Brennan et al. |
| 5,270,269 A | 12/1993 | Hares et al. |
| 5,273,827 A | 12/1993 | Francis |
| 5,322,819 A | 6/1994 | Araujo et al. |
| 5,342,426 A | 8/1994 | Dumbaugh, Jr. |
| 5,350,607 A | 9/1994 | Tyson et al. |
| 5,559,060 A | 9/1996 | Dumbaugh, Jr. et al. |
| 5,763,343 A | 6/1998 | Brix et al. |
| 5,773,148 A | 6/1998 | Charrue et al. |
| 5,804,317 A | 9/1998 | Charrue |
| 5,895,768 A | 4/1999 | Speit |
| 5,972,460 A | 10/1999 | Tachiwana |
| 6,111,821 A | 8/2000 | Bach |
| 6,187,441 B1 | 2/2001 | Takeuchi et al. |
| 6,333,286 B1 | 12/2001 | Kurachi et al. |
| 6,376,402 B1 | 4/2002 | Pannhorst et al. |
| 6,413,892 B1 | 7/2002 | Koyama et al. |
| 6,440,531 B1 | 8/2002 | Kurachi et al. |
| 6,472,068 B1 | 10/2002 | Glass et al. |
| 6,514,149 B2 | 2/2003 | Yoon |
| 6,516,634 B1 | 2/2003 | Green et al. |
| 6,518,211 B1 | 2/2003 | Bradshaw et al. |
| 6,528,440 B1 | 3/2003 | Vilato et al. |
| 6,537,938 B1 | 3/2003 | Miyazaki |
| 6,607,999 B2 | 8/2003 | Hachitani |
| 6,689,704 B2 | 2/2004 | Ota et al. |
| 6,846,760 B2 | 1/2005 | Siebers et al. |
| 7,007,512 B2 | 3/2006 | Kamada et al. |
| 7,091,141 B2 | 8/2006 | Horsfall et al. |
| 7,176,528 B2 | 2/2007 | Couillard et al. |
| 7,476,633 B2 | 1/2009 | Comte et al. |
| 7,514,149 B2 | 4/2009 | Bocko et al. |
| 7,531,475 B2 | 5/2009 | Kishimoto et al. |
| 7,619,283 B2 | 11/2009 | Gadkaree |
| 7,666,511 B2 | 2/2010 | Ellison et al. |
| 7,687,419 B2 | 3/2010 | Kawai |
| 7,727,917 B2 | 6/2010 | Shelestak et al. |
| 7,838,136 B2 | 11/2010 | Nakashima et al. |
| 7,891,212 B2 | 2/2011 | Isono |
| 8,007,913 B2 | 8/2011 | Coppola et al. |
| 8,075,999 B2 | 12/2011 | Barefoot et al. |
| 8,099,982 B2 | 1/2012 | Takagi et al. |
| 8,143,179 B2 | 3/2012 | Aitken et al. |
| 8,158,543 B2 | 4/2012 | Dejneka et al. |
| 8,193,128 B2 | 6/2012 | Hellmann et al. |
| 8,232,218 B2 | 7/2012 | Dejneka et al. |
| 8,252,708 B2 | 8/2012 | Morena et al. |
| 8,312,739 B2 | 11/2012 | Lee et al. |
| 8,312,789 B2 | 11/2012 | Beck |
| 8,327,666 B2 | 12/2012 | Harvey et al. |
| 8,347,651 B2 | 1/2013 | Abramov et al. |
| 8,349,455 B2 | 1/2013 | Kondo et al. |
| 8,415,013 B2 | 4/2013 | Barefoot et al. |
| 8,431,502 B2 | 4/2013 | Dejneka et al. |
| 8,561,429 B2 | 10/2013 | Allan et al. |
| 8,580,411 B2 | 11/2013 | Endo et al. |
| 8,586,492 B2 | 11/2013 | Barefoot et al. |
| 8,623,776 B2 | 1/2014 | Dejneka et al. |
| 8,652,978 B2 | 2/2014 | Dejneka et al. |
| 8,656,734 B2 | 2/2014 | Zou |
| 8,691,711 B2 | 4/2014 | Nakashima et al. |
| 8,697,592 B2 | 4/2014 | Ikenishi et al. |
| 8,713,972 B2 | 5/2014 | Lakota et al. |
| 8,756,262 B2 | 6/2014 | Zhang |
| 8,759,238 B2 | 6/2014 | Chapman et al. |
| 8,765,262 B2 | 7/2014 | Gross |
| 8,778,820 B2 | 7/2014 | Gomez et al. |
| 8,783,063 B2 | 7/2014 | Osakabe et al. |
| 8,802,581 B2 | 8/2014 | Dejneka et al. |
| 8,854,623 B2 | 10/2014 | Fontaine et al. |
| 8,932,510 B2 | 1/2015 | Li et al. |
| 8,943,855 B2 | 2/2015 | Gomez et al. |
| 8,946,103 B2 | 2/2015 | Dejneka et al. |
| 8,950,215 B2 | 2/2015 | Rappoport et al. |
| 8,951,927 B2 | 2/2015 | Dejneka et al. |
| 8,957,374 B2 | 2/2015 | Liu et al. |
| 8,969,226 B2 | 3/2015 | Dejneka et al. |
| 8,975,374 B2 | 3/2015 | Kimura |
| 9,003,835 B2 | 4/2015 | Lock |

(56) References Cited

U.S. PATENT DOCUMENTS

| | | |
|---|---|---|
| 9,007,878 B2 | 4/2015 | Matsumoto et al. |
| 9,139,469 B2 | 9/2015 | Comte et al. |
| 9,140,543 B1 | 9/2015 | Allan et al. |
| 9,145,329 B2 | 9/2015 | Drake et al. |
| 9,156,724 B2 | 10/2015 | Gross |
| 9,193,625 B2 | 11/2015 | Bookbinder et al. |
| 9,212,288 B2 | 12/2015 | Fujiwara et al. |
| 9,272,945 B2 | 3/2016 | Smith |
| 9,290,407 B2 | 3/2016 | Barefoot et al. |
| 9,290,413 B2 | 3/2016 | Dejneka et al. |
| 9,346,703 B2 | 5/2016 | Bookbinder et al. |
| 9,359,251 B2 | 6/2016 | Bookbinder et al. |
| 9,487,434 B2 | 11/2016 | Amin et al. |
| 9,498,822 B2 | 11/2016 | Brandt et al. |
| 9,499,431 B2 | 11/2016 | Barefoot et al. |
| 9,593,042 B2 | 3/2017 | Hu et al. |
| 9,604,876 B2 | 3/2017 | Gy et al. |
| 9,701,569 B2 | 7/2017 | DeMartino et al. |
| 9,751,802 B2 | 9/2017 | Allan et al. |
| 9,908,811 B2 | 3/2018 | Gross et al. |
| 9,977,470 B2 | 5/2018 | DeMartino et al. |
| 10,017,417 B2 | 7/2018 | Dejneka et al. |
| 10,144,670 B2 | 12/2018 | Akatsuka et al. |
| 10,160,688 B2 | 12/2018 | Amin et al. |
| 10,239,784 B2 | 3/2019 | Oram et al. |
| 10,259,746 B2 | 4/2019 | Hu et al. |
| 10,570,059 B2 | 2/2020 | Dejneka et al. |
| 10,579,106 B2 | 3/2020 | Demartino et al. |
| 10,787,387 B2* | 9/2020 | Gross ................. C03C 4/18 |
| 11,472,734 B2* | 10/2022 | Gross ................. C03C 21/002 |
| 2002/0023463 A1 | 2/2002 | Siebers et al. |
| 2005/0090377 A1 | 4/2005 | Shelestak et al. |
| 2005/0099618 A1 | 5/2005 | DiFoggio et al. |
| 2005/0143247 A1 | 6/2005 | Siebers et al. |
| 2005/0221044 A1 | 10/2005 | Gaume et al. |
| 2005/0250639 A1 | 11/2005 | Siebers et al. |
| 2006/0127679 A1 | 6/2006 | Gulati et al. |
| 2006/0279217 A1 | 12/2006 | Peuchert et al. |
| 2007/0060465 A1 | 3/2007 | Varshneya et al. |
| 2007/0122580 A1 | 5/2007 | Krall et al. |
| 2007/0123410 A1 | 5/2007 | Morena et al. |
| 2007/0218262 A1 | 9/2007 | Degand et al. |
| 2008/0026927 A1 | 1/2008 | Monique Comte |
| 2008/0128953 A1 | 6/2008 | Nagai et al. |
| 2008/0241603 A1 | 10/2008 | Isono |
| 2008/0286548 A1 | 11/2008 | Ellison et al. |
| 2009/0142568 A1 | 6/2009 | Dejneka et al. |
| 2009/0197088 A1 | 8/2009 | Murata |
| 2009/0215607 A1 | 8/2009 | Dejneka et al. |
| 2009/0220761 A1 | 9/2009 | Dejneka et al. |
| 2009/0286091 A1 | 11/2009 | Danielson et al. |
| 2010/0009154 A1 | 1/2010 | Allan et al. |
| 2010/0028607 A1 | 2/2010 | Lee et al. |
| 2010/0029460 A1 | 2/2010 | Shojiya et al. |
| 2010/0035038 A1 | 2/2010 | Barefoot et al. |
| 2010/0035745 A1 | 2/2010 | Murata |
| 2010/0087307 A1 | 4/2010 | Murata et al. |
| 2010/0112341 A1 | 5/2010 | Takagi et al. |
| 2010/0119846 A1 | 5/2010 | Sawada |
| 2010/0190038 A1 | 7/2010 | Osakabe et al. |
| 2010/0200804 A1 | 8/2010 | Woodruff et al. |
| 2010/0210442 A1 | 8/2010 | Abramov et al. |
| 2010/0215996 A1 | 8/2010 | Wendling et al. |
| 2010/0291353 A1 | 11/2010 | Dejneka et al. |
| 2010/0326657 A1 | 12/2010 | Hellmann et al. |
| 2011/0014475 A1 | 1/2011 | Murata |
| 2011/0064951 A1 | 3/2011 | Fujiwara et al. |
| 2011/0067447 A1 | 3/2011 | Zadesky et al. |
| 2011/0092353 A1 | 4/2011 | Amin et al. |
| 2011/0165393 A1 | 7/2011 | Bayne et al. |
| 2011/0201490 A1 | 8/2011 | Barefoot et al. |
| 2011/0226832 A1 | 9/2011 | Bayne et al. |
| 2011/0281093 A1 | 11/2011 | Gulati et al. |
| 2011/0293942 A1 | 12/2011 | Cornejo et al. |
| 2011/0294648 A1 | 12/2011 | Chapman et al. |
| 2011/0294649 A1 | 12/2011 | Gomez et al. |
| 2011/0312483 A1 | 12/2011 | Nakashima et al. |
| 2012/0015150 A1 | 1/2012 | Suzuki |
| 2012/0021898 A1 | 1/2012 | Elam et al. |
| 2012/0040146 A1 | 2/2012 | Garner et al. |
| 2012/0048604 A1 | 3/2012 | Cornejo et al. |
| 2012/0052271 A1 | 3/2012 | Gomez et al. |
| 2012/0052275 A1 | 3/2012 | Hashimoto et al. |
| 2012/0083401 A1 | 4/2012 | Koyama et al. |
| 2012/0114955 A1 | 5/2012 | Almoric et al. |
| 2012/0135153 A1 | 5/2012 | Osakabe et al. |
| 2012/0135226 A1 | 5/2012 | Bookbinder et al. |
| 2012/0135848 A1 | 5/2012 | Beall et al. |
| 2012/0171497 A1 | 7/2012 | Koyama et al. |
| 2012/0189843 A1 | 7/2012 | Chang et al. |
| 2012/0194974 A1 | 8/2012 | Weber et al. |
| 2012/0196110 A1 | 8/2012 | Murata et al. |
| 2012/0216565 A1 | 8/2012 | Allan et al. |
| 2012/0216569 A1 | 8/2012 | Allan et al. |
| 2012/0219792 A1 | 8/2012 | Yamamoto et al. |
| 2012/0236526 A1 | 9/2012 | Weber |
| 2012/0264585 A1 | 10/2012 | Ohara et al. |
| 2012/0297829 A1 | 11/2012 | Endo et al. |
| 2012/0308827 A1 | 12/2012 | Boek et al. |
| 2012/0321898 A1 | 12/2012 | Meinhardt et al. |
| 2013/0004758 A1 | 1/2013 | Dejneka et al. |
| 2013/0007458 A1 | 1/2013 | Wakita et al. |
| 2013/0017380 A1 | 1/2013 | Murata et al. |
| 2013/0045375 A1 | 2/2013 | Gross |
| 2013/0050992 A1 | 2/2013 | Schneider et al. |
| 2013/0101596 A1 | 4/2013 | DeMartino et al. |
| 2013/0101798 A1 | 4/2013 | Hashimoto |
| 2013/0122260 A1 | 5/2013 | Liang |
| 2013/0122284 A1 | 5/2013 | Gross |
| 2013/0183512 A1 | 7/2013 | Gy et al. |
| 2013/0186139 A1 | 7/2013 | Tanii |
| 2013/0189486 A1 | 7/2013 | Wang et al. |
| 2013/0202868 A1 | 8/2013 | Barefoot et al. |
| 2013/0203583 A1 | 8/2013 | Zhang et al. |
| 2013/0219966 A1 | 8/2013 | Hasegawa et al. |
| 2013/0224492 A1 | 8/2013 | Bookbinder et al. |
| 2013/0236666 A1 | 9/2013 | Bookbinder et al. |
| 2013/0236699 A1 | 9/2013 | Prest et al. |
| 2013/0240025 A1 | 9/2013 | Bersano et al. |
| 2013/0260154 A1 | 10/2013 | Allan et al. |
| 2013/0274085 A1 | 10/2013 | Beall et al. |
| 2013/0288001 A1 | 10/2013 | Murata et al. |
| 2013/0288010 A1 | 10/2013 | Akarapu et al. |
| 2013/0309613 A1 | 11/2013 | O'Malley et al. |
| 2013/0323444 A1 | 12/2013 | Ehemann et al. |
| 2014/0023865 A1 | 1/2014 | Comte et al. |
| 2014/0050911 A1 | 2/2014 | Mauro et al. |
| 2014/0063393 A1 | 3/2014 | Zhong et al. |
| 2014/0066284 A1 | 3/2014 | Hashimoto et al. |
| 2014/0087159 A1 | 3/2014 | Cleary et al. |
| 2014/0087193 A1 | 3/2014 | Cites et al. |
| 2014/0087194 A1 | 3/2014 | Dejneka et al. |
| 2014/0090864 A1 | 4/2014 | Paulson |
| 2014/0092377 A1 | 4/2014 | Liu et al. |
| 2014/0093702 A1 | 4/2014 | Kitajima |
| 2014/0106141 A1 | 4/2014 | Bellman et al. |
| 2014/0106172 A1 | 4/2014 | Dejneka et al. |
| 2014/0109616 A1 | 4/2014 | Varshneya |
| 2014/0113141 A1 | 4/2014 | Yamamoto et al. |
| 2014/0134397 A1 | 5/2014 | Amin et al. |
| 2014/0139978 A1 | 5/2014 | Kwong |
| 2014/0141226 A1 | 5/2014 | Bookbinder et al. |
| 2014/0147576 A1 | 5/2014 | Lewis et al. |
| 2014/0150525 A1 | 6/2014 | Okawa et al. |
| 2014/0151370 A1 | 6/2014 | Chang et al. |
| 2014/0154661 A1 | 6/2014 | Bookbinder et al. |
| 2014/0170380 A1 | 6/2014 | Murata et al. |
| 2014/0193606 A1 | 7/2014 | Kwong |
| 2014/0220327 A1 | 8/2014 | Adib et al. |
| 2014/0227523 A1 | 8/2014 | Dejneka et al. |
| 2014/0227524 A1 | 8/2014 | Ellison et al. |
| 2014/0227525 A1 | 8/2014 | Matsuda et al. |
| 2014/0248495 A1 | 9/2014 | Matsuda et al. |
| 2014/0308526 A1 | 10/2014 | Chapman et al. |

(56) References Cited

U.S. PATENT DOCUMENTS

| | | |
|---|---|---|
| 2014/0321124 A1 | 10/2014 | Schneider et al. |
| 2014/0329660 A1 | 11/2014 | Barefoot et al. |
| 2014/0335330 A1 | 11/2014 | Bellman et al. |
| 2014/0356576 A1 | 12/2014 | Dejneka et al. |
| 2014/0356605 A1 | 12/2014 | Adib et al. |
| 2014/0364298 A1 | 12/2014 | Ohara et al. |
| 2014/0370264 A1 | 12/2014 | Ohara et al. |
| 2014/0370302 A1 | 12/2014 | Amin et al. |
| 2015/0004390 A1 | 1/2015 | Kawamoto et al. |
| 2015/0011811 A1 | 1/2015 | Pavone et al. |
| 2015/0027169 A1 | 1/2015 | Fredholm |
| 2015/0030834 A1 | 1/2015 | Morey et al. |
| 2015/0030838 A1 | 1/2015 | Sellier et al. |
| 2015/0037543 A1 | 2/2015 | Keegan et al. |
| 2015/0037586 A1 | 2/2015 | Gross |
| 2015/0044473 A1 | 2/2015 | Murata et al. |
| 2015/0052949 A1 | 2/2015 | Bayne et al. |
| 2015/0060401 A1 | 3/2015 | Chang et al. |
| 2015/0064472 A1 | 3/2015 | Gross et al. |
| 2015/0064474 A1 | 3/2015 | Dejneka et al. |
| 2015/0074974 A1 | 3/2015 | Pesansky et al. |
| 2015/0079398 A1 | 3/2015 | Amin et al. |
| 2015/0093581 A1 | 4/2015 | Murata et al. |
| 2015/0111030 A1 | 4/2015 | Miyasaka et al. |
| 2015/0132563 A1 | 5/2015 | O'Malley et al. |
| 2015/0140325 A1 | 5/2015 | Gross et al. |
| 2015/0144291 A1 | 5/2015 | Brandt et al. |
| 2015/0147574 A1 | 5/2015 | Allan et al. |
| 2015/0147575 A1 | 5/2015 | Dejneka et al. |
| 2015/0147576 A1 | 5/2015 | Bookbinder et al. |
| 2015/0152003 A1 | 6/2015 | Kawamoto et al. |
| 2015/0157533 A1 | 6/2015 | DeMartino et al. |
| 2015/0166401 A1 | 6/2015 | Yamamoto |
| 2015/0166407 A1 | 6/2015 | Varshneya et al. |
| 2015/0175469 A1 | 6/2015 | Tabe |
| 2015/0183680 A1 | 7/2015 | Barefoot et al. |
| 2015/0239775 A1 | 8/2015 | Amin et al. |
| 2015/0239776 A1 | 8/2015 | Amin et al. |
| 2015/0251947 A1 | 9/2015 | Lestrigant et al. |
| 2015/0259244 A1 | 9/2015 | Amin et al. |
| 2015/0261363 A1 | 9/2015 | Shah et al. |
| 2015/0274585 A1 | 10/2015 | Rogers et al. |
| 2015/0329413 A1 | 11/2015 | Beall et al. |
| 2015/0329418 A1 | 11/2015 | Murata et al. |
| 2015/0368148 A1 | 12/2015 | Duffy et al. |
| 2015/0368153 A1 | 12/2015 | Pesansky et al. |
| 2016/0083291 A1 | 3/2016 | Dogimont et al. |
| 2016/0102011 A1 | 4/2016 | Hu et al. |
| 2016/0102014 A1 | 4/2016 | Hu et al. |
| 2016/0107924 A1 | 4/2016 | Yamamoto et al. |
| 2016/0122239 A1 | 5/2016 | Amin et al. |
| 2016/0122240 A1 | 5/2016 | Oram et al. |
| 2016/0187994 A1 | 6/2016 | La et al. |
| 2016/0318796 A1 | 11/2016 | Masuda |
| 2017/0022092 A1 | 1/2017 | Demartino et al. |
| 2017/0022093 A1 | 1/2017 | Demartino et al. |
| 2017/0158556 A1 | 6/2017 | Dejneka et al. |
| 2017/0166478 A1 | 6/2017 | Gross et al. |
| 2017/0197869 A1 | 7/2017 | Beall et al. |
| 2017/0197870 A1 | 7/2017 | Finkeldey et al. |
| 2017/0291849 A1* | 10/2017 | Dejneka .............. C03C 10/0027 |
| 2017/0295657 A1 | 10/2017 | Gross et al. |
| 2017/0305786 A1 | 10/2017 | Roussev et al. |
| 2019/0208652 A1 | 7/2019 | Gross et al. |

FOREIGN PATENT DOCUMENTS

| | | |
|---|---|---|
| CN | 1312582 A | 9/2001 |
| CN | 1693247 A | 11/2005 |
| CN | 1699230 A | 11/2005 |
| CN | 1759074 A | 4/2006 |
| CN | 1886348 A | 12/2006 |
| CN | 101316799 A | 12/2008 |
| CN | 101578240 A | 11/2009 |
| CN | 101583576 A | 11/2009 |
| CN | 101679106 A | 3/2010 |
| CN | 101689376 A | 3/2010 |
| CN | 102026929 A | 4/2011 |
| CN | 102089252 A | 6/2011 |
| CN | 102131740 A | 7/2011 |
| CN | 102149649 A | 8/2011 |
| CN | 102363567 A | 2/2012 |
| CN | 102393289 A | 3/2012 |
| CN | 102531384 A | 7/2012 |
| CN | 102690059 A | 9/2012 |
| CN | 102791646 A | 11/2012 |
| CN | 102815860 A | 12/2012 |
| CN | 102887650 A | 1/2013 |
| CN | 102898022 A | 1/2013 |
| CN | 102958855 A | 3/2013 |
| CN | 103058506 A | 4/2013 |
| CN | 103058507 A | 4/2013 |
| CN | 103068759 A | 4/2013 |
| CN | 103097319 A | 5/2013 |
| CN | 103282318 A | 9/2013 |
| CN | 103338926 A | 10/2013 |
| CN | 103569015 A | 2/2014 |
| CN | 103648996 A | 3/2014 |
| CN | 103946166 A | 7/2014 |
| CN | 104379522 A | 2/2015 |
| CN | 104736496 A | 6/2015 |
| CN | 105293901 A | 2/2016 |
| CN | 105753314 A | 7/2016 |
| CN | 108046589 A | 5/2018 |
| EP | 132751 A1 | 2/1985 |
| EP | 163873 A1 | 12/1985 |
| EP | 700879 B1 | 8/1998 |
| EP | 0931028 A1 | 7/1999 |
| EP | 1291631 A1 | 3/2003 |
| EP | 1314704 A1 | 5/2003 |
| EP | 1593658 A1 | 11/2005 |
| EP | 2263979 A1 | 12/2010 |
| EP | 2397449 A1 | 12/2011 |
| EP | 2415724 A1 | 2/2012 |
| EP | 2531459 A2 | 12/2012 |
| EP | 2540682 A1 | 1/2013 |
| EP | 2594536 A1 | 5/2013 |
| EP | 2609047 A1 | 7/2013 |
| EP | 2646243 A1 | 10/2013 |
| EP | 2666756 A1 | 11/2013 |
| EP | 2695734 A1 | 2/2014 |
| EP | 2736855 | 6/2014 |
| EP | 2762459 A1 | 8/2014 |
| EP | 2762460 A1 | 8/2014 |
| EP | 3204338 A2 | 8/2017 |
| GB | 1012367 A | 12/1965 |
| GB | 1026770 A | 4/1966 |
| GB | 1089912 A | 11/1967 |
| GB | 1105433 A | 3/1968 |
| GB | 1334828 A | 10/1973 |
| JP | 47004192 U | 9/1972 |
| JP | 54083923 A | 7/1979 |
| JP | 62-187140 A | 8/1987 |
| JP | 02-293345 A | 12/1990 |
| JP | 7263318 A | 10/1995 |
| JP | 11328601 A | 11/1999 |
| JP | 2000-203872 A | 7/2000 |
| JP | 2000-327365 A | 11/2000 |
| JP | 2001-076336 A | 3/2001 |
| JP | 2001-354446 A | 12/2001 |
| JP | 2002115071 A | 4/2002 |
| JP | 2002-174810 A | 6/2002 |
| JP | 2002-358626 A | 12/2002 |
| JP | 2003-505327 A | 2/2003 |
| JP | 2003-283028 A | 10/2003 |
| JP | 2004099370 A | 4/2004 |
| JP | 2004259402 A | 9/2004 |
| JP | 2005-062592 A | 3/2005 |
| JP | 2005139031 A | 6/2005 |
| JP | 2005-519997 A | 7/2005 |
| JP | 2005206406 A | 8/2005 |
| JP | 2005289683 A | 10/2005 |
| JP | 2005289685 A | 10/2005 |
| JP | 2005-320234 A | 11/2005 |

(56) References Cited

FOREIGN PATENT DOCUMENTS

| | | |
|---|---|---|
| JP | 2006-228431 A | 8/2006 |
| JP | 2007-527354 A | 9/2007 |
| JP | 2007-252589 A | 10/2007 |
| JP | 2007-255139 A | 10/2007 |
| JP | 2007-255319 A | 10/2007 |
| JP | 2007-314521 A | 12/2007 |
| JP | 2008007384 A | 1/2008 |
| JP | 2008094713 A | 4/2008 |
| JP | 2008115071 A | 5/2008 |
| JP | 2009-084076 A | 4/2009 |
| JP | 2009-099239 A | 5/2009 |
| JP | 2009107878 A | 5/2009 |
| JP | 2009-274902 A | 11/2009 |
| JP | 2009-280478 A | 12/2009 |
| JP | 2010202514 A | 9/2010 |
| JP | 2011057504 A | 3/2011 |
| JP | 2011213576 A | 10/2011 |
| JP | 2011-527661 | 11/2011 |
| JP | 2011-530470 A | 12/2011 |
| JP | 2012-066995 A | 4/2012 |
| JP | 2012-232882 A | 11/2012 |
| JP | 2013-502371 A | 1/2013 |
| JP | 2013-035721 A | 2/2013 |
| JP | 2013028512 A | 2/2013 |
| JP | 2013-518800 A | 5/2013 |
| JP | 2013-529172 A | 7/2013 |
| JP | 2013-536155 A | 9/2013 |
| JP | 2013-542159 A | 11/2013 |
| JP | 2014-012611 A | 1/2014 |
| JP | 2014-501214 A | 1/2014 |
| JP | 2014073953 A | 4/2014 |
| JP | 5483923 B2 | 5/2014 |
| JP | 2014-136751 A | 7/2014 |
| JP | 2014141363 A | 8/2014 |
| JP | 2014-522798 A | 9/2014 |
| JP | 2015-511537 A | 4/2015 |
| KR | 10-2012-0128657 A | 11/2012 |
| KR | 10-1302664 B1 | 9/2013 |
| KR | 1302664 B1 | 9/2013 |
| KR | 10-2013-0135840 A | 12/2013 |
| KR | 10-2014-0131558 A | 11/2014 |
| KR | 10-1506378 B1 | 3/2015 |
| KR | 10-2016-0080048 | 7/2016 |
| RU | 2127711 C1 | 3/1999 |
| SG | 187326 | 2/2013 |
| SU | 1677028 A1 | 9/1991 |
| TW | 200911718 A | 3/2009 |
| TW | 201040118 A | 11/2010 |
| TW | 201313635 A | 4/2013 |
| TW | 201331148 A | 8/2013 |
| TW | 201335092 A | 9/2013 |
| TW | 201350449 A | 12/2013 |
| TW | 201402490 A | 1/2014 |
| TW | 201520178 A | 6/2015 |
| WO | 99/06334 A1 | 2/1999 |
| WO | 2000/047529 A1 | 8/2000 |
| WO | 01/07374 A1 | 2/2001 |
| WO | 2005/042423 A1 | 5/2005 |
| WO | 2005091021 A1 | 9/2005 |
| WO | 2005/093720 A1 | 10/2005 |
| WO | 2009/041348 A1 | 4/2009 |
| WO | 2009/041618 A1 | 4/2009 |
| WO | 2010002477 A1 | 1/2010 |
| WO | 2010005578 A1 | 1/2010 |
| WO | 2010016928 A2 | 2/2010 |
| WO | 2010/147650 A2 | 12/2010 |
| WO | 2011/022661 A2 | 2/2011 |
| WO | 2011041484 A1 | 4/2011 |
| WO | 2011069338 A1 | 6/2011 |
| WO | 2011077756 A1 | 6/2011 |
| WO | 2011/085190 A1 | 7/2011 |
| WO | 2011/097314 A2 | 8/2011 |
| WO | 2011103798 A1 | 9/2011 |
| WO | 2011103799 A1 | 9/2011 |
| WO | 2011104035 A9 | 11/2011 |
| WO | 2011149740 A1 | 12/2011 |
| WO | 2011149811 A1 | 12/2011 |
| WO | 2011149812 A1 | 12/2011 |
| WO | 2012/027660 A1 | 3/2012 |
| WO | 2012/074983 A1 | 6/2012 |
| WO | 2012126394 A1 | 9/2012 |
| WO | 2013016157 A1 | 1/2013 |
| WO | 2013/018774 A1 | 2/2013 |
| WO | 2013/027651 A1 | 2/2013 |
| WO | 2013/028492 A1 | 2/2013 |
| WO | 2013/032890 A1 | 3/2013 |
| WO | 2013047679 A1 | 4/2013 |
| WO | 2013082246 A1 | 6/2013 |
| WO | 2013088856 A1 | 6/2013 |
| WO | 2013/110721 A1 | 8/2013 |
| WO | 2013/116420 A1 | 8/2013 |
| WO | 2013/120721 A1 | 8/2013 |
| WO | 2013/136013 A2 | 9/2013 |
| WO | 2013130653 A2 | 9/2013 |
| WO | 2013130665 A2 | 9/2013 |
| WO | 2013130721 A1 | 9/2013 |
| WO | 2013/184205 A1 | 12/2013 |
| WO | 2014/042244 A1 | 3/2014 |
| WO | 2014/052229 A1 | 4/2014 |
| WO | 2014/097623 A1 | 6/2014 |
| WO | 2014/100432 A1 | 6/2014 |
| WO | 2014175144 A1 | 10/2014 |
| WO | 2014180679 A1 | 11/2014 |
| WO | 2015057552 A2 | 4/2015 |
| WO | 2015057555 A1 | 4/2015 |
| WO | 2015/077179 A1 | 5/2015 |
| WO | 2015/080043 A1 | 6/2015 |
| WO | 2015/127483 A2 | 8/2015 |
| WO | 2015175595 A1 | 11/2015 |
| WO | 2015195419 A2 | 12/2015 |
| WO | 2015195465 A1 | 12/2015 |
| WO | 2016014937 A1 | 1/2016 |
| WO | 2016028554 A1 | 2/2016 |
| WO | 2016/057787 A2 | 4/2016 |
| WO | 2016070048 A1 | 5/2016 |
| WO | 2016/174825 A1 | 11/2016 |
| WO | 2016185934 A1 | 11/2016 |
| WO | 2017030736 A1 | 2/2017 |
| WO | 2017100646 A1 | 6/2017 |
| WO | 2017/177109 A1 | 10/2017 |
| WO | 2017/177114 A1 | 10/2017 |

OTHER PUBLICATIONS

Guo et al., "Nucleation and Crystallization Behavior of Li2O—Al2O3—SiO2 System Glass-Ceramic Containing Little Fluorine and No-Fluorine", J Non-Cryst Solids, 2005, vol. 351, No. 24-26, pp. 2133-2137.

European Patent Application No. 15784527.2 Summons to attend oral proceedings pursuant to Rule 115(1) EPC dated Dec. 8, 2020; 22 Pages; European Patent Office.

Sglavo et al. "procedure for residual stress profile determination by curvature measurements" Mechanics of Materias, 2005, 37(8) pp. 887-898.

English Translation of KR1020197037663 Office Action dated May 2, 2020; 3 Pages; Korean Patent Office.

English Translation of TW108142075 Office Action dated Apr. 6, 2020; 2 Pages; Taiwan Patent Office.

Bansal et al; "Chapter 10: Elastic Properties" Handbook of Glass Properties; Elsevier; (1986) pp. 306-336.

Bouyne et al. "Fragmentation of thin chemically tempered glass plates" Proc. XIX Int. Congr. Glass, Edinburgh, Jul. 1-6, 2001. Glass Technology 202 43C, pp. 300-302.

Brunkov et al; "Submicron-Resolved Relief Formation in Poled Glasses and Glass-Metal Nanocomposites"; Technical Physics Letters, 2008, vol. 34, No. 12 pp. 1030-1033.

Bubsey, R.T. et al., "Closed-Form Expressions for Crack-Mouth Displacement and Stress Intensity Factors for Chevron-Notched Short Bar and Short Rod Specimens Based on Experimental Compliance Measurements," NASA Technical Memorandum 83796, pp. 1-30 (Oct. 1992.

(56) References Cited

OTHER PUBLICATIONS

Corning leads $62M Investment in 'smart' glass maker view, Jun. 19, 2013; http://optics.org/news/4/6/27.
Corning, "Nook—Stress Profile Measurement", Corning Incorporated, 2019, 4 slides.
Declaration of *Rostislav V. Roussev*; 9 Pages; Aug. 11, 2019.
Donald "Review Methods for Improving the Mechanical Properties of Oxide Glasses"; Journal of Materials Science 24 (1989) 4177-4208.
Donald, "Review: Methods for improving the mechanical properties of oxide glasses" Journal of Materials Science 24 (1989) pp. 4177-4208.
Takagi et al; "Electrostatic Imprint Process for Glass "; Applied Physics Express 1 (20008) 024003.
Glover, D., Miller, D., Averis, D., Door, V. (2005 "The interactive whiteboard: a literature survey". Technology, Pedagogy and Education (vol. 14) 2005, Issue 2: 155170.
Gulati, Frangibility of Tempered Soda-Lime Glass Sheet, Glass Processing Days, The Fifth International Conference on Architectural and Automotive Glass, Sep. 13-15, 1997.
International Search Report and Written Opinion PCT/US2016/043610 dated Feb. 1, 2017.
Kitaigorodskii I.I.' 'Sentyurin G.G.' 'Egorova L.S.', In: Sb.Nauchn. Rabot Belor.Politekhn.Inst.,Khimiya, Tekhnologiya i Istoriya Stekla i Keramiki, 1960, No. 86, p. 38. (The Synthesis of Thermo-stable glasses) Abstract Only.
Peitl et al; "Thermal Shock Properties of Chemically Toughened Borosilicate Glass" Journal of Non-Crystallin Solids, 247, (1999) pp. 39-49.
Poumellec et al; "Surface topography change induced by poling in Ge doped silica glass films"; 2003 OSA/BGPP 2003 MD 38.
Reddy, K.P.R. et al., "Fracture Toughness Measurement of Glass and Ceramic Materials Using Chevron-Notched Specimens," J. Am. Ceram. Soc., 71 [6], C-310-C-313 (1988.
Rusan et al; "A New Method for Recording Phase Optical Structures in Glasses"; Glass Physics and Chemistry, 2010, vol. 36, No. 4, pp. 513-516.
Sglavo & Green, "Flaw-insensitive ion-exchanged glass: II, Production and mechanical performance" J. Am. Ceram. Soc. 84(8) pp. 1832-1838 (2001.
Sglavo et al. "procedure for residual stress profile determination by vurbature measurements" Mechanics of Materias, 2005, 37(8) pp. 887-898.
Zheng et al; "Structure and Properties of the Lithium Aluminosilicate Glasses with Yttria Addition"; vol. 22, No. 2 Wuhan University of Technology—(Abstract).
Tang et al. "Methods for measurement and statistical analysis of the frangibility of strengthened glass" Frontiers in Materials 2 (50) 2015, 8 pgs.
Tang, et al., "Automated Apparatus for Measuring the Frangibility and Fragmentation of Strengthened Glass", Experimental Mechanics (Jun. 2014) vol. 54 pp. 903-912.
Zheng et al; "Effect of Y2O3 addition on viscosity and crystallization of the lithium aluminosilicate glasses"; Thermochimica Acta 456 (2007) 69-74.
Zimmer; "Thin Glasses for Touch Display Technologies"; Schott Display Search; 17 Pages; (2011.
International Searching Authority Invitation To Pay Additional Fees PCT/US2016/043610 dated Dec. 8, 2016.
Japanese Patent Application No. 2018540470; Machine Translation of the Office Action dated Feb. 12, 2020; Japan Patent Office; 7 Pgs.
Russian Patent Application No. 2018105921; Russian Office Action and Search Report dated Sep. 19, 2019; Russia Patent Office; 4 Pgs.
TW105123002 Search Report dated May 14, 2018, Taiwan Patent Office.
ChemCor Product Specification.
International Search Report and Written Opinion of the International Searching Authority; PCTUS2015041976; dated Oct. 29, 2015; 11 Pages.

International Search Report and Written Opinion PCT/US2011/062288 dated Feb. 28, 2012.
International Search Report and Written Opinion PCT/US2011/062354 dated Mar. 15, 2012.
International Search Report and Written Opinion PCT/US2013/028079 dated Aug. 27, 2013.
International Search Report and Written Opinion PCT/US2016/034634 dated Nov. 2, 2016.
International Search Report and Written Opinion PCT/US2016/085932 dated Apr. 5, 2017.
International Search Report and Written Opinion PCT/US2017/026554 dated Jul. 10, 2017.
International Search Report and Written Opinion PCT/US2017/026561 dated Jun. 19, 2017; 13 Pages; European Patent Office.
Japanese Patent Application No. 2018-073075 Decision to Grant dated Sep. 2, 2020; 5 Pages; Japanese Patent Office.
Japanese Patent Application No. 2018529948; Machine Translation of the Office Action dated Dec. 18, 2019; Japan Patent Office; 8 Pgs.
Japanese Patent Application No. 2019-005651 Notice of Reasons for Refusal dated Sep. 30, 2020; 18 Pages; Japanese Patent Office.
Japanese Patent Application No. 2019-005651; Office Action dated Nov. 8, 2019; Japan Patent Office; 4 Pgs.
Japanese Patent Application No. 2019-184641 Notice of Reasons for Refusal dated Oct. 7, 2020; 7 Pages; Japanese Patent Office.
JP2017518941 Notice of Allowance dated Feb. 20, 2019, Japan Patent Office, 3 Pgs.
JP2018073075 Office Action dated May 8, 2019, Japan Patent Office.
JP2019005650 Office Action dated Feb. 13, 2019, Japan Patent Office.
Kitaigorodskii et al, In: Sb.Nauchn.Rabot Belor.Politekhn.Inst. ,Khimiya, Tekhnologiya i Istoriya Stekla i Keramiki, 1960, No. 86, p. 38. (The Synthesis of Thermo-stable glasses) Abstract Only.
Liu et al, "Common Knowledge Evidence: Inorganic Non-Metallic Materials Technology", China University of Science and Technology Press, Sep. 2015, 1st edition.
Patent Cooperation Treaty International Notification of Invitation to pay additional fees; international application No. PCT/US2015/054681: dated Dec. 14, 2015, 7 pages.
Patent Cooperation Treaty, Partial International Search Report for International Application No. PCT/US2015/054681, dated Nov. 11, 2015, 7 pages.
Reddy et al. "Fracture Toughness Measurement of Glass and Ceramic Materials Using Chevron-Notched Specimens" J. Am. Ceram. Soc. 71 (6) C-310-C313 (1988).
Taiwan First Office Action and Search Report TW100143769 Tsai, Lee and Chen, dated Apr. 29, 2016, 3 Pgs.
Varshneya; "Microhardness vs. Glass Composition"; Fundamentals of Inorganic Glasses; 2006; p. 208, paragraph 7.
Abrams et al; "Fracture Behavior of Engineerred Stress Profile Soda Lime Silicate Glass"; Jounral of Non-Crystalline Solids; 321 (2003) 10-19.
Aegerter et al; "Sol-gel technologies for glass producers and users Chapter 4.1.8 Scratch resistant coatings (G. Helsch and G. H. Frischat)", pp. 217-221, Kluwer Academic Publishers, 2004.
Bahlawane "Novel sol-gel process depositing a-Al2O3 for the improvement of graphite oxidation-resistance" Thin Solid Films, vol. 396, pp. 126-130, 2001.
Bourhis; "Glass: Mechanics and Technology" , Wiley. p. 170-174 XP007920266; 2008.
Dessler et al; "Differences between films and monoliths of sol-gel derived aluminas", Thin Solid Films, vol. 519, pp. 42-51, 2010.
Fu et al, "Preparation of alumina films from a new sol-gel route" Thin Solid films 348, pp. 99-102 (1999).
Greaves et al; "Inorganic Glasses, Glass-Forming Liquids and Amorphizing Solids", Advances in Physics; vol. 56, No. 1, Jan.-Feb. 2007, 1166.
Green; "Section 2. Residual Stress, Brittle Fracture and Damage; Critical Parameters in the Processing of Engineered Stress Profile Glasses"; J. Non-Cryst Sol., 316 (2003) 3541.
Hampshire; "Section 3. Oxynitride Glasses; Oxynitride Glasses, Their Properties and Crystallisation—A Review", Journal of Non-Crystalline Solids 316 (2003) p. 64-73.

(56) References Cited

OTHER PUBLICATIONS

Hauk "Sol-gel preparation of scratch-resistant Al2O3 coatings on float glass", Glass Science and Technology Glastechnische Berichte, 72(12), pp. 386, 1999.
Pflitsch et al; "Sol-gel deposition of chromium doped aluminum oxide films (Ruby) for surface temperature sensor application", Chem. Mater, vol. 20, pp. 2773-2778, 2008.
Shen et al; "Control of Concentration Profiles in Two Step Ion Exchanged Glasses"; Phys. Chem. Glasses, 2003, 44 (4), 284-92.
Shen et al; "Variable-Temperature Ion-Exchanged Engineered Stress Profile (ESP) Glasses"; J. Am. Ceram. Soc., 86 [11] 1979-81 (2003.
Smedskjaer et al; "Effect of Thermal History and Chemical Composition On Hardness of Silicate Glasses"; Journal of Non-Crystalline Solids 356 (2010) p. 893-897.
Stosser et al; "Magnetic Resonance investigation of the process of corundum formation starting from sol-gel precursors", J Am. Ceram. Soc, vol. 88, No. 10, pp. 2913-2922, 2005.
Varshenya; "Fundamentals of Inorganic Glasses"; New York State College of Ceramics, Alfred University; 2006; 3 Pgs.
Varshenya; "Fundamentals of Inorganic Glasses; 18.12 Strengthening and Toughening"; New York State College of Ceramics, Alfred University; 2006; 10 Pages.
Amin et al; U.S. Appl. No. 14/926,425, filed Oct. 29, 2015, titled "Strengthened Glass With Ultra-Deep Depth of Compression".
ASTM C1279-13 "Standard Test Method for Non-Destructive Photoelastic Measurement of Edge and Surface Stresses in Annealed, Heat-Strengthened, and Fully Tempered Flat Glass".
ASTM C1422/C1422M-10 "Standard Specification for Chemically Strengthened Flat Glass".
Oram et al; U.S. Appl. No. 14/932,411, filed Nov. 4, 2015, Titled "Deep Non-Frangible Stress Profiles And Methods of Making".
"Building Materials", Co-edited by Xi'an University of Architecture and Technology, China Construction Industry Press, Edition 3, Apr. 30, 2004, 5 pages.
Rukmani et al., "Effects of V and Mn Colorants on the Crystallization Behavior and Optical Properties of Ce-Doped Li-Disilicate Glass", In Journal Of American Ceramic Society, vol. 90, 2007, pp. 706-711.
Brandt et al; "Mechanics of Ceramics, Active Materials, Nanoscale Materials, Composites, Glass, and Fundamentals"; Proceedings of the 8th International Symposium On Fracture Mechanics of Ceramics, (2003); 11 Pages.
Yong-Hwan; "Chemical Tempered Glass for Mobile Displays"; Korea Institute of Science and Technology; Date Unknown; 6 Pages.
Kim; "Glass Engineering"; Glass Technology 3rd Edition; (2009) 8 Pages.
Le Bourhis; "Glass Mechanics and Technology"; Wiley-VCH, Second Edition; (2014) 8 Pages.
Nagashima; "Chemical Strengthening of Glass"; Surface Technology; vol. 64, No. 8; (2013) pp. 434-438.
ASTM C158-02(2012), Standard Test Methods for Strength of Glass by Flexure (Determination of Modulus of Rupture), ASTM International, West Conshohocken, PA, 2012, 9 pages.
Bansal et al; "Handbook of Glass Properties"; Elsevier; (1986) 2 pages.
Chinese First Office Action CN201180057659.5 dated Dec. 24, 2014, Shanghai Patent and Trademark Office, 9 Pgs.
Chinese Office Action CN201180066244.4 dated Aug. 6, 2014, Shanghai Patent and Trademark Law Office, LLC. 20 Pgs.
Chinese Patent Application No. 201611141439.1 Second Office Action dated Jun. 28, 2020; 30 Pages; Chinese Patent Office.
Chinese Patent Application No. 201810008016.5, Office Action dated Oct. 19, 2020; 20 pages (12 pages of English Translation and 8 pages of Original Document); Chinese Patent Office.
Chinese Patent Application No. 201811009613 First Office Action dated Sep. 3, 2020; 19 Pages; Chinese Patent Office.
Chinese Search Report; 201710228902.4; dated Jun. 10, 2020; 4 Page; Chinese Patent Office.
Chinese Search Report; 201810008010.8; dated Jun. 1, 2020; 5 Pages; Chinese Patent Office.
Chinese Search Report; 201811009613.6; dated Aug. 25, 2020; 4 Page; Chinese Patent Office.
CN201510895444.0 Second Office Action dated Apr. 10, 2018, China Patent Office.
CN201510895444.0 Second Office Action dated Aug. 17, 2018, China Patent Office.
Corning Incorporated, "What Makes CHEMCOR Glass Work?" ChemCor Product Specification, Feb. 1990, 2 pgs.
English Translation of CN201510895444.0 Notice of First Office Action dated Dec. 11, 2017; 6 Pages; Chinese Patent Office.
English Translation of CN201580044744.6 Office Action dated Jan. 22, 2019; 19 Pages Chinese Patent Office.
English Translation of CN201611141439.1 Notice of Second Office Action dated Oct. 19, 2018; 10 Pages; Chinese Patent Office.
English Translation of CN2018100080625 Search Report dated May 9, 2020; 2 Pages; Chinese Patent Office.
English Translation of CN201810903093.7 Office Action dated Apr. 25, 2019; 14 Pages; Chinese Patent Office.
English Translation of JP2014559996 Office Action dated Feb. 7, 2017, Japan Patent Office.
English Translation of JP2017157071 Office Action dated Nov. 21, 2017, Japan Patent Office, 6 Pgs.
English Translation of KR1020177012502 Office Action dated Jun. 28, 2018, Korean Intellectual Property Office, 3 Pgs.
English Translation of TW106111688 Search Report dated Apr. 26, 2019; 1 Page; Taiwan Patent Office.
English Translation of TW107106081 Search Report dated Jun. 22, 2018, Taiwan Patent Office.
English Translation of TW107106082 Search Report dated Jun. 21, 2018, Taiwan Patent Office.
European Patent Application No. 13709022.1 Office Action dated Apr. 12, 2016; 5 Pages; European Patent Office.
European Patent Application No. 15784527.2 Observations by third parties dated Feb. 18, 2020; 21 Pages; European Patent Office.
European Patent Application No. 15784527.2 Observations by third parties dated Jan. 9, 2020; 1 Pages; European Patent Office.
European Patent Application No. 15784527.2 Office Action dated May 10, 2019; 5 Pages; European Patent Office.
European Patent Application No. 16823100.9 Observations by third parties dated Mar. 17, 2020; 10 Pages; European Patent Office.
European Patent Application No. 16823100.9 Observations by third parties dated May 5, 2020; 10 Pages; European Patent Office.
European Patent Application No. 16823100.9 Office Action dated Jul. 23, 2020; 9 Pages; European Patent Office.
European Patent Application No. 16823100.9 Office Action dated Mar. 29, 2019; 6 Pages; European Patent Office.
European Patent Application No. 17719103.8 Observations by third parties dated Aug. 26, 2020; 10 Pages; European Patent Office.
European Patent Office First Office Action EP11799531.6-1355 dated May 2, 2014, 2 Pgs.
European Patent Office First Office Action EP11802990.9 dated Mar. 6, 2014, 6 Pgs.
European Patent Office; International Search Report; dated Aug. 27, 2013; pp. 1-3.
Extended European Search Report and Search Opinion; 19217082.7; dated Aug. 12, 2020; 14 pages; European Patent Office.
F.V. Tooley; "The Handbook of Glass Manufacture, vol. II"; China Architecture & Building Press, First Edition, Feb. 1983, pp. 304-305.
Glover et al; "The interactive whiteboard: a literature survey"; Technology, Pedagogy and Education (14) 2: 155-170.
Greaves et al.; "Inorganic Glasses, glass-forming liquids and amorphizing solids" Advances in Physics; vol. 56, No. 1; 2007 pp. 1-166.
Gulati, "Frangibility of tempered soda-lime glass sheet" Glass Processing Days, Sep. 13-15, 1997. pp 72-76.
Hampshire; "Oxynitride glasses, their properties and crystallization—a review"; Journal of Non-Crystalline Solids; vol. 316, 2003; pp. 64-73.
Indian Patent Application No. 202018006461 office Action dated Sep. 22, 2020; 6 Pages; Indian Patent Office.

(56) References Cited

OTHER PUBLICATIONS

Indian Patent Application No. 201817021369; First Examination Report dated Dec. 24, 2019; India Patent Office; 7 Pgs.
International Search Report and the Written Opinoin of the International Searching Authority; PCT/US2015/035448; dated Sep. 18, 2015; 11 Pages.
International Search Report and Written Opinion of the International Searching Authority; PCT/US2015/023507; dated Oct. 19, 2015; 19 Pages.
International Search Report and Written Opinion of the International Searching Authority; PCT/US2015/034996 dated Jan. 4, 2016; 13 Pages.
International Search Report and Written Opinion of the International Searching Authority; PCT/US2015/054681; dated Apr. 6, 2016; 16 Pages; European Patent Office.
International Search Report and Written Opinion of the International Searching Authority; PCT/US2015/058322 dated Jan. 8, 2016; 14 Pages.
International Search Report and Written Opinion of the International Searching Authority; PCT/US2015/058919;dated Jan. 11, 2016; 11 Pages.
U.S. Appl. No. 62/320,077 (Year: 2016).
U.S. Appl. No. 62/343,320 (Year: 2016).
Chinese Patent Application No. 202011285770.7, Office Action, dated Mar. 30, 2022, 12 pages (6 pages of English Translation and 6 pages of Original Document), Chinese Patent Office.

\* cited by examiner

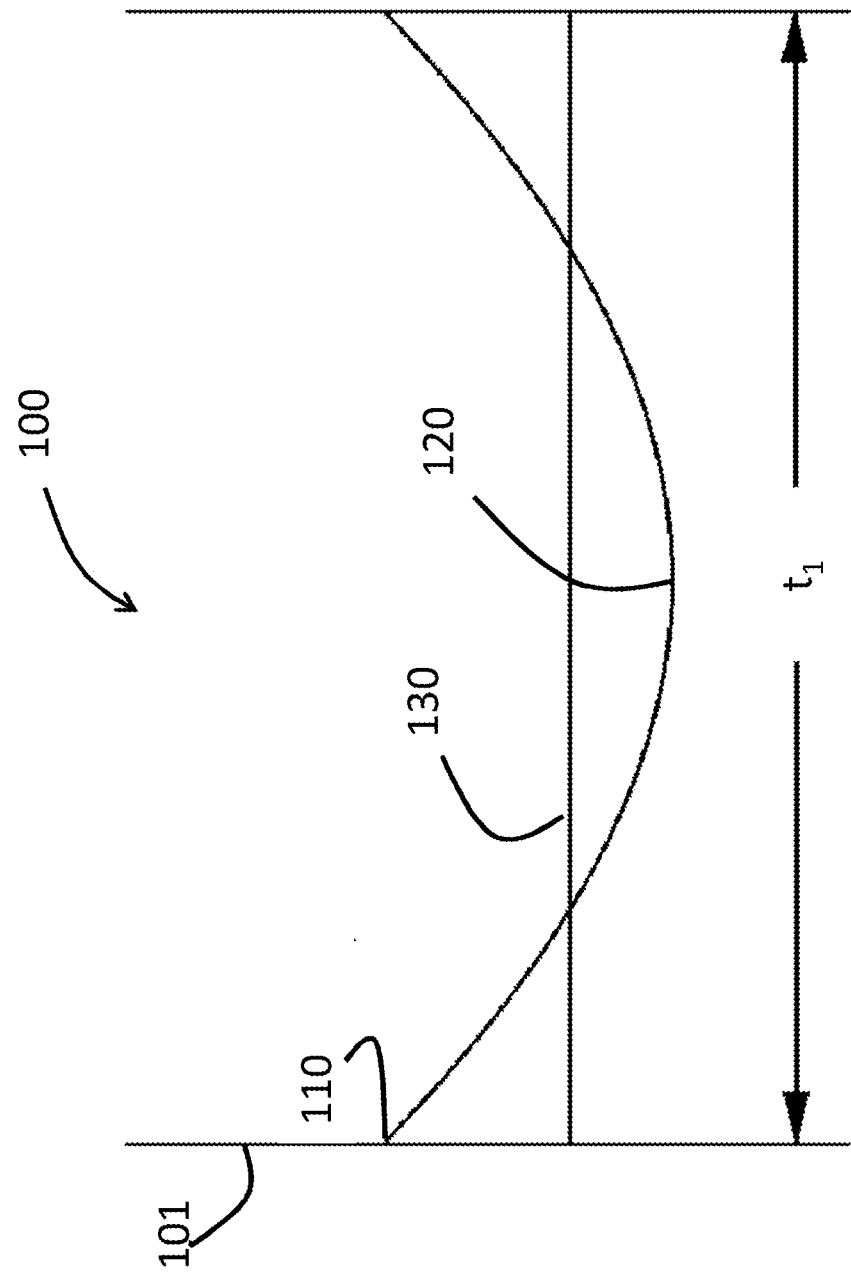

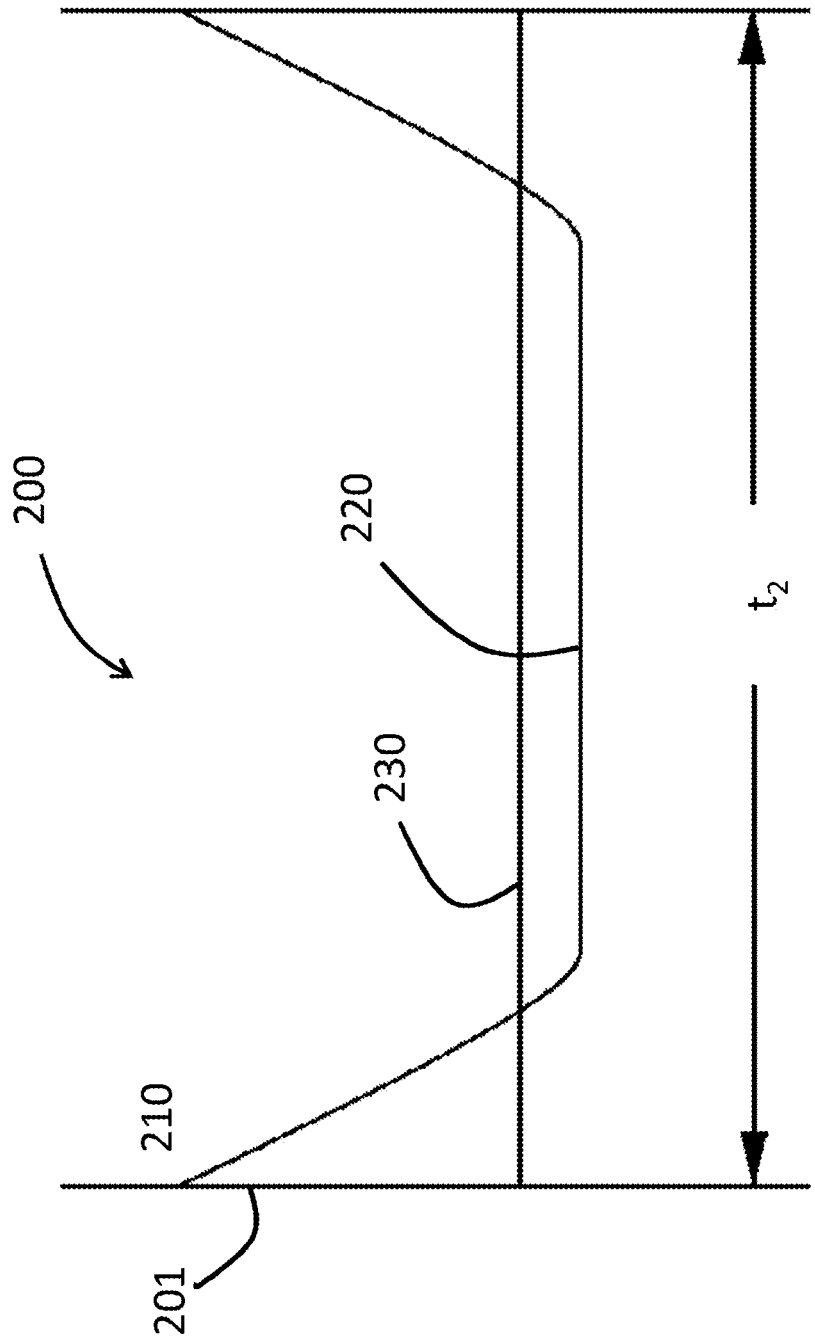

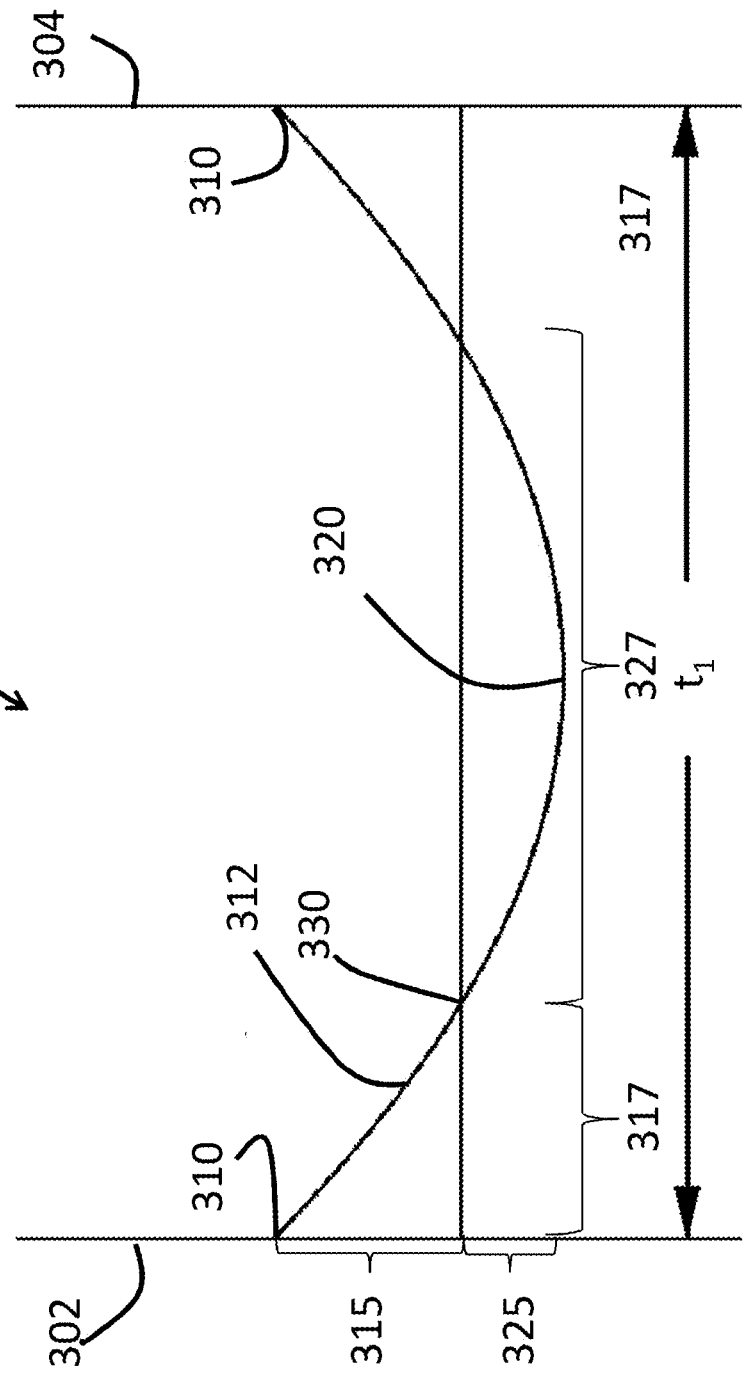

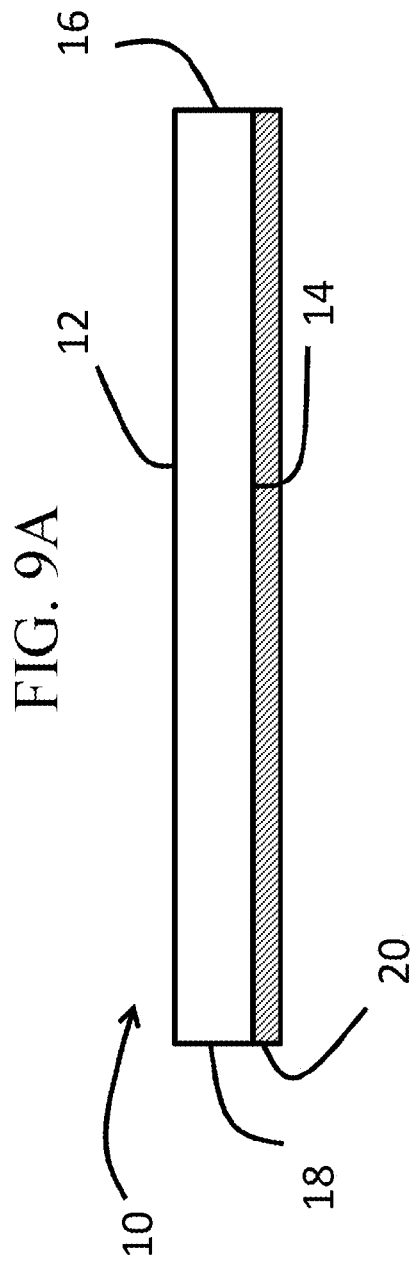
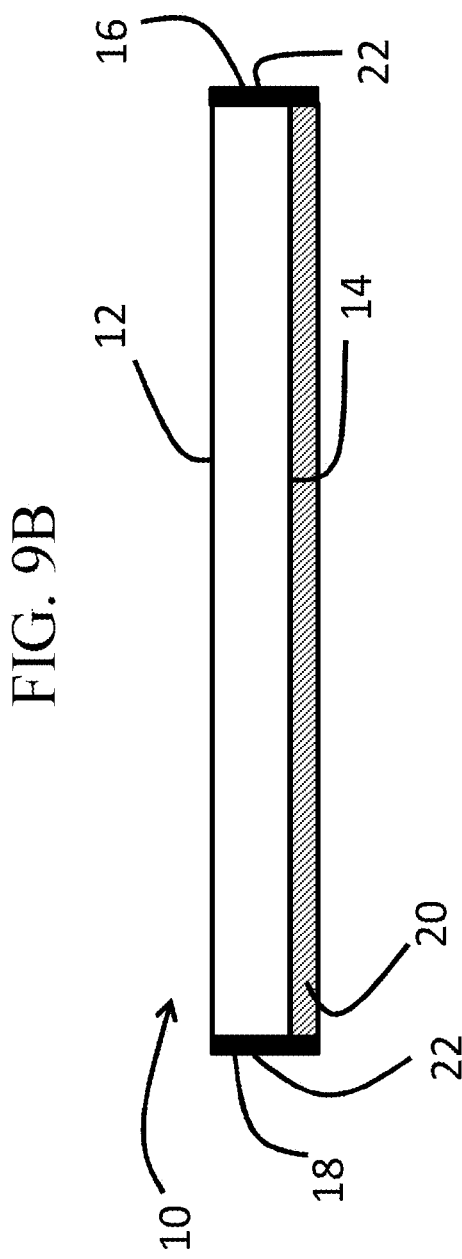

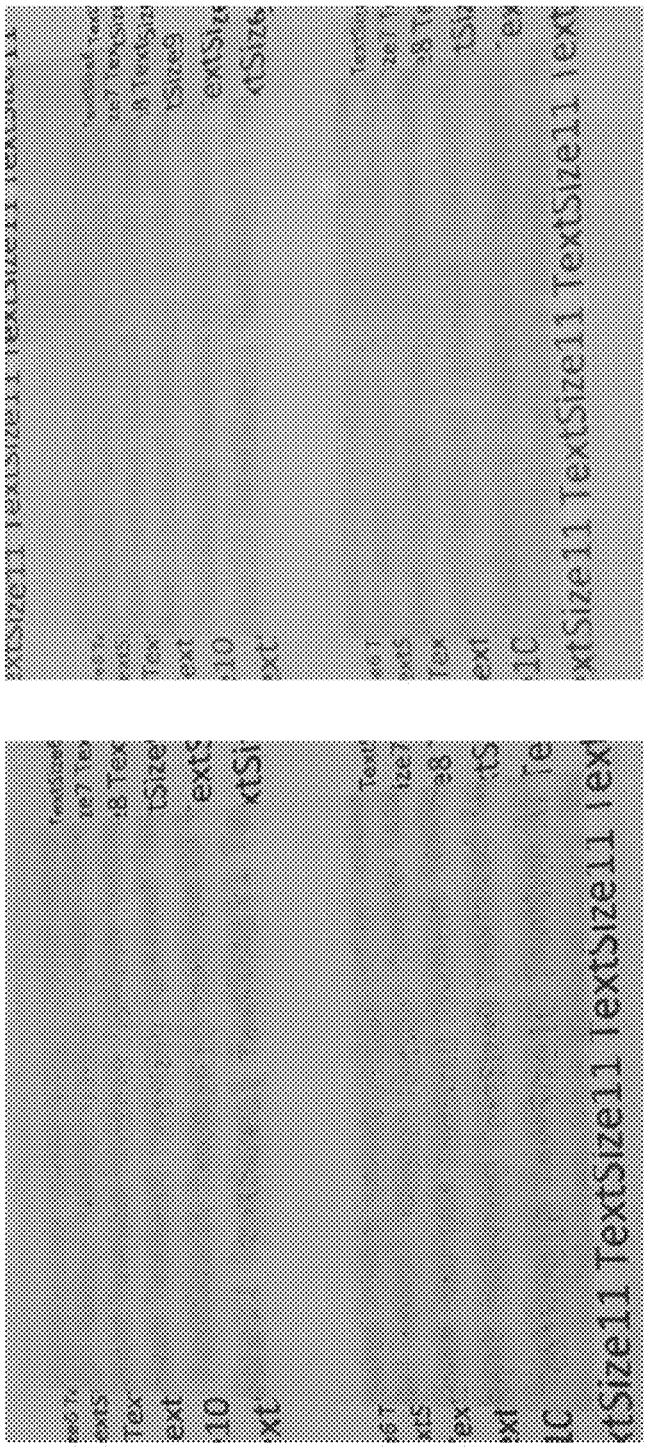

GLASS ARTICLES EXHIBITING IMPROVED FRACTURE PERFORMANCE

CROSS-REFERENCE TO RELATED APPLICATIONS

This application is a divisional of and claims the benefit of priority under 35 U.S.C. § 120 of U.S. application Ser. No. 15/214,602 filed on Jul. 20, 2016, which in turn, claims the benefit of priority under 35 U.S.C. § 119 of U.S. Provisional Application Ser. No. 62/343,320 filed on May 31, 2016 and U.S. Provisional Application Ser. No. 62/194,984 filed on Jul. 21, 2015, the content of which is relied upon and incorporated herein by reference in its entirety.

BACKGROUND

The disclosure relates to glass articles exhibiting improved fracture performance, and more particularly to glass articles exhibiting improved fracture patterns and dicing behavior.

Consumer electronics devices, including handheld devices such as smart phones, tablets, electronic-book readers and laptops often incorporate chemically strengthened glass articles for use as cover glass. As cover glass is directly bonded to a substrate like a touch-panel, display or other structures, when strengthened glass articles fracture, such articles may eject small fragments or particles from the free surface due to the stored energy created by a combination of surface compressive stresses and tensile stresses beneath the surfaces of the glass. As used herein, the term fracture includes cracking and/or the formation of cracks. These small fragments are a potential concern to the device user, especially when fracture occurs in a delayed manner close to the users face (i.e. eyes and ears), and when the user continues to use and touch the fractured surface and is, thus, susceptible to minor cuts or abrasions, especially when crack distances are relatively long and fragments with sharp corners and edges are present.

Accordingly, there is a need for glass articles that exhibit a modified fragmentation behavior so that when such articles fracture, they exhibit an enhanced dicing behavior, such as, for example, a dicing effect generating short crack lengths and fewer ejected particles. Moreover, there is also a need for glass articles that, when fractured, eject fewer fragments and fragments with less kinetic energy and momentum.

SUMMARY

A first aspect of this disclosure pertains to a strengthened glass article including a first surface and a second surface opposing the first surface defining a thickness (t) of about 1.1 mm or less, and a compressive stress layer extending from the first surface to a depth of compression (DOC) of greater than about 0.11·t. In some embodiments, after the glass article fractures, the glass article includes a plurality of fragments, wherein at least 90% of the plurality of fragments have an aspect ratio of about 5 or less, the glass article fractures into the plurality of fragments in 1 second or less, as measured by a Frangibility Test.

In some embodiments, the strengthened glass article exhibiting a equibiaxial flexural strength of about 20 kgf or greater, after being abraded with 90-grit SiC particles at a pressure of 25 psi for 5 seconds. In some embodiments, the strengthened glass article may, after the glass article fractures, comprises fractures such that 50% or more of the fractures extend only partially through the thickness.

A third aspect of this disclosure pertains to a device including a strengthened glass substrate, as described herein, a containment layer; and a support, wherein the device comprises a tablet, a transparent display, a mobile phone, a video player, an information terminal device, an e-reader, a laptop computer, or a non-transparent display.

A fourth aspect of this disclosure pertains to a consumer electronics product including a housing having a front surface, electrical components provided at least partially internal to the housing, the electrical components including at least a controller, a memory, and a display; and a cover glass disposed at the front surface of the housing and over the display, the cover glass comprising a strengthened glass article as described herein.

Additional features and advantages will be set forth in the detailed description which follows, and in part will be readily apparent to those skilled in the art from that description or recognized by practicing the embodiments as described herein, including the detailed description which follows, the claims, as well as the appended drawings.

It is to be understood that both the foregoing general description and the following detailed description are merely exemplary, and are intended to provide an overview or framework to understanding the nature and character of the claims. The accompanying drawings are included to provide a further understanding, and are incorporated in and constitute a part of this specification. The drawings illustrate one or more embodiment(s), and together with the description serve to explain principles and operation of the various embodiments.

BRIEF DESCRIPTION OF THE DRAWINGS

FIG. 2 is a cross-sectional view across a thickness of a known thermally tempered glass-based article;

FIG. 3 is a cross-sectional view across a thickness of a known chemically strengthened glass-based article;

FIG. 4 is a cross-sectional view across a thickness of a strengthened glass-based article according to one or more embodiments;

FIG. 9A is a side view of the glass article of FIG. 1A including a containment layer;

FIG. 9B is a side view the glass article of FIG. 9A including a second containment layer;

FIGS. 16A-16D are images showing the readability of Example 6 after fracture at different viewing angles;

DETAILED DESCRIPTION

Figure 1A:
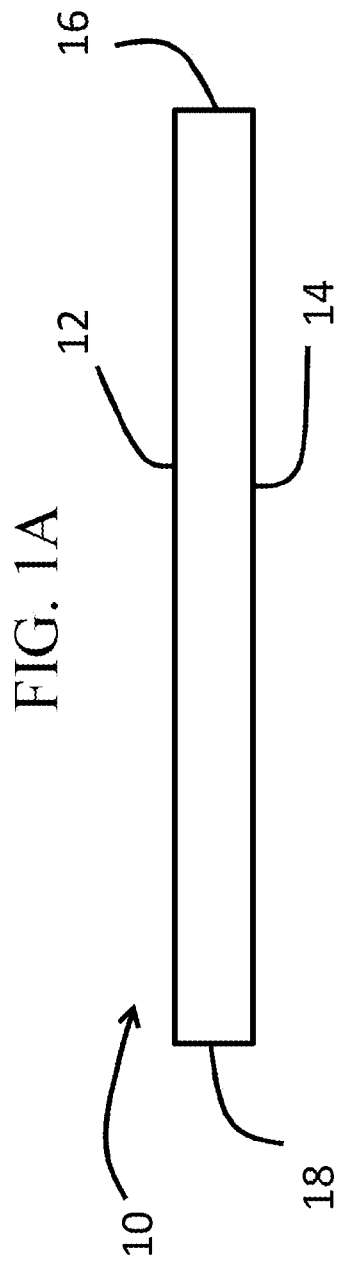
FIG. 1A is a side view of a glass article according to one or more embodiments.

Reference will now be made in detail to various embodiments, examples of which are illustrated in the accompanying drawings. Referring to the drawings in general, it will be understood that the illustrations are for the purpose of describing particular embodiments and are not intended to limit the disclosure or appended claims thereto. The drawings are not necessarily to scale, and certain features and certain views of the drawings may be shown exaggerated in scale or in schematic in the interest of clarity and conciseness.

In the following description, like reference characters designate like or corresponding parts throughout the several views shown in the figures. It is also understood that, unless otherwise specified, terms such as "top," "bottom," "outward," "inward," and the like are words of convenience and are not to be construed as limiting terms. In addition, whenever a group is described as comprising at least one of a group of elements and combinations thereof, it is understood that the group may comprise, consist essentially of, or consist of any number of those elements recited, either individually or in combination with each other. Similarly, whenever a group is described as consisting of at least one of a group of elements or combinations thereof, it is understood that the group may consist of any number of those elements recited, either individually or in combination with each other. Unless otherwise specified, a range of values, when recited, includes both the upper and lower limits of the range as well as any ranges therebetween. As used herein, the indefinite articles "a," "an," and the corresponding definite article "the" mean "at least one" or "one or more," unless otherwise specified. It also is understood that the various features disclosed in the specification and the drawings can be used in any and all combinations.

It is noted that the terms "substantially" and "about" may be utilized herein to represent the inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue.

As used herein, the term "glass article" is used in its broadest sense to include any object made wholly or partly of glass. Glass articles include laminates of glass and non-glass materials, laminates of amorphous and crystalline materials, and glass-ceramics (including an amorphous phase and a crystalline phase). Unless otherwise specified, all compositions are expressed in terms of mole percent (mol %).

As will be discussed herein, embodiments of the glass articles may include strengthened glass or glass ceramic materials that exhibit improved mechanical performance and reliability compared to known glass articles, especially known cover glass articles. Embodiments of the glass articles described herein may exhibit fragmentation behaviors that are not exhibited by known cover glass articles. In this disclosure glass-based substrates are generally unstrengthened and glass-based articles generally refer to glass-based substrates that have been strengthened (by, for example, ion exchange).

A first aspect of this disclosure pertains to a strengthened glass article that exhibits the ability to fracture into a dense fracture pattern with a dicing effect that is analogous to fully, thermally tempered glass used in shower panels or automobile window panels. In some embodiments, the fragments are intended to be less injurious to humans. Such articles exhibit this behavior despite being chemically strengthened and having thicknesses significantly less than achievable by current known thermal tempering processes. In some embodiments, the fragments are even smaller or finer than those observed with known thermally tempered glass. For example, embodiments of the glass articles exhibit a "dicing" effect in that, when the glass article is fractured, the "diced" fragments have a small aspect ratio and the fracture generated surface and the as-formed surface form larger angles (i.e., fewer blade-like or knife-like angles), such that the fragments resemble cubes more than splinters, as described in more detail below with respect to FIG. 1A. In some instances, the diced fragments are limited by a maximum or longest dimension of 2 millimeters (mm) or less in any direction of the major plane of the glass article. In some instances, when fractured or after the glass article fractures, the glass article includes a plurality of fragments having an average aspect ratio of about 10 or less, or about 5 or less (e.g., about 4.5 or less, about 4 or less, about 3.5 or less, about 3 or less, about 2.5 or less, about 2 or less). In some embodiments, the average aspect ratio of the plurality of fragments is in the range from about 1 to about 2. In some instances, about 90% or greater, or about 80% or greater of the plurality of fragments exhibits the average aspect ratios described herein. As used herein, the term "aspect ratio" refers to the ratio of the longest or maximum dimension of a fragment to the shortest or minimum dimension of the fragment. The term "dimension" can include a length, width, diagonal, or thickness. Glass articles that exhibit such fragments after being fractured may be characterized herein as exhibiting "dicing" behavior.

Figure 1B:
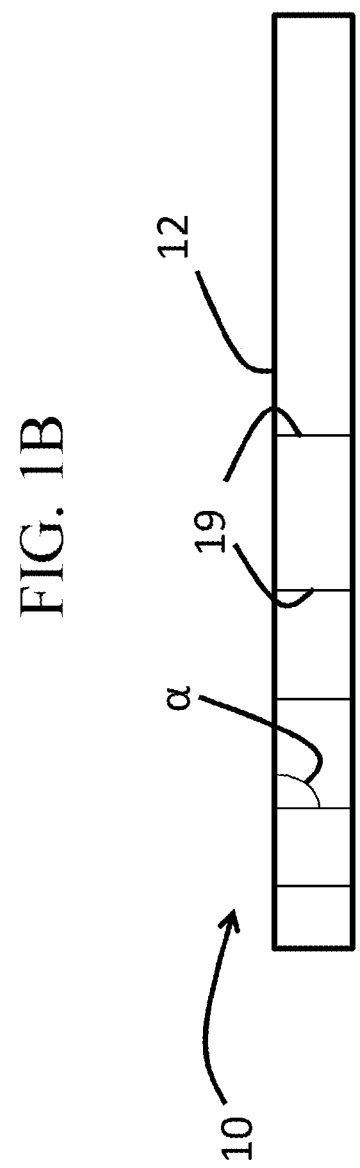
FIG. 1B is a side view of the glass article of FIG. 1A after fracture.

Referring to FIGS. 1A and 1B, in one or more embodiments, the glass articles 10 described herein may have a sheet configuration with opposing major surfaces 12, 14 and opposing minor surfaces 16, 18. At least one major surface 12 forms an "as-formed" surface of the glass article. When fractured, a new surface generated by the fracture of the glass article, is formed (i.e., a "fracture-generated" surface), indicated by reference number 19 in FIG. 1B. The angle α between a fracture generated surface and the as-formed surface (after the glass article is fractured) are in the range from about 85 degrees to about 95 degrees or about 88 degrees to about 92 degrees. In one or more embodiments, about 90% or more of the plurality of fragments in glass article exhibit the angles between the as-formed surface and all of the fracture generated surfaces, after the glass article is fractured.

In one or more embodiments, at least 50% (e.g., about 60% or more, about 70% or more, about 80% or more, or about 90% or more) of the plurality of fragments have a maximum dimension that is less than or equal to 5·t, less than or equal to 3·t, or less than or equal to 3·t. In some instances, at least 50% (e.g., about 60% or more, about 70% or more, about 80% or more, or about 90% or more) of plurality of fragments comprise a maximum dimension that is less than 2 times the minimum dimension. In some embodiments, the maximum dimension is about 1.8 times the minimum dimension or less, about 1.6 times the minimum dimension or less, about 1.5 times the minimum dimension or less, about 1.4 times the minimum dimension or less, about 1.2 times the minimum dimension or less, or about equal to the minimum dimension.

In one or more embodiments, at least 50% (e.g., about 60% or more, about 70% or more, about 80% or more, or about 90% or more) of the plurality of fragments comprises a volume of less than or equal to about 10 mm$^3$. In some embodiments, the volume may be less than or equal to about 8 mm$^3$, less than or equal to about 5 mm$^3$, or less than or equal to about 4 mm$^3$. In some embodiments, the volume may be in the range from about 0.1 mm$^3$ to about 1.5 mm$^3$.

As used herein, the phrase "strengthened articles" includes articles that are chemically strengthened, or chemically strengthened and thermally strengthened, but exclude articles that are only thermally strengthened. As shown in FIG. 4, the strengthened glass article exhibits a stress profile that can be characterized in terms of a surface compressive stress (CS), a central tension (CT) and a depth of compression (DOC).

The stress profile exhibited by the strengthened glass articles of one or more embodiments may be distinguished between the stress profiles exhibited by known thermally tempered glass articles and known chemically strengthened glass articles. Traditionally, thermally tempered glass has been used to prevent failures where such flaws may be introduced to the glass because thermally tempered glass often exhibits large CS layers (e.g., approximately 21% of the total thickness of the glass), which can prevent flaws from propagating and thus, failure. An example of a stress profile generated by thermal tempering is shown in FIG. 2. In FIG. 2, the thermally treated glass article 100 includes a first surface 101, a thickness $t_1$, and a surface CS 110. The glass article 100 exhibits a CS that decreases from the first surface 101 to a DOC 130, as defined herein, at which depth the stress changes from compressive to tensile stress and reaches a CT 120.

Thermal tempering is currently limited to thick glass articles (i.e., glass articles having a thickness $t_1$ of about 3 millimeters or greater) because, to achieve the thermal strengthening and the desired residual stresses, a sufficient thermal gradient must be formed between the core of such articles and the surface. Such thick articles are undesirable or not practical in many applications such as displays (e.g., consumer electronics, including mobile phones, tablets, computers, navigation systems, and the like), architecture (e.g., windows, shower panels, countertops etc.), transportation (e.g., automotive, trains, aircraft, sea craft, etc.), appliances, packaging, or any application that requires superior fracture resistance but thin and light-weight articles.

Known chemically strengthened glass articles do not exhibit the stress profile of thermally tempered glass articles, although chemical strengthening is not limited by the thickness of the glass article in the same manner as thermally tempering. An example of a stress profile generated by chemical strengthening (e.g., by ion exchange process), is shown in FIG. 3. In FIG. 3, the chemically strengthened glass article 200 includes a first surface 201, a thickness $t_2$ and a surface CS 210. The glass article 200 exhibits a CS that decreases from the first surface 201 to a DOC 230, as defined herein, at which depth the stress changes from compressive to tensile stress and reaches a CT 220. As shown in FIG. 3, such profiles exhibit a flat CT region or CT region with a constant or near constant tensile stress and, often, a lower CT value, as compared to the CT value shown in FIG. 2.

The glass articles of one or more embodiments of this disclosure exhibit a thickness t of less than about 3 mm (e.g., about 2 mm or less, about 1.5 mm or less, or about 1.1 mm or less) and a compressive stress layer extending from the first surface to a DOC of about 0.11 or greater. As used herein, DOC refers to the depth at which the stress within the glass article changes compressive to tensile stress. At the DOC, the stress crosses from a positive (compressive) stress to a negative (tensile) stress (e.g., 130 in FIG. 2) and thus exhibits a stress value of zero.

According to the convention normally used in the art, compression is expressed as a negative (<0) stress and tension is expressed as a positive (>0) stress. Throughout this description, however, CS is expressed as a positive or absolute value—i.e., as recited herein, CS=|CS|.

In particular, the glass articles described herein are thin and exhibit stress profiles that are typically only achievable through tempering thick glass articles (e.g., having a thickness of about 2 mm or 3 mm or greater). In some cases, the glass articles exhibit a greater surface CS than tempered glass articles. In one or more embodiments, the glass articles exhibit a larger depth of the compression layer (in which the CS decreases and increases more gradually than known chemically strengthened glass articles) such that the glass article exhibits substantially improved fracture resistance, even when the glass article or a device including the same is dropped on a hard, rough surface. The glass articles of one or more embodiments exhibit a greater CT value than some known chemically strengthened glass substrates.

CS is measured by surface stress meter (FSM) using commercially available instruments such as the FSM-6000, manufactured by Orihara Industrial Co., Ltd. (Japan). Surface stress measurements rely upon the accurate measurement of the stress optical coefficient (SOC), which is related to the birefringence of the glass. SOC in turn is measured according to a modified version of Procedure C described in ASTM standard C770-98 (2013), entitled "Standard Test Method for Measurement of Glass Stress-Optical Coefficient," the contents of which are incorporated herein by reference in their entirety. The modification includes using a glass disc as the specimen with a thickness of 5 to 10 mm and a diameter of 12.7 mm, wherein the disc is isotropic and homogeneous and core drilled with both faces polished and parallel. The modification also includes calculating the maximum force, Fmax to be applied. The force should be sufficient to produce at least 20 MPa compression stress. Fmax is calculated as follows:

$$F\text{max}=7.854*D*h$$

Where:
Fmax=Force in Newtons
D=the diameter of the disc
h=the thickness of the light path
For each force applied, the stress is computed as follows:

$$\sigma_{MPa}=8F/(\pi*D*h)$$

Where:
F=Force in Newtons
D=the diameter of the disc
h=the thickness of the light path CT values are measured using a scattered light polariscope ("SCALP", supplied by Glasstress Ltd., located in Tallinn, Estonia, under model number SCALP-04) and techniques known in the art. SCALP can also be used to measure the DOC, as will be described in more detail below.

In some embodiments, the glass article may also exhibit a depth of penetration of potassium ions ("Potassium DOL") that is distinct from the DOC. The degree of difference between DOC and Potassium DOL depends on the glass substrate composition and the ion exchange treatment that generates the stress in the resulting glass article. Where the stress in the glass article is generated by exchanging potassium ions into the glass article, FSM (as described above with respect to CS) is used to measure Potassium DOL. Where the stress is generated by exchanging sodium ions into the glass article, SCALP (as described above with respect to CT) is used to measure DOC and the resulting glass article will not have a Potassium DOL since there is no penetration of potassium ions. Where the stress in the glass article is generated by exchanging both potassium and sodium ions into the glass, the exchange depth of sodium indicates the DOC, and the exchange depth of potassium ions indicates a change in the magnitude of the compressive stress (but not the change in stress from compressive to tensile); in such embodiments, the DOC is measured by SCALP, and Potassium DOL is measured by FSM. Where both Potassium DOL and DOC are present in a glass article, the Potassium DOL is typically less than the DOC.

Refracted near-field (RNF) method or SCALP may be used to measure the stress profile in the glass articles described herein (regardless of whether the stress is generated by sodium ion exchange and/or potassium ion exchange). When the RNF method is utilized, the CT value provided by SCALP is utilized. In particular, the stress profile measured by RNF is force balanced and calibrated to the CT value provided by a SCALP measurement. The RNF method is described in U.S. Pat. No. 8,854,623, entitled "Systems and methods for measuring a profile characteristic of a glass sample", which is incorporated herein by reference in its entirety. In particular, the RNF method includes placing the glass-based article adjacent to a reference block, generating a polarization-switched light beam that is switched between orthogonal polarizations at a rate of between 1 Hz and 50 Hz, measuring an amount of power in the polarization-switched light beam and generating a polarization-switched reference signal, wherein the measured amounts of power in each of the orthogonal polarizations are within 50% of each other. The method further includes transmitting the polarization-switched light beam through the glass sample and reference block for different depths into the glass sample, then relaying the transmitted polarization-switched light beam to a signal photodetector using a relay optical system, with the signal photodetector generating a polarization-switched detector signal. The method also includes dividing the detector signal by the reference signal to form a normalized detector signal and determining the profile characteristic of the glass sample from the normalized detector signal.

In one or more embodiments in which the stress in a glass article is generated by only potassium ion exchange and Potassium DOL is equivalent to DOC, the stress profile may also be obtained by the methods disclosed in U.S. patent application Ser. No. 13/463,322, entitled "Systems And Methods for Measuring the Stress Profile of Ion-Exchanged Glass (hereinafter referred to as "Roussev I"), filed by Rostislav V. Roussev et al. on May 3, 2012, and claiming priority to U.S. Provisional Patent Application No. 61/489,800, having the same title and filed on May 25, 2011. Roussev I discloses methods for extracting detailed and precise stress profiles (stress as a function of depth) of chemically strengthened glass using FSM. Specifically, the spectra of bound optical modes for TM and TE polarization are collected via prism coupling techniques, and used in their entirety to obtain detailed and precise TM and TE refractive index profiles $n_{TM}(z)$ and $n_{TE}(z)$. The contents of the above applications are incorporated herein by reference in their entirety. The detailed index profiles are obtained from the mode spectra by using the inverse Wentzel-Kramers-Brillouin (IWKB) method, and fitting the measured mode spectra to numerically calculated spectra of predefined functional forms that describe the shapes of the index profiles and obtaining the parameters of the functional forms from the best fit. The detailed stress profile S(z) is calculated from the difference of the recovered TM and TE index profiles by using a known value of the stress-optic coefficient (SOC):

$$S(z)=[n_{TM}(z)-n_{TE}(z)]/SOC \qquad (2).$$

Due to the small value of the SOC, the birefringence $n_{TM}(z)-n_{TE}(z)$ at any depth z is a small fraction (typically on the order of 1%) of either of the indices $n_{TM}(z)$ and $n_{TE}(z)$. Obtaining stress profiles that are not significantly distorted due to noise in the measured mode spectra requires determination of the mode effective indices with precision on the order of 0.00001 RIU. The methods disclosed in Roussev I further include techniques applied to the raw data to ensure such high precision for the measured mode indices, despite noise and/or poor contrast in the collected TE and TM mode spectra or images of the mode spectra. Such techniques include noise-averaging, filtering, and curve fitting to find the positions of the extremes corresponding to the modes with sub-pixel resolution.

As stated above, the glass articles described herein may be chemically strengthened by ion exchange and exhibit stress profiles that are distinguished from those exhibited by known strengthened glass. In this process, ions at or near the surface of the glass article are replaced by—or exchanged with—larger ions having the same valence or oxidation state. In those embodiments in which the glass article comprises an alkali aluminosilicate glass, ions in the surface layer of the glass and the larger ions are monovalent alkali metal cations, such as $Li^+$ (when present in the glass article), $Na^+$, $K^+$, $Rb^+$, and $Cs^+$. Alternatively, monovalent cations in the surface layer may be replaced with monovalent cations other than alkali metal cations, such as $Ag^+$ or the like.

Ion exchange processes are typically carried out by immersing a glass article in a molten salt bath (or two or more molten salt baths) containing the larger ions to be exchanged with the smaller ions in the glass article. It should be noted that aqueous salt baths may also be utilized. In addition, the composition of the bath(s) may include more than one type of larger ion (e.g., Na+ and K+) or a single larger ion. It will be appreciated by those skilled in the art that parameters for the ion exchange process, including, but not limited to, bath composition and temperature, immersion time, the number of immersions of the glass article in a salt bath (or baths), use of multiple salt baths, additional steps such as annealing, washing, and the like, are generally determined by the composition of the glass article (including the structure of the article and any crystalline phases present) and the desired DOC and CS of the glass article that result from the strengthening operation. By way of example, ion exchange of a glass articles may be achieved by immersion of the glass articles in at least one molten bath containing a salt such as, but not limited to, nitrates, sulfates, and chlorides of the larger alkali metal ion. Typical nitrates include $KNO_3$, $NaNO_3$, $LiNO_3$, $NaSO_4$ and combinations thereof. The temperature of the molten salt bath typically is in a range from about 380° C. up to about 450° C., while immersion times range from about 15 minutes up to about 100 hours depending on glass thickness, bath temperature and glass diffusivity. However, temperatures and immersion times different from those described above may also be used.

In one or more embodiments, the glass articles may be immersed in a molten salt bath of 100% $NaNO_3$ having a temperature from about 370° C. to about 480° C. In some embodiments, the glass substrate may be immersed in a molten mixed salt bath including from about 5% to about 90% $KNO_3$ and from about 10% to about 95% $NaNO_3$. In some embodiments, the glass substrate may be immersed in a molten mixed salt bath including $Na_2SO_4$ and $NaNO_3$ and have a wider temperature range (e.g., up to about 500° C.). In one or more embodiments, the glass article may be immersed in a second bath, after immersion in a first bath. Immersion in a second bath may include immersion in a molten salt bath including 100% $KNO_3$ for 15 minutes to 8 hours.

The ion exchange conditions may be modified based on the glass composition and thickness of the glass substrate. For example, a glass substrate having a nominal composition as shown in Example 1 below having a thickness of 0.4 mm may be immersed in a molten salt bath of 80-100% $KNO_3$ (with the balance $NaNO_3$) having a temperature of about 460° C. for a duration from about 10 hours to about 20 hours. The same substrate having a thickness of about 0.55 mm may be immersed in a molten salt bath of 70-100% $KNO_3$ (with the balance $NaNO_3$) having a temperature of about 460° C. for a duration of from about 20 hours to about 40 hours. The same substrate having a thickness of about 0.8 mm may be immersed in a molten salt bath of 60-100% $KNO_3$ (with the balance $NaNO_3$) having a temperature of about 460° C. for a duration of from about 40 hours to about 80 hours.

In one or more embodiments, the glass-based substrate may be immersed in a molten, mixed salt bath including $NaNO_3$ and $KNO_3$ (e.g., 49%/51%, 50%/50%, 51%/49%) having a temperature less than about 420° C. (e.g., about 400° C. or about 380° C.). for less than about 5 hours, or even about 4 hours or less.

Ion exchange conditions can be tailored to provide a "spike" or to increase the slope of the stress profile at or near the surface of the resulting glass-based article. This spike can be achieved by single bath or multiple baths, with the bath(s) having a single composition or mixed composition, due to the unique properties of the glass compositions used in the glass-based articles described herein.

As illustrated in FIG. 4, the glass article 300 of one or more embodiments includes a first surface 302 and a second surface 304 opposing the first surface, defining a thickness t. In one or more embodiments, the thickness t may be less than about 3 mm, about 2 mm or less, about 1.5 mm or less, about 1.1 mm or less, or 1 mm or less (e.g., in the range from about 0.01 mm to about 1.5 mm, from about 0.1 mm to about 1.5 mm, from about 0.2 mm to about 1.5 mm, from about 0.3 mm to about 1.5 mm, from about 0.4 mm to about 1.5 mm, in the range from about 0.01 mm to about 1.1 mm, from about 0.1 mm to about 1.1 mm, from about 0.2 mm to about 1.1 mm, from about 0.3 mm to about 1.1 mm, from about 0.4 mm to about 1.1 mm, from about 0.01 mm to about 1.4 mm, from about 0.01 mm to about 1.2 mm, from about 0.01 mm to about 1.1.1 mm, from about 0.01 mm to about 1 mm, from about 0.01 mm to about 0.9 mm, from about 0.01 mm to about 0.8 mm, from about 0.01 mm to about 0.7 mm, from about 0.01 mm to about 0.6 mm, from about 0.01 mm to about 0.5 mm, from about 0.1 mm to about 0.5 mm, or from about 0.3 mm to about 0.5 mm.)

FIG. 4, is a cross-sectional illustration of the stress profile of a chemically strengthened glass article 300 along its thickness 330 (depicted along the x-axis). The magnitude of the stress is illustrated on the y-axis with the line 301 representing a zero stress.

The stress profile 312 includes a CS layer 315 (with a surface CS value 310) that extends from one or both the first major surface 302 and the second major surface 304 to a DOC 330, and a CT layer 325 (with a CT 320) that extends from DOC 330 to the central portion of the article.

As used herein, DOC refers to the depth at which the stress within the glass article changes compressive to tensile. At the DOC, the stress crosses from a positive (compressive) stress to a negative (tensile) stress (e.g., 330 in FIG. 5) and thus exhibits a stress value of zero.

The CS layer has an associated depth or length 317 extending from a major surface 302, 304 to the DOC 330. The CT layer 325 also has an associated depth or length 327 (CT region or layer).

The surface CS 310 may be about 150 MPa or greater or about 200 MPa or greater (e.g., about 250 MPa or greater, about 300 MPa or greater, about 400 MPa or greater, about 450 MPa or greater, about 500 MPa or greater, or about 550 MPa or greater). The surface CS 310 may be up to about 900 MPa, up to about 1000 MPa, up to about 1100 MPa, or up to about 1200 MPa. In one or more embodiments, the surface CS 310 may be in a range from about 150 MPa to about 1200 MPa, from about 200 MPa to about 1200 MPa, from about 250 MPa to about 1200 MPa, from about 300 MPa to about 1200 MPa, from about 350 MPa to about 1200 MPa, from about 400 MPa to about 1200 MPa, from about 450 MPa to about 1200 MPa, from about 500 MPa to about 1200 MPa, from about 200 MPa to about 1100 MPa, from about 200 MPa to about 1000 MPa, from about 200 MPa to about 900 MPa, from about 200 MPa to about 800 MPa, from about 200 MPa to about 700 MPa, from about 200 MPa to about 600 MPa, from about 200 MPa to about 500 MPa, from about 300 MPa to about 900 MPa, or from about 400 MPa to about 600 MPa.

The CT 320 may be about 25 MPa or greater, about 50 MPa or greater, about 75 MPa or greater, or about 85 MPa or greater, or about 100 MPa or greater (e.g., about 150 MPa or greater, about 200 MPa or greater, 250 MPa or greater, or about 300 MPa or greater). In some embodiments, the CT 320 may be in the range from about 50 MPa to about 400 MPa, (e.g., from about 75 MPa to about 400 MPa, from about 100 MPa to about 400 MPa, from about 150 MPa to about 400 MPa, from about 50 MPa to about 350 MPa, from about 50 MPa to about 300 MPa, from about 50 MPa to about 250 MPa, from about 50 MPa to about 200 MPa, from about 100 MPa to about 400 MPa, from about 100 MPa to about 300 MPa, from about 150 MPa to about 250 MPa). As used herein, CT is the greatest magnitude of the central tension in the glass article.

It should be noted that any one or more of surface CS 310 and CT 320 may be dependent on the thickness of the glass article. For example, glass articles having at thickness of about 0.8 mm may have a CT of about 100 MPa or greater. In one or more embodiment, glass articles having at thickness of about 0.4 mm may have a CT of about 130 MPa or greater. In some embodiments, the CT may be expressed in terms of thickness t of the glass article. For example, in one or more embodiment CT may be about (100 MPa)/√(t/1 mm), or greater, where t is thickness is mm. In some embodiments, CT may be about (105 MPa)/√(t/1 mm) or greater, (110 MPa)/√(t/1 mm) or greater, (115 MPa)/√(t/1 mm) or greater, (120 MPa)/√(t/1 mm) or greater, or (125 MPa)/√(t/1 mm) or greater.

The CT 320 may be positioned at a range from about 0.3·t to about 0.7·t, from about 0.4·t to about 0.6·t or from about 0.45·t to about 0.55·t. It should be noted that any one or more of surface CS 310 and CT 320 may be dependent on the thickness of the glass-based article. For example, glass-based articles having at thickness of about 0.8 mm may have a CT of about 75 MPa or less. When the thickness of the glass-based article decreases, the CT may increase. In other words, the CT increases with decreasing thickness (or as the glass-based article becomes thinner).

The Young's modulus of the glass article can influence the CT of the strengthened glass articles described herein. Specifically, as the Young's modulus of a glass article decreases, the glass article may be strengthened to have a lower CT, for a given thickness, and still exhibit the fracture behavior described herein. For example, when comparing a 1 mm glass article having a relatively lower Young's modulus than another 1 mm-thick glass article having a higher Young's modulus, the lower Young's modulus glass article may be strengthened to a lesser degree (i.e., to a relatively lower CT value) and still exhibit the same fracture behavior as the higher Young's modulus glass (which would have a higher CT compared to the CT glass article).

In some embodiments, the ratio of the CT 320 to the surface CS in the range from about 0.05 to about 1 (e.g., in the range from about 0.05 to about 0.5, from about 0.05 to about 0.3, from about 0.05 to about 0.2, from about 0.05 to about 0.1, from about 0.5 to about 0.8, from about 0.0.5 to about 1, from about 0.2 to about 0.5, from about 0.3 to about 0.5). In known chemically strengthened glass articles, the ratio of the CT 320 to the surface CS is 0.1 or less. In some embodiments, surface CS may be 1.5 times (or 2 times or 2.5 times) the CT or greater. In some embodiments, the surface CS may be up to about 20 times the CT.

In one or more embodiments, the stress profile 312 comprises a maximum CS, which is typically the surface CS 310 and can be found at one or both of the first surface 302 and the second surface 304. In one or more embodiments, the CS layer or region 315 extends along a portion of the thickness to the DOC 317 and a CT 320. In one or more embodiments, the DOC 317 may be about 0.1·t or greater. For example, the DOC 317 may be about 0.12·t or greater, about 0.14·t or greater, about 0.15·t or greater, about 0.16·t or greater, 0.17·t or greater, 0.18·t or greater, 0.19·t or greater, 0.20·t or greater, about 0.21·t or greater, or up to about 0.25·t. In some embodiments, the DOC 317 is less than the maximum chemical depth 342. The maximum chemical depth 342 may be about 0.4·t or greater, 0.5·t or greater, about 55·t or greater, or about 0.6·t or greater.

In one or more embodiments, the glass-based article comprises a Potassium DOL in the range from about 6 micrometers to about 20 micrometers. In some embodiments, the Potassium DOL may be expressed as a function of the thickness t of the glass-based article. In one or more embodiments, Potassium DOL may be in the range from about 0.005t to about 0.05t. In some embodiments, the Potassium DOL may be in the range from about 0.005t to about 0.05t, from about 0.005t to about 0.045t, from about 0.005t to about 0.04t, from about 0.005t to about 0.035t, from about 0.005t to about 0.03t, from about 0.005t to about 0.025t, from about 0.005t to about 0.02t, from about 0.005t to about 0.015t, from about 0.005t to about 0.01t, from about 0.006t to about 0.05t, from about 0.008t to about 0.05t, from about 0.01t to about 0.05t, from about 0.015t to about 0.05t, from about 0.02t to about 0.05t, from about 0.025t to about 0.05t, from about 0.03t to about 0.05t, or from about 0.01t to about 0.02t.

In one or more embodiments, the compressive stress value at the Potassium DOL depth may be in the range from about 50 MPa to about 300 MPa. In some embodiments, the compressive stress value at the Potassium DOL depth may be in the range from about 50 MPa to about 280 MPa, from about 50 MPa to about 260 MPa, from about 50 MPa to about 250 MPa, from about 50 MPa to about 240 MPa, from about 50 MPa to about 220 MPa, from about 50 MPa to about 200 MPa, from about 60 MPa to about 300 MPa, from about 70 MPa to about 300 MPa, from about 75 MPa to about 300 MPa, from about 80 MPa to about 300 MPa, from about 90 MPa to about 300 MPa, from about 100 MPa to about 300 MPa, from about 1100 MPa to about 300 MPa, from about 120 MPa to about 300 MPa, from about 130 MPa to about 300 MPa, or from about 150 MPa to about 300 MPa.

In one or more embodiments, the glass article exhibits the combination of a surface CS in a range from about 450 MPa to about 600 MPa, a CT in a range from about 200 to 300 MPa, and a thickness in a range from about 0.4 mm to 0.5 mm. In some embodiments, the DOC of the glass article is in a range from about 0.18t to about 0.21t.

In one or more embodiments, the glass article exhibits the combination of a surface CS in a range from about 350 MPa to about 450 MPa, a CT in a range from about 150 to 250 MPa, and a thickness in a range from about 0.4 mm to 0.5 mm. In some embodiments, the DOC of the glass article is in a range from about 0.18t to about 0.21t.

In one or more embodiments, the glass articles exhibits a maximum chemical depth of about 0.4·t or greater, 0.5·t or greater, about 55·t or greater, or about 0.6·t or greater. As used herein, the term "chemical depth" means the depth at which an ion of the metal oxide or alkali metal oxide (e.g., the metal ion or alkali metal ion) diffuses into the glass article and the depth at which the concentration of that ion reaches a minimum value, as determined by Electron Probe Micro-Analysis (EPMA). The ion is the ion diffused into the chemically strengthened glass article as a result of ion exchange. Maximum chemical depth refers to the maximum diffusion depth of any ion exchanged into the chemically strengthened glass article by ion exchange process. For example, where a molten salt bath having more than one diffusing ionic species (i.e., a molten salt bath of both $NaNO_3$ and $KNO_3$), the different ionic species may diffuse to different depths into the chemically strengthened glass articles. The maximum chemical depth is the greatest diffusion depth of all the ionic species ion exchanged into the chemically strengthened glass article.

In one or more embodiments, the stress profile 312 may be described as parabolic-like in shape. In some embodiments, the stress profile along the region or depth of the glass-based article exhibiting tensile stress exhibits a parabolic-like shape. In one or more specific embodiments, the stress profile 312 is free of a flat stress (i.e., compressive or tensile) portion or a portion that exhibits a substantially constant stress (i.e., compressive or tensile). In some embodiments, the CT region exhibits a stress profile that is substantially free of a flat stress or free of a substantially constant stress. In one or more embodiments, all points of the stress profile 312 between a thickness range from about 0t up to about 0.2·t and greater than 0.8·t (or from about 0·t to about 0.3·t and greater than 0.7.0 comprise a tangent that is less than about −0.1 MPa/micrometers or greater than about 0.1 MPa/micrometers. In some embodiments, the tangent may be less than about −0.2 MPa/micrometers or greater than about 0.2 MPa/micrometers. In some more specific embodiments, the tangent may be less than about −0.3 MPa/micrometers or greater than about 0.3 MPa/micrometers. In even more specific embodiments, the tangent may be less than about −0.5 MPa/micrometers or greater than about 0.5 MPa/micrometers. In other words, the stress profile of one or more embodiments along these thickness ranges (i.e., 0·t up to about 2·t and greater than 0.8t, or from about 0t to about 0.3·t and 0.7·t or greater) exclude points having a tangent, as described herein. Without being bound by theory, known error function or quasi-linear stress profiles have points along these thickness ranges (i.e., from about 0·t up to about 2·t and greater than 0.8·t, or from about 0·t to about 0.3·t and 0.7·t or greater) that have a tangent that is in the range from about −0.1 MPa/micrometers to about 0.1 MPa/micrometers, from about −0.2 MPa/micrometers to about 0.2 MPa/micrometers, from about −0.3 MPa/micrometers to about 0.3 MPa/micrometers, or from about −0.5 MPa/micrometers to about 0.5 MPa/micrometers (indicating a flat or zero slope stress profile along such thickness ranges, as shown in FIG. 3, 220). The glass-based articles of one or more embodiments of this disclosure do not exhibit such a stress profile having a flat or zero slope stress profile along these thickness ranges, as shown in FIG. 4.

In one or more embodiments, the glass-based article exhibits a stress profile in a thickness range from about 0.1·t to 0.3·t and from about 0.7·t to 0.9·t that comprises a maximum tangent and a minimum tangent. In some instances, the difference between the maximum tangent and the minimum tangent is about 3.5 MPa/micrometers or less, about 3 MPa/micrometers or less, about 2.5 MPa/micrometers or less, or about 2 MPa/micrometers or less.

In one or more embodiments, the glass-based article includes a stress profile 312 that is substantially free of any linear segments that extend in a depth direction or along at least a portion of the thickness t of the glass-based article. In other words, the stress profile 312 is substantially continuously increasing or decreasing along the thickness t. In some embodiments, the stress profile is substantially free of any linear segments in a depth direction having a length of about 10 micrometers or more, about 50 micrometers or more, or about 100 micrometers or more, or about 200 micrometers or more. As used herein, the term "linear" refers to a slope having a magnitude of less than about 5 MPa/micrometer, or less than about 2 MPa/micrometer along the linear segment. In some embodiments, one or more portions of the stress profile that are substantially free of any linear segments in a depth direction are present at depths within the glass-based article of about 5 micrometers or greater (e.g., 10 micrometers or greater, or 15 micrometers or greater) from either one or both the first surface or the second surface. For example, along a depth of about 0 micrometers to less than about 5 micrometers from the first surface, the stress profile may include linear segments, but from a depth of about 5 micrometers or greater from the first surface, the stress profile may be substantially free of linear segments.

In some embodiments, the stress profile may include linear segments at depths from about 0t up to about 0.1t and may be substantially free of linear segments at depths of about 0.1t to about 0.4t. In some embodiments, the stress profile from a thickness in the range from about 0t to about 0.1t may have a slope in the range from about 20 MPa/microns to about 200 MPa/microns. As will be described herein, such embodiments may be formed using a single ion-exchange process by which the bath includes two or more alkali salts or is a mixed alkali salt bath or multiple (e.g., 2 or more) ion exchange processes.

In one or more embodiments, the glass-based article may be described in terms of the shape of the stress profile along the CT region (327 in FIG. 4). For example, in some embodiments, the stress profile along the CT region (where stress is in tension) may be approximated by equation. In some embodiments, the stress profile along the CT region may be approximated by Equation (1):

$$\text{Stress}(x) = \text{Max}T - (((CT_n \cdot (n+1))/0.5^n) \cdot |(x/t) - 0.5|^n) \quad (1)$$

Figure 5:
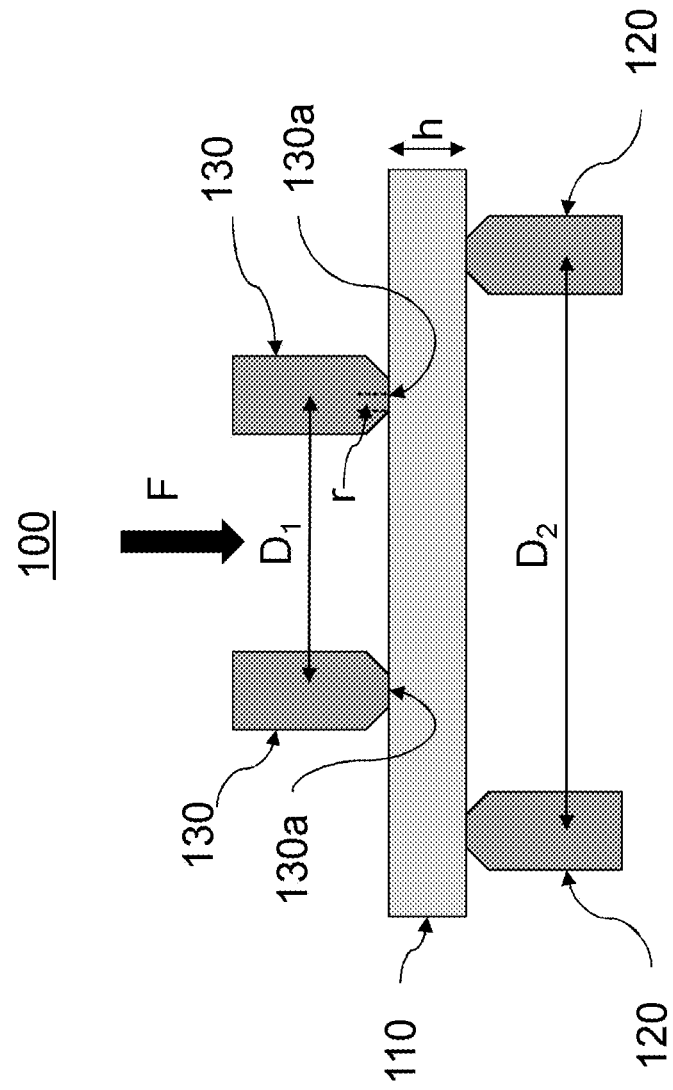
FIG. 5 is a is a schematic cross-sectional view of a ring-on-ring apparatus.

In Equation (1), the stress (x) is the stress value at position x. Here the stress is positive (tension). In Equation (1), MaxT is the maximum tension value and $CT_n$ is the tension value at n and is less than or equal to MaxT. Both MaxT and $CT_n$ as positive values in MPa. The value x is position along the thickness (t) in micrometers, with a range from 0 to t; x=0 is one surface (302, in FIG. 4), x=0.5t is the center of the glass-based article, stress(x)=MaxCT, and x=t is the opposite surface (304, in FIG. 4). MaxT used in Equation (1) is equivalent to the CT, which may be less than about $71.5/\sqrt{(t)}$. In some embodiments, the MaxT used in Equation (1) may be in the range from about 50 MPa to about 80 MPa (e.g., from about 60 MPa to about 80 MPa, from about 70 MPa to about 80 MPa, from about 50 MPa to about 75 MPa, from about 50 MPa to about 70 MPa, or from about 50 MPa to about 65 MPa), and n is a fitting parameter from 1.5 to 5 (e.g., 2 to 4, 2 to 3 or 1.8 to 2.2) or from about 1.5 to about 2. In one or more embodiments, n=2 can provide a parabolic stress profile, exponents that deviate from n=2 provide stress profiles with near parabolic stress profiles. FIG. 5 is a graph illustrating various stress profiles according to one or more embodiments of this disclosure, based on changes in the fitting parameter n.

In one or more embodiments, CTn may be less than MaxT where there is a compressive stress spike on one or both major surfaces of the glass-based article. In one or more embodiments, CTn is equal to MaxT when there is no compressive stress spike on one or both major surfaces of the glass-based article.

In some embodiments, the stress profile may be modified by heat treatment. In such embodiments, the heat treatment may occur before any ion-exchange processes, between ion-exchange processes, or after all ion-exchange processes. In some embodiments, the heat treatment may result reduce the slope of the stress profile at or near the surface. In some embodiments, where a steeper or greater slope is desired at the surface, an ion-exchange process after the heat treatment may be utilized to provide a "spike" or to increase the slope of the stress profile at or near the surface.

In one or more embodiments, the stress profile 312 (and/or estimated stress profile 340) is generated due to a non-zero concentration of a metal oxide(s) that varies along a portion of the thickness. The variation in concentration may be referred to herein as a gradient. In some embodiments, the concentration of a metal oxide is non-zero and varies, both along a thickness range from about 0·t to about 0.3·t. In some embodiments, the concentration of the metal oxide is non-zero and varies along a thickness range from about 0·t to about 0.35·t, from about 0·t to about 0.4·t, from about 0·t to about 0.45·t or from about 0·t to about 0.48·t. The metal oxide may be described as generating a stress in the glass-based article. The variation in concentration may be continuous along the above-referenced thickness ranges.

Variation in concentration may include a change in metal oxide concentration of about 0.2 mol % along a thickness segment of about 100 micrometers. This change may be measured by known methods in the art including microprobe, as shown in Example 1. The metal oxide that is non-zero in concentration and varies along a portion of the thickness may be described as generating a stress in the glass-based article.

The variation in concentration may be continuous along the above-referenced thickness ranges. In some embodiments, the variation in concentration may be continuous along thickness segments in the range from about 10 micrometers to about 30 micrometers. In some embodiments, the concentration of the metal oxide decreases from the first surface to a point between the first surface and the second surface and increases from the point to the second surface.

The concentration of metal oxide may include more than one metal oxide (e.g., a combination of $Na_2O$ and $K_2O$). In some embodiments, where two metal oxides are utilized and where the radius of the ions differ from one or another, the concentration of ions having a larger radius is greater than the concentration of ions having a smaller radius at shallow depths, while the at deeper depths, the concentration of ions having a smaller radius is greater than the concentration of ions having larger radius. For example, where a single Na– and K– containing bath is used in the ion exchange process, the concentration of K+ ions in the glass-based article is greater than the concentration of Na+ ions at shallower depths, while the concentration of Na+ is greater than the concentration of K+ ions at deeper depths. This is due, in part, due to the size of the ions. In such glass-based articles, the area at or near the surface comprises a greater CS due to the greater amount of larger ions (i.e., K+ ions) at or near the surface. This greater CS may be exhibited by a stress profile having a steeper slope at or near the surface (i.e., a spike in the stress profile at the surface).

The concentration gradient or variation of one or more metal oxides is created by chemically strengthening a glass-based substrate, as previously described herein, in which a plurality of first metal ions in the glass-based substrate is exchanged with a plurality of second metal ions. The first ions may be ions of lithium, sodium, potassium, and rubidium. The second metal ions may be ions of one of sodium, potassium, rubidium, and cesium, with the proviso that the second alkali metal ion has an ionic radius greater than the ionic radius than the first alkali metal ion. The second metal ion is present in the glass-based substrate as an oxide thereof (e.g., $Na_2O$, $K_2O$, $Rb_2O$, $Cs_2O$ or a combination thereof).

In one or more embodiments, the metal oxide concentration gradient extends through a substantial portion of the thickness t or the entire thickness t of the glass-based article, including the CT layer 327. In one or more embodiments, the concentration of the metal oxide is about 0.5 mol % or greater in the CT layer 327. In some embodiments, the concentration of the metal oxide may be about 0.5 mol % or greater (e.g., about 1 mol % or greater) along the entire thickness of the glass-based article, and is greatest at the first surface 302 and/or the second surface 304 and decreases substantially constantly to a point between the first surface 302 and the second surface 304. At that point, the concentration of the metal oxide is the least along the entire thickness t; however the concentration is also non-zero at that point. In other words, the non-zero concentration of that particular metal oxide extends along a substantial portion of the thickness t (as described herein) or the entire thickness t. In some embodiments, the lowest concentration in the particular metal oxide is in the CT layer 327. The total concentration of the particular metal oxide in the glass-based article may be in the range from about 1 mol % to about 20 mol %.

In one or more embodiments, the glass-based article includes a first metal oxide concentration and a second metal oxide concentration, such that the first metal oxide concentration is in the range from about 0 mol % to about 15 mol % along a first thickness range from about 0t to about 0.5t, and the second metal oxide concentration is in the range from about 0 mol % to about 10 mol % from a second thickness range from about 0 micrometers to about 25 micrometers (or from about 0 micrometers to about 12 micrometers); however, the concentration of one or both the first metal oxide and the second metal oxide is non-zero along a substantial portion or the entire thickness of the glass-based article. The glass-based article may include an optional third metal oxide concentration. The first metal oxide may include $Na_2O$ while the second metal oxide may include $K_2O$.

The concentration of the metal oxide may be determined from a baseline amount of the metal oxide in the glass-based article prior to being modified to include the concentration gradient of such metal oxide.

In some embodiments, the stress profile may be modified by heat treatment. In such embodiments, the heat treatment may occur before any ion-exchange processes, between ion-exchange processes, or after all ion-exchange processes. In some embodiments, the heat treatment may result reduce the slope of the stress profile at or near the surface. In some embodiments, where a steeper or greater slope is desired at the surface, an ion-exchange process after the heat treatment may be utilized to provide a "spike" or to increase the slope of the stress profile at or near the surface.

In one or more embodiments, the stress profile 312 is generated due to a non-zero concentration of a metal oxide(s) that varies along a portion of the thickness. The variation in concentration may be referred to herein as a gradient. In some embodiments, the concentration of a metal oxide is non-zero and varies, both along a thickness range from about 0·t to about 0.3·t. In some embodiments, the concentration of the metal oxide is non-zero and varies along a thickness range from about 0·t to about 0.35·t, from about 0·t to about 0.4·t, from about 0·t to about 0.45·t or from about 0·t to about 0.48·t. The metal oxide may be described as generating a stress in the glass-based article. The variation in concentration may be continuous along the above-referenced thickness ranges. Variation in concentration may include a change in metal oxide concentration of about 0.2 mol % along a thickness segment of about 100 micrometers. This change may be measured by known methods in the art including microprobe, as shown in Example 1. The metal oxide that is non-zero in concentration and varies along a portion of the thickness may be described as generating a stress in the glass-based article.

The variation in concentration may be continuous along the above-referenced thickness ranges. In some embodiments, the variation in concentration may be continuous along thickness segments in the range from about 10 micrometers to about 30 micrometers. In some embodiments, the concentration of the metal oxide decreases from the first surface to a point between the first surface and the second surface and increases from the point to the second surface.

The concentration of metal oxide may include more than one metal oxide (e.g., a combination of $Na_2O$ and $K_2O$). In some embodiments, where two metal oxides are utilized and where the radius of the ions differ from one or another, the concentration of ions having a larger radius is greater than the concentration of ions having a smaller radius at shallow depths, while the at deeper depths, the concentration of ions having a smaller radius is greater than the concentration of ions having larger radius. For example, where a single Na- and K- containing bath is used in the ion exchange process, the concentration of K+ ions in the glass-based article is greater than the concentration of Na+ ions at shallower depths, while the concentration of Na+ is greater than the concentration of K+ ions at deeper depths. This is due, in part, due to the size of the ions. In such glass-based articles, the area at or near the surface comprises a greater CS due to the greater amount of larger ions (i.e., K+ ions) at or near the surface. This greater CS may be exhibited by a stress profile having a steeper slope at or near the surface (i.e., a spike in the stress profile at the surface).

The concentration gradient or variation of one or more metal oxides is created by chemically strengthening a glass-based substrate, as previously described herein, in which a plurality of first metal ions in the glass-based substrate is exchanged with a plurality of second metal ions. The first ions may be ions of lithium, sodium, potassium, and rubidium. The second metal ions may be ions of one of sodium, potassium, rubidium, and cesium, with the proviso that the second alkali metal ion has an ionic radius greater than the ionic radius than the first alkali metal ion. The second metal ion is present in the glass-based substrate as an oxide thereof (e.g., $Na_2O$, $K_2O$, $Rb_2O$, $Cs_2O$ or a combination thereof).

In one or more embodiments, the metal oxide concentration gradient extends through a substantial portion of the thickness t or the entire thickness t of the glass-based article, including the CT layer 327. In one or more embodiments, the concentration of the metal oxide is about 0.5 mol % or greater in the CT layer 327. In some embodiments, the concentration of the metal oxide may be about 0.5 mol % or greater (e.g., about 1 mol % or greater) along the entire thickness of the glass-based article, and is greatest at the first surface 302 and/or the second surface 304 and decreases substantially constantly to a point between the first surface 302 and the second surface 304. At that point, the concentration of the metal oxide is the least along the entire thickness t; however the concentration is also non-zero at that point. In other words, the non-zero concentration of that particular metal oxide extends along a substantial portion of the thickness t (as described herein) or the entire thickness t. In some embodiments, the lowest concentration in the particular metal oxide is in the CT layer 327. The total concentration of the particular metal oxide in the glass-based article may be in the range from about 1 mol % to about 20 mol %.

In one or more embodiments, the glass-based article includes a first metal oxide concentration and a second metal oxide concentration, such that the first metal oxide concentration is in the range from about 0 mol % to about 15 mol % along a first thickness range from about 0t to about 0.5t, and the second metal oxide concentration is in the range from about 0 mol % to about 10 mol % from a second thickness range from about 0 micrometers to about 25 micrometers (or from about 0 micrometers to about 12 micrometers); however, the concentration of one or both the first metal oxide and the second metal oxide is non-zero along a substantial portion or the entire thickness of the glass-based article. The glass-based article may include an optional third metal oxide concentration. The first metal oxide may include $Na_2O$ while the second metal oxide may include $K_2O$.

The concentration of the metal oxide may be determined from a baseline amount of the metal oxide in the glass article prior to being modified to include the concentration gradient of such metal oxide.

The glass articles described herein may exhibit a stored tensile energy in the range from greater than 15 J/m$^2$ or greater (e.g., from about 15 J/m$^2$ to about 50 J/m$^2$). For example, in some embodiments, the stored tensile energy may be in the range from about 20 J/m$^2$ to about 150 J/m$^2$. In some instances, the stored tensile energy may be in the range from about 25 J/m$^2$ to about 150 J/m$^2$, from about 30 J/m$^2$ to about 150 J/m$^2$, from about 35 J/m$^2$ to about 150 J/m$^2$, from about 40 J/m$^2$ to about 150 J/m$^2$, from about 45 J/m$^2$ to about 150 J/m$^2$, from about 50 J/m$^2$ to about 150 J/m$^2$, from about 55 J/m$^2$ to about 150 J/m$^2$, from about 60 J/m$^2$ to about 150 J/m$^2$, from about 65 J/m$^2$ to about 150 J/m$^2$, from about 25 J/m$^2$ to about 140 J/m$^2$, from about 25 J/m$^2$ to about 130 J/m$^2$, from about 25 J/m$^2$ to about 120 J/m$^2$, from about 25 J/m$^2$ to about 110 J/m$^2$, from about 30 J/m$^2$ to about 140 J/m$^2$, from about 35 J/m$^2$ to about 130 J/m$^2$, from about 40 J/m$^2$ to about 120 J/m$^2$ or from about 40 J/m$^2$ to about 100 J/m$^2$. The thermally and chemically strengthened glass-based articles of one or more embodiments may exhibit a stored tensile energy of about 40 J/m$^2$ or greater, about 45 J/m$^2$ or greater, about 50 J/m$^2$ or greater, about 60 J/m$^2$ or greater, or about 70 J/m$^2$ or greater.

Stored tensile energy is calculated using the following Equation (2):

$$\text{stored tensile energy}(J/m^2) = [1-v]/E \int \sigma^2 \, dt \quad (2)$$

where v is Poisson's ratio, E is the Young's modulus and the integration is computed for the tensile region only. Equation (2) is described in Suresh T. Gulati, *Frangibility of Tempered Soda-Lime Glass Sheet*, GLASS PROCESSING DAYS, The Fifth International Conference on Architectural and Automotive Glass, 13-15 Sep. 1997, as equation number 4.

The glass articles of some embodiments exhibit superior mechanical performance as demonstrated by device drop testing or component level testing, as compared to known strengthened glass articles. In one or more embodiments, the glass articles exhibit improved surface strength when subjected to abraded ring-on-ring (AROR) testing. The strength of a material is defined as the stress at which fracture occurs. The AROR test is a surface strength measurement for testing flat glass specimens, and ASTM C1499-09(2013), entitled "Standard Test Method for Monotonic Equibiaxial Flexural Strength of Advanced Ceramics at Ambient Temperature," serves as the basis for the ring-on-ring abraded ROR test methodology described herein. The contents of ASTM C1499-09 are incorporated herein by reference in their entirety. In one embodiment, the glass specimen is abraded prior to ring-on-ring testing with 90 grit silicon carbide (SiC) particles that are delivered to the glass sample using the method and apparatus described in Annex A2, entitled "abrasion Procedures," of ASTM C158-02(2012), entitled "Standard Test Methods for Strength of Glass by Flexure (Determination of Modulus of Rupture). The contents of ASTM C158-02 and the contents of Annex 2 in particular are incorporated herein by reference in their entirety.

Prior to ring-on-ring testing a surface of the glass article is abraded as described in ASTM C158-02, Annex 2, to normalize and/or control the surface defect condition of the sample using the apparatus shown in Figure A2.1 of ASTM C158-02. The abrasive material is typically sandblasted onto the surface 110 of the glass article at a load or pressure of 15 psi or greater using an air pressure of 304 kPa (44 psi). In some embodiments, the abrasive material may be sandblasted onto the surface 110 at a load of 20 psi, 25 psi or even 45 psi. After air flow is established, 5 cm$^3$ of abrasive material is dumped into a funnel and the sample is sandblasted for 5 seconds after introduction of the abrasive material.

For the ring-on-ring test, a glass article having at least one abraded surface 112 as shown in FIG. 5 is placed between two concentric rings of differing size to determine equibiaxial flexural strength or failure load (i.e., the maximum stress that a material is capable of sustaining when subjected to flexure between two concentric rings), as also shown in FIG. 5. In the abraded ring-on-ring configuration 10, the abraded glass article 110 is supported by a support ring 120 having a diameter D2. A force F is applied by a load cell (not shown) to the surface of the glass article by a loading ring 130 having a diameter D1.

The ratio of diameters of the loading ring and support ring D1/D2 may be in a range from about 0.2 to about 0.5. In some embodiments, D1/D2 is about 0.5. Loading and support rings 130, 120 should be aligned concentrically to within 0.5% of support ring diameter D2. The load cell used for testing should be accurate to within ±1% at any load within a selected range. In some embodiments, testing is carried out at a temperature of 23±2° C. and a relative humidity of 40±10%.

For fixture design, the radius r of the protruding surface of the loading ring 430, h/2≤r≤3h/2, where his the thickness of glass article 110. Loading and support rings 130, 120 are typically made of hardened steel with hardness HRc>40. ROR fixtures are commercially available.

The intended failure mechanism for the ROR test is to observe fracture of the glass article 110 originating from the surface 130a within the loading ring 130. Failures that occur outside of this region—i.e., between the loading rings 130 and support rings 120—are omitted from data analysis. Due to the thinness and high strength of the glass article 110, however, large deflections that exceed ½ of the specimen thickness h are sometimes observed. It is therefore not uncommon to observe a high percentage of failures originating from underneath the loading ring 130. Stress cannot be accurately calculated without knowledge of stress development both inside and under the ring (collected via strain gauge analysis) and the origin of failure in each specimen. AROR testing therefore focuses on peak load at failure as the measured response.

The strength of glass article depends on the presence of surface flaws. However, the likelihood of a flaw of a given size being present cannot be precisely predicted, as the strength of glass is statistical in nature. A probability distribution can therefore generally be used as a statistical representation of the data obtained.

In some embodiments, the strengthened glass articles described herein exhibits a equibiaxial flexural strength or failure load of 20 kgf or greater and up to about 45 kgf as determined by AROR testing using a load of 25 psi or even 45 psi to abrade the surface. In other embodiments, the surface strength is at least 25 kgf, and in still other embodiments, at least 30 kgf.

In some embodiments, the strengthened glass articles may exhibit improved drop performance. As used herein, the drop performance is evaluated by assembling the glass article to a mobile phone device. In some instances, a number of glass articles may be assembled to identical mobile phone devices and tested identically. The mobile phone device with the glass article assembled thereto is then dropped onto an abrasive paper (which may include $Al_2O_3$ particles or other abradant) for successive drops starting at a height of 50 cm. As each sample survives the drop from a height, the mobile phone device with the sample is dropped again from an increase height until the glass article fracture, at which point the failure height of that sample is recorded as a maximum failure height.

In some embodiments, the glass articles exhibit a maximum failure height of about 100 cm or greater, when having a thickness of about 1 mm. In some embodiments, the glass articles exhibit a maximum failure height of about 120 cm or greater, about 140 cm or greater, about 150 cm or greater, about 160 cm or greater, about 180 cm or greater or about 200 cm or greater, at a thickness of about 1 mm. The glass articles of one or more embodiments exhibit a diced fracture pattern after failing at the failure height. The diced fracture pattern includes exhibiting the aspect ratio described herein.

In one or more embodiments, the glass articles herein exhibit fracture behavior such that, when the glass article is directly bonded to a substrate (i.e. a display unit), after the glass article fractures, 50% or more of the cracks are sub-surface cracks (where cracks extend only partially through the thickness and arrest below surface. For example, in some instances, the cracks may extend partially through the thickness t of the glass article, for example, from 0.05t to 0.95t. The percentage of cracks in the glass article that extend only partially through the thickness t may be 50% greater, 60% or greater, 70% or greater, 80% or greater or 90% or greater.

Figure 6:
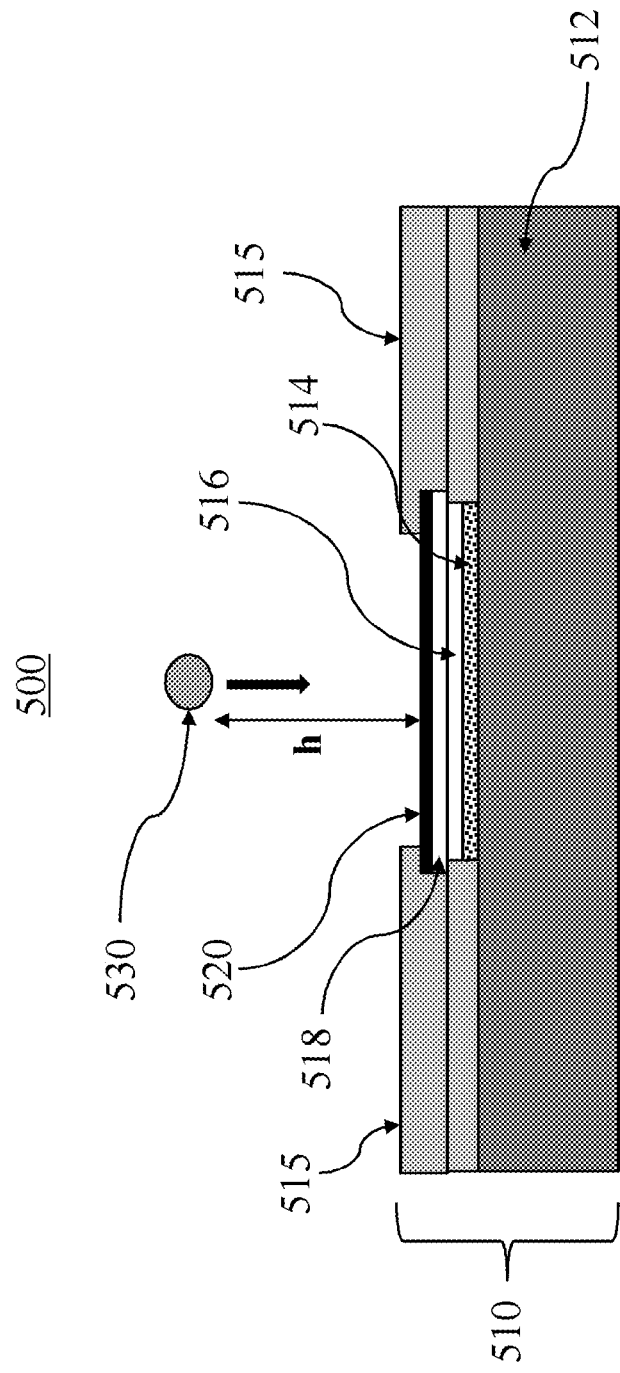
FIG. 6 is a schematic cross-sectional view of an embodiment of the apparatus that is used to perform the inverted ball on sandpaper (IBoS) test described in the present disclosure.
Figure 7:
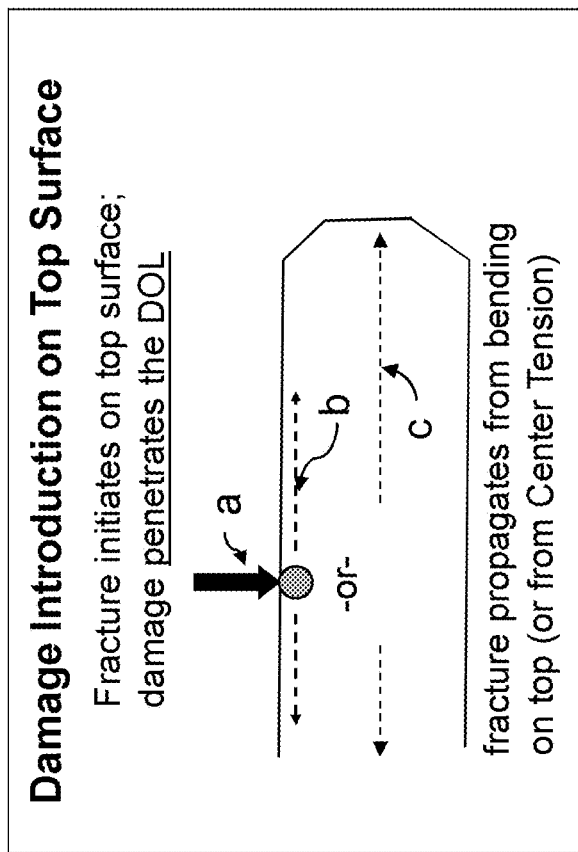
FIG. 7 is a schematic cross-sectional representation of the dominant mechanism for failure due to damage introduction plus bending that typically occurs in glass-based articles that are used in mobile or hand held electronic devices.

In some embodiments, the strengthened glass-based articles described herein may be described in terms of performance in an inverted ball on sandpaper (IBoS) test. The IBoS test is a dynamic component level test that mimics the dominant mechanism for failure due to damage introduction plus bending that typically occurs in glass-based articles that are used in mobile or hand held electronic devices, as schematically shown in FIG. 6. In the field, damage introduction (a in FIG. 7) occurs on the top surface of the glass-based article. Fracture initiates on the top surface of the glass-based article and damage either penetrates the glass-based article (b in FIG. 7) or the fracture propagates from bending on the top surface or from the interior portions of the glass-based article (c in FIG. 7). The IBoS test is designed to simultaneously introduce damage to the surface of the glass and apply bending under dynamic load. In some instances, the glass-based article exhibits improved drop performance when it includes a compressive stress than if the same glass-based article does not include a compressive stress.

An IBoS test apparatus is schematically shown in FIG. 6. Apparatus 500 includes a test stand 510 and a ball 530. Ball 530 is a rigid or solid ball such as, for example, a stainless steel ball, or the like. In one embodiment, ball 530 is a 4.2 gram stainless steel ball having diameter of 10 mm. The ball 530 is dropped directly onto the glass-based article sample 518 from a predetermined height h. Test stand 510 includes a solid base 512 comprising a hard, rigid material such as granite or the like. A sheet 514 having an abrasive material disposed on a surface is placed on the upper surface of the solid base 512 such that surface with the abrasive material faces upward. In some embodiments, sheet 514 is sandpaper having a 30 grit surface and, in other embodiments, a 180 grit surface. The glass-based article sample 518 is held in place above sheet 514 by sample holder 515 such that an air gap 516 exists between glass-based article sample 518 and sheet 514. The air gap 516 between sheet 514 and glass-based article sample 518 allows the glass-based article sample 518 to bend upon impact by ball 530 and onto the abrasive surface of sheet 514. In one embodiment, the glass-based article sample 218 is clamped across all corners to keep bending contained only to the point of ball impact and to ensure repeatability. In some embodiments, sample holder 514 and test stand 510 are adapted to accommodate sample thicknesses of up to about 2 mm. The air gap 516 is in a range from about 50 μm to about 100 μm. Air gap 516 is adapted to adjust for difference of material stiffness (Young's modulus, Emod), but also includes the Young's modulus and thickness of the sample. An adhesive tape 520 may be used to cover the upper surface of the glass-based article sample to collect fragments in the event of fracture of the glass-based article sample 518 upon impact of ball 530.

Various materials may be used as the abrasive surface. In a one particular embodiment, the abrasive surface is sandpaper, such as silicon carbide or alumina sandpaper, engineered sandpaper, or any abrasive material known to those skilled in the art for having comparable hardness and/or sharpness. In some embodiments, sandpaper having 30 grit may be used, as it has a surface topography that is more consistent than either concrete or asphalt, and a particle size and sharpness that produces the desired level of specimen surface damage.

Figure 8:
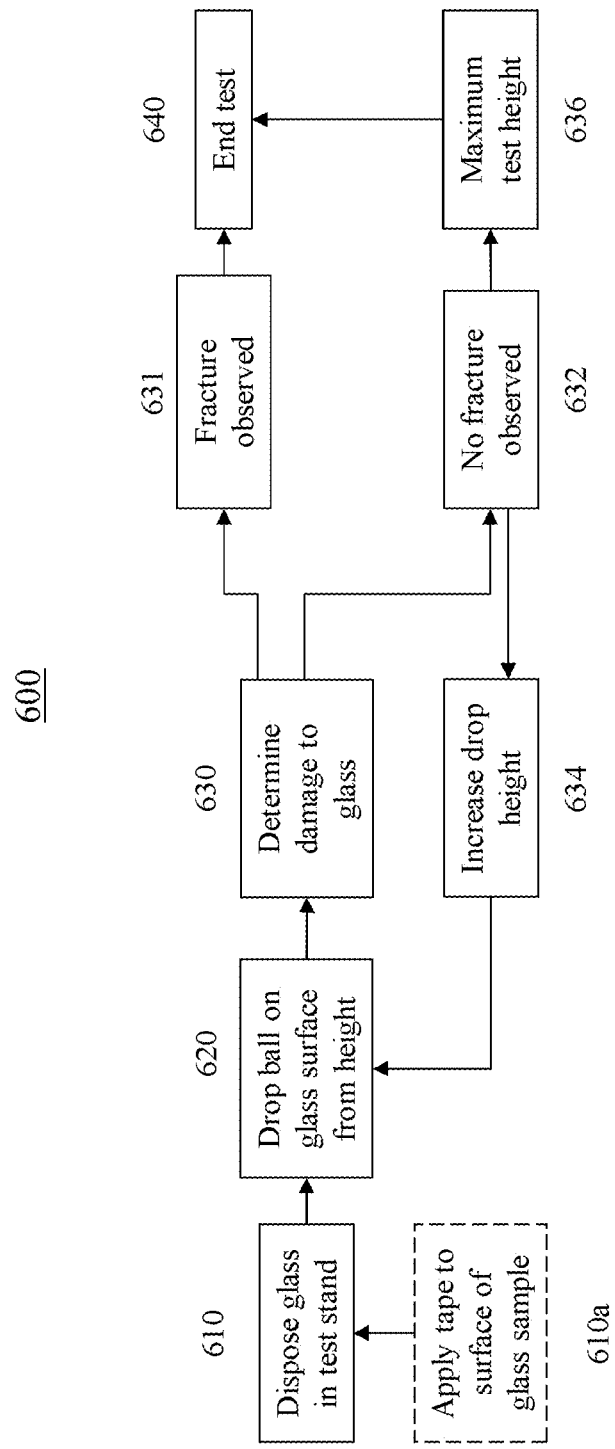
FIG. 8 is a flow chart for a method of conducting the IBoS test in the apparatus described herein.

In one aspect, a method 600 of conducting the IBoS test using the apparatus 500 described hereinabove is shown in FIG. 8. In Step 610, a glass-based article sample (218 in FIG. 6) is placed in the test stand 510, described previously and secured in sample holder 515 such that an air gap 516 is formed between the glass-based article sample 518 and sheet 514 with an abrasive surface. Method 600 presumes that the sheet 514 with an abrasive surface has already been placed in test stand 510. In some embodiments, however, the method may include placing sheet 514 in test stand 510 such that the surface with abrasive material faces upward. In some embodiments (Step 610*a*), an adhesive tape 520 is applied to the upper surface of the glass-based article sample 518 prior to securing the glass-based article sample 518 in the sample holder 510.

In Step 520, a solid ball 530 of predetermined mass and size is dropped from a predetermined height h onto the upper surface of the glass-based article sample 518, such that the ball 530 impacts the upper surface (or adhesive tape 520 affixed to the upper surface) at approximately the center (i.e., within 1 mm, or within 3 mm, or within 5 mm, or within 10 mm of the center) of the upper surface. Following impact in Step 520, the extent of damage to the glass-based article sample 518 is determined (Step 630). As previously described hereinabove, herein, the term "fracture" means that a crack propagates across the entire thickness and/or entire surface of a substrate when the substrate is dropped or impacted by an object.

In method 600, the sheet 518 with the abrasive surface may be replaced after each drop to avoid "aging" effects that have been observed in repeated use of other types (e.g., concrete or asphalt) of drop test surfaces.

Various predetermined drop heights h and increments are typically used in method 600. The test may, for example, utilize a minimum drop height to start (e.g., about 10-20 cm). The height may then be increased for successive drops by either a set increment or variable increments. The test described in method 600 is stopped once the glass-based article sample 518 breaks or fractures (Step 631). Alternatively, if the drop height h reaches the maximum drop height (e.g., about 100 cm) without fracture, the drop test of method 300 may also be stopped, or Step 520 may be repeated at the maximum height until fracture occurs.

In some embodiments, IBoS test of method 600 is performed only once on each glass-based article sample 518 at each predetermined height h. In other embodiments, however, each sample may be subjected to multiple tests at each height.

If fracture of the glass-based article sample 518 has occurred (Step 631 in FIG. 7), the IBoS test according to method 600 is ended (Step 640). If no fracture resulting from the ball drop at the predetermined drop height is observed (Step 632), the drop height is increased by a predetermined increment (Step 634)—such as, for example 5, 10, or 20 cm—and Steps 620 and 630 are repeated until either sample fracture is observed (631) or the maximum test height is reached (636) without sample fracture. When either Step 631 or 636 is reached, the test according to method 600 is ended.

When subjected to the inverted ball on sandpaper (IBoS) test described above, embodiments of the glass-based article described herein have at least about a 60% survival rate when the ball is dropped onto the surface of the glass from a height of 100 cm. For example, a glass-based article is described as having a 60% survival rate when dropped from a given height when three of five identical (or nearly identical) samples (i.e., having approximately the same composition and, when strengthened, approximately the same compressive stress and depth of compression or compressive stress layer, as described herein) survive the IBoS drop test without fracture when dropped from the prescribed height (here 100 cm). In other embodiments, the survival rate in the 100 cm IBoS test of the glass-based articles that are strengthened is at least about 70%, in other embodiments, at least about 80%, and, in still other embodiments, at least about 90%. In other embodiments, the survival rate of the strengthened glass-based articles dropped from a height of 100 cm in the IBoS test is at least about 60%, in other embodiments, at least about 70%, in still other embodiments, at least about 80%, and, in other embodiments, at least about 90%. In one or more embodiments, the survival rate of the strengthened glass-based articles dropped from a height of 150 cm in the IBoS test is at least about 60%, in other embodiments, at least about 70%, in still other embodiments, at least about 80%, and, in other embodiments, at least about 90%.

To determine the survivability rate of the glass-based articles when dropped from a predetermined height using the IBoS test method and apparatus described hereinabove, at least five identical (or nearly identical) samples (i.e., having approximately the same composition and, if strengthened, approximately the same compressive stress and depth of compression or layer) of the glass-based articles are tested, although larger numbers (e.g., 10, 20, 30, etc.) of samples may be subjected to testing to raise the confidence level of the test results. Each sample is dropped a single time from the predetermined height (e.g., 100 cm or 150 cm) or, alternatively, dropped from progressively higher heights without fracture until the predetermined height is reached, and visually (i.e., with the naked eye) examined for evidence of fracture (crack formation and propagation across the entire thickness and/or entire surface of a sample). A sample is deemed to have "survived" the drop test if no fracture is observed after being dropped from the predetermined height, and a sample is deemed to have "failed (or "not survived") if fracture is observed when the sample is dropped from a height that is less than or equal to the predetermined height. The survivability rate is determined to be the percentage of the sample population that survived the drop test. For example, if 7 samples out of a group of 10 did not fracture when dropped from the predetermined height, the survivability rate of the glass would be 70%.

In one or more embodiments, the glass articles exhibit a lower delayed fracture rate (i.e., the glass articles, when fractured, fracture quickly or even immediately). In some embodiments, this fracture rate may be attributed to the deep DOC and high level of CT.

Specifically, there is a lower probability that the glass article will break spontaneously, well after the insult to the glass article that induces fracture or failure occurs. In one or more embodiments, when the glass article fractures, it fractures into a plurality of fragments within 2 seconds or 1 second or less after impact measured by the "Frangibility Test", as described Z. Tang, et al. Automated Apparatus for Measuring the Frangibility and Fragmentation of Strengthened Glass. Experimental Mechanics (2014) 54:903-912. The Frangibility Test utilizes a drop height of the stylus of 50 mm and a stylus with a tungsten carbide tip (available from Fisher Scientific Industries, under the trademark TOSCO® and manufacturer identifying number #13-378, with a 60 degree coni-spherical tip), having a weight of 40 g. In some embodiments, a primary fracture (or the first fracture visible to the naked eye that creates 2 fragments) occurs immediately or within zero seconds or 0.1 seconds after an impact that causes the glass article to fracture. In one or more embodiments, the probability of the primary fracture occurring within the time periods described herein, as measured by the Frangibility Test, is about 90% or greater In some embodiments, secondary fracture(s) occur within 5 seconds or less (e.g., 4 seconds or less, 3 seconds or less, 2 seconds or less or about 1 second or less). As used herein, "secondary fracture" means a fracture that occurs after the primary fracture. In one or more embodiments, the probability of the secondary fracture(s) occurring within the time periods described herein, as measured by the Frangibility Test, is about 90% or greater.

In one or more embodiments, upon fracturing, the glass article ejects fewer and smaller fragments that are of potential concern to a user than is exhibited by known glass articles currently being used on mobile electronic devices. As used herein, the term "ejects" or "ejected" refers to fragments that move from their original position or placement in the glass article after the glass article is fractured. In some embodiments, after the glass article is fractured and a plurality of fragments is formed, about 10% or less (e.g., about 8% or less, about 6% or less, or about 5% or less) of the plurality of fragments is ejected. In some embodiments, after the glass article is fractured and a plurality of fragments is formed, about 50% of more of the ejected portion of the plurality of fragments has a maximum dimension less than 0.5 mm. In some embodiments, the number or amount of ejected fragments may be characterized by weight, in relation to the glass article before and after fracture. For example, the difference between the weight of the glass article prior to fracture (including the total weight of the ejected portion of the plurality of fragments and the non-ejected portion of fragments, after fracture) and the weight of the non-ejected portion of fragments, may be less than about 1% or less of the weight prior to impact. In some instances, difference between the weight of the glass article prior to fracture (including the total weight of the ejected portion of the plurality of fragments and the non-ejected portion of fragments, after fracture) and the weight of the non-ejected portion of fragments, may be less than about 0.0005 g (e.g., 0.0004 g or less, 0.0003 g or less, 0.0002 g or less, or 0.0001 g or less). To determine the weight of the non-ejected portion.

In one or more embodiments, the glass article exhibits a high degree of dicing in a more uniform pattern across the surface and volume thereof. In some embodiments, this high degree of dicing and uniformity is exhibited where the glass article has a non-uniform thickness (i.e., is shaped to have a three-dimensional or 2.5 dimensional shape). Without being bound by theory, this enables the thinnest portion of the glass article to be strengthened to a sufficient degree, without having some portions of the glass article exhibiting frangibility while other portions are non-frangible, as defined by current industry norms.

In one or more embodiments, the glass article (directly bonded to the substrate, i.e., a display unit) exhibits a haze after being fractured, due to the dense fracture pattern. The readability of depends on viewing angle and the thickness of the glass-based article. At a viewing angle of 90 degrees to a major surface of the glass article or at normal incidence, the fractured glass article exhibits a low haze such that an underlying image or text is visible to the naked eye. At a viewing angle of 70 degrees or less to a major surface of the glass article (or 30 degrees or more away from normal incidence), the fractured glass article exhibits a haze that prevents the underlying image or text from being visible to the naked eye. It should be understood that such haze is present when the fragments of the glass article are still held together or when less than 10% of the fragments are ejected from the glass article. Without being bound by theory, it is believed that the glass article after fracture may provide privacy screen functionality due to its low haze at 90 degrees and the high haze at smaller viewing angles.

In some embodiments, at least one major surface of the glass article has a low surface roughness after the glass article is fractured. This attribute is desirable where the glass article may be used or touched by a user even after the glass article is fractured so that cuts and abrasions to the user are minimized or eliminated.

In one or more embodiments, the glass articles described herein may be combined with a containment layer. The containment layer is a material that can contain the fragments of the glass article, when fractured. For example, the containment layer may include a polymeric material. In one or more embodiments, the containment layer may include an adhesive material (such as a pressure-sensitive adhesive material). In one or more embodiments, the containment layer may have a Young's modulus in the range from about 0.5 to about 1.2 MPa. In one or more embodiments, the containment layer may include a filled epoxy, an unfilled epoxy, a filled urethane or an unfilled urethane.

An example of a filled epoxy includes a UV induced catiltic epoxy from the polymerization product of 70.69 wt % Nanopox C620 colloidal silica sol (40% silica nanoparticles in cycloaliphatic epoxy resin), 23.56 wt % Nanopox C680 (50% wt silica nanoparticles in 3-ethyl-3-hydroxymethyl-oxetane), 3 wt % Coatosil MP-200 epoxy functional silane (adhesion promoter), 2.5 wt % Cyracril UVI-6976 (cationic photoinitiator, inculding triarylsulfonium hexa-flouroantimonate salts in propylene carbonate), 0.25 wt % Tinuvine 292 amine stabilizer (bis(1,2,2,6,6-pentamethyl-4-piperidinyl)-sebacate and 1-(methyl)-8-(1,2,2,6,6-pentamethyl-4-piperidinyl)-sebacate), An example of an unfilled epoxy material includes 48 wt % Synasia S06E cycloaliphatic epoxy, 48 wt % Synasia S-101 (3-ethyl-3-oxetanemethanol), 1 wt % UVI-6976 (cationic photoinitiator), and 3 wt % Silquest A-186 (epoxy functionalized silane).

In some embodiments, a low modulus urethane acrylate can be used in the containment layer. In some embodiments, this material may include silica filling. An example of a low modulus urethane acrylate includes 31.5 wt % Doublemer 554 (aliphatic urethane diacrylate resin), 1.5 wt % Genomer 4188/M22 (monofunctional urethane acrylate), 20 wt % NK Ester A-SA (beta-acryloyl oxyethyl hydrogen succinate), 10 wt % Sartomer SR339 2 (phenoxyethyl acrylate), 4 wt % Irgacure 2022 (photoinitiator, acyl phosphine oxide/alpha hydroxy ketone), 3 wt % adhesion promoter (e.g., Silquest A-189, gamma-mercaptopropyltrimethoxysilane). To form a filled urethane, 4 wt % silica powder (such as Hi Sil 233) may be added.

In one or more embodiments, the glass article may be combined with a containment layer with or without being adhered thereto. In some embodiments, the glass articles may be disposed on and adhered to a containment layer. The glass article may be temporarily adhered or permanently adhered to a containment layer. As shown in FIG. 9A, the containment layer 20 is disposed on at least one major surface (e.g., 12, 14, in FIG. 1A) of the glass article. In FIG. 9A, the containment layer 20 is not disposed on any portion of the minor surfaces 16, 18; however, the containment layer 20 may extend from the major surface to at least partially along one or both minor surfaces (16, 18) or along the entire length of one or both minor surfaces (16, 18). In such embodiments, the containment layer may be formed from the same material. In one or more alternative embodiments, the containment layer formed on the major surface may be different from the containment layer formed on any portion of the minor surface(s). FIG. 9B illustrates an embodiment in which the containment layer 20 is disposed on the major surface 14 and a second containment layer 22 is disposed on both minor surfaces 16, 18. In one or more embodiment, the containment layer 20 differs compositionally from the second containment layer 22.

In one or more embodiments, the glass article may include a stress profile including a spike, as described herein, such that the surface CS is in the range from about 400 MPa to about 1200 MPa and includes an containment material 20 on one major surface 14, and a second containment material 22 on both minor surfaces 16, 18 (as shown in FIG. 9B). In one or more embodiments, the glass article may include a stress profile without a spike, such that the surface CS is in the range from about 150 MPa to about 500 MPa, and includes only containment material 20 on major surface 14 (as shown in FIG. 9A).

The glass articles described herein may be incorporated into various products and articles such as in consumer electronics products or devices (e.g., cover glass for mobile electronic devices and touch-enabled displays). The glass articles may also be used in displays (or as display articles) (e.g., billboards, point of sale systems, computers, navigation systems, and the like), architectural articles (walls, fixtures, panels, windows, etc.), transportation articles (e.g., in automotive applications, trains, aircraft, sea craft, etc.), appliances (e.g., washers, dryers, dishwashers, refrigerators and the like), packaging (e.g., pharmaceutical packaging or containers) or any article that requires some fracture resistance.

Figure 10:
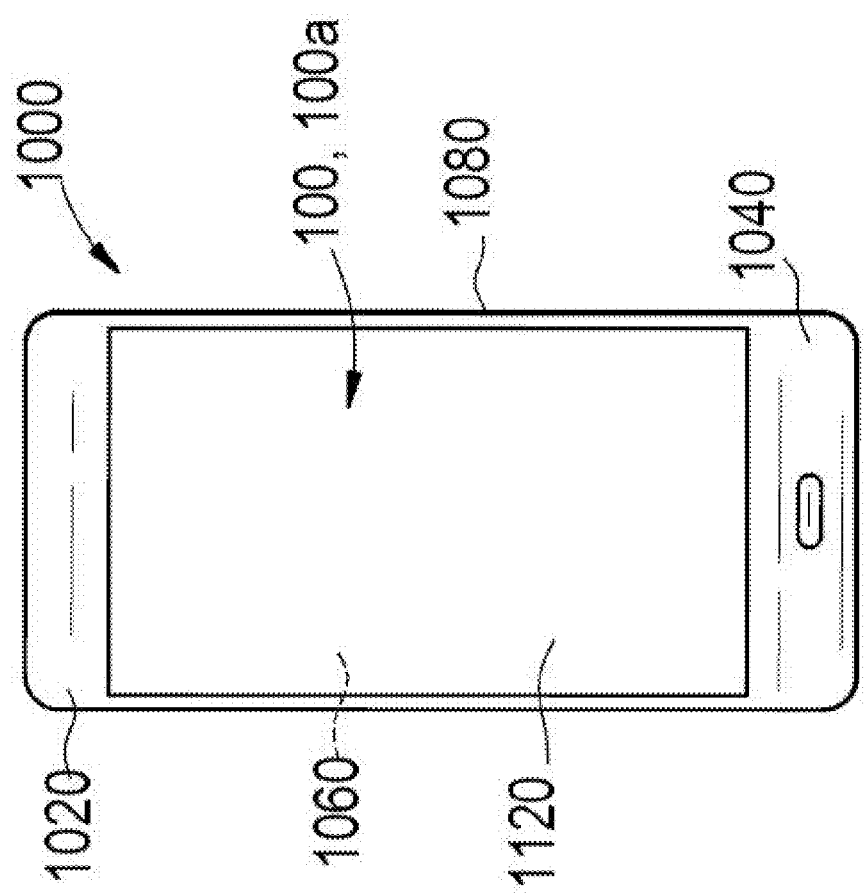
FIG. 10 is a front plan view of an electronic device incorporating one or more embodiments of the glass articles described herein.

As shown in FIG. 10, an electronic device 1000 may include a glass-based article 100 according to one or more embodiments described herein. The device 100 includes a housing 1020 having front 1040, back 1060, and side surfaces 1080; electrical components (not shown) that are at least partially inside or entirely within the housing and including at least a controller, a memory, and a display 1120 at or adjacent to the front surface of the housing. The glass-based article 100 is shown as a cover disposed at or over the front surface of the housing such that it is over the display 1120. In some embodiments, the glass-based article may be used as a back cover.

In some embodiments, the electronic device may include a tablet, a transparent display, a mobile phone, a video player, an information terminal device, an e-reader, a laptop computer, or a non-transparent display.

In one or more embodiments, the glass articles described herein may be used in packaging. For example, the packaging may include glass articles in the form of bottles, vials or containers that hold a liquid, solid or gas material. In one or more embodiments, the glass articles are vials that include chemicals such as pharmaceutical materials. In one or more embodiments, the packaging includes a housing including an opening, an exterior surface and an interior surface defining an enclosure. The housing may be formed from the glass articles described herein. The glass article includes a containment layer. In some embodiments, the enclosure is filled with a chemical or pharmaceutical material. In one or more embodiments, the opening of the housing may be closed or sealed by a cap. In other words, the cap may be disposed in the opening to close or seal the enclosure.

The glass article may include an amorphous substrate, a crystalline substrate or a combination thereof (e.g., a glass-ceramic substrate). The glass article may include an alkali aluminosilicate glass, alkali containing borosilicate glass, alkali aluminophosphosilicate glass or alkali aluminoborosilicate glass. In one or more embodiments, the glass article substrate (prior to being chemically strengthened as described herein) may include a glass having a composition, in mole percent (mole %), including: SiO2 in the range from about 40 to about 80, $Al_2O_3$ in the range from about 10 to about 30, $B_2O_3$ in the range from about 0 to about 10, $R_2O$ in the range from about 0 to about 20, and RO in the range from about 0 to about 15. In some instances, the composition may include either one or both of $ZrO_2$ in the range from about 0 mol % to about 5 mol % and $P_2O_5$ in the range from about 0 to about 15 mol %. $TiO_2$ can be present from about 0 mol % to about 2 mol %.

In some embodiments, the glass composition may include SiO2 in an amount, in mol %, in the range from about 45 to about 80, from about 45 to about 75, from about 45 to about 70, from about 45 to about 65, from about 45 to about 60, from about 45 to about 65, from about 45 to about 65, from about 50 to about 70, from about 55 to about 70, from about 60 to about 70, from about 70 to about 75, or from about 50 to about 65.

In some embodiments, the glass composition may include $Al_2O_3$ in an amount, in mol %, in the range from about 5 to about 28, from about 5 to about 26, from about 5 to about 25, from about 5 to about 24, from about 5 to about 22, from about 5 to about 20, from about 6 to about 30, from about 8 to about 30, from about 10 to about 30, from about 12 to about 30, from about 14 to about 30, from about 16 to about 30, from about 18 to about 30, or from about 18 to about 28.

In one or more embodiments, the glass composition may include $B_2O_3$ in an amount, in mol %, in the range from about 0 to about 8, from about 0 to about 6, from about 0 to about 4, from about 0.1 to about 8, from about 0.1 to about 6, from about 0.1 to about 4, from about 1 to about 10, from about 2 to about 10, from about 4 to about 10, from about 2 to about 8, from about 0.1 to about 5, or from about 1 to about 3. In some instances, the glass composition may be substantially free of $B_2O_3$. As used herein, the phrase "substantially free" with respect to the components of the composition means that the component is not actively or intentionally added to the composition during initial batching, but may be present as an impurity in an amount less than about 0.001 mol %.

In some embodiments, the glass composition may include one or more alkali earth metal oxides, such as MgO, CaO and ZnO. In some embodiments, the total amount of the one or more alkali earth metal oxides may be a non-zero amount up to about 15 mol %. In one or more specific embodiments, the total amount of any of the alkali earth metal oxides may be a non-zero amount up to about 14 mol %, up to about 12 mol %, up to about 10 mol %, up to about 8 mol %, up to about 6 mol %, up to about 4 mol %, up to about 2 mol %, or up about 1.5 mol %. In some embodiments, the total amount, in mol %, of the one or more alkali earth metal oxides may be in the range from about 0.1 to 10, from about 0.1 to 8, from about 0.1 to 6, from about 0.1 to 5, from about 1 to 10, from about 2 to 10, or from about 2.5 to 8. The amount of MgO may be in the range from about 0 mol % to about 5 mol % (e.g., from about 2 mol % to about 4 mol %). The amount of ZnO may be in the range from about 0 to about 2 mol %. The amount of CaO may be from about 0 mol % to about 2 mol %. In one or more embodiments, the glass composition may include MgO and may be substantially free of CaO and ZnO. In one variant, the glass composition may include any one of CaO or ZnO and may be substantially free of the others of MgO, CaO and ZnO. In one or more specific embodiments, the glass composition may include only two of the alkali earth metal oxides of MgO, CaO and ZnO and may be substantially free of the third of the earth metal oxides.

The total amount, in mol %, of alkali metal oxides $R_2O$ in the glass composition may be in the range from about 5 to about 20, from about 5 to about 18, from about 5 to about 16, from about 5 to about 15, from about 5 to about 14, from about 5 to about 12, from about 5 to about 10, from about 5 to about 8, from about 5 to about 20, from about 6 to about 20, from about 7 to about 20, from about 8 to about 20, from about 9 to about 20, from about 10 to about 20, from about 6 to about 13, or from about 8 to about 12.

In one or more embodiments, the glass composition includes $Na_2O$ in an amount in the range from about 0 mol % to about 18 mol %, from about 0 mol % to about 16 mol % or from about 0 mol % to about 14 mol %, from about 0 mol % to about 10 mol %, from about 0 mol % to about 5 mol %, from about 0 mol % to about 2 mol %, from about 0.1 mol % to about 6 mol %, from about 0.1 mol % to about 5 mol %, from about 1 mol % to about 5 mol %, from about 2 mol % to about 5 mol %, or from about 10 mol % to about 20 mol %.

In some embodiments, the amount of $Li_2O$ and $Na_2O$ is controlled to a specific amount or ratio to balance formability and ion exchangeability. For example, as the amount of $Li_2O$ increases, the liquidus viscosity may be reduced, thus preventing some forming methods from being used; however, such glass compositions are ion exchanged to deeper DOC levels, as described herein. The amount of $Na_2O$ can modify liquidus viscosity but can inhibit ion exchange to deeper DOC levels.

In one or more embodiments, the glass composition may include $K_2O$ in an amount less than about 5 mol %, less than about 4 mol %, less than about 3 mol %, less than about 2 mol %, or less than about 1 mol %. In one or more alternative embodiments, the glass composition may be substantially free, as defined herein, of $K_2O$.

In one or more embodiments, the glass composition may include $Li_2O$ in an amount about 0 mol % to about 18 mol %, from about 0 mol % to about 15 mol % or from about 0 mol % to about 10 mol %, from about 0 mol % to about 8 mol %, from about 0 mol % to about 6 mol %, from about 0 mol % to about 4 mol % or from about 0 mol % to about 2 mol %. In some embodiments, the glass composition may include $Li_2O$ in an amount about 2 mol % to about 10 mol %, from about 4 mol % to about 10 mol %, from about 6 mol % to about 10 mol, or from about 5 mol % to about 8 mol %. In one or more alternative embodiments, the glass composition may be substantially free, as defined herein, of $Li_2O$.

In one or more embodiments, the glass composition may include $Fe_2O_3$. In such embodiments, $Fe_2O_3$ may be present in an amount less than about 1 mol %, less than about 0.9 mol %, less than about 0.8 mol %, less than about 0.7 mol %, less than about 0.6 mol %, less than about 0.5 mol %, less than about 0.4 mol %, less than about 0.3 mol %, less than about 0.2 mol %, less than about 0.1 mol % and all ranges and sub-ranges therebetween. In one or more alternative embodiments, the glass composition may be substantially free, as defined herein, of $Fe_2O_3$.

In one or more embodiments, the glass composition may include $ZrO_2$. In such embodiments, $ZrO_2$ may be present in an amount less than about 1 mol %, less than about 0.9 mol %, less than about 0.8 mol %, less than about 0.7 mol %, less than about 0.6 mol %, less than about 0.5 mol %, less than about 0.4 mol %, less than about 0.3 mol %, less than about 0.2 mol %, less than about 0.1 mol % and all ranges and sub-ranges therebetween. In one or more alternative embodiments, the glass composition may be substantially free, as defined herein, of $ZrO_2$.

In one or more embodiments, the glass composition may include $P_2O_5$ in a range from about 0 mol % to about 10 mol %, from about 0 mol % to about 8 mol %, from about 0 mol % to about 6 mol %, from about 0 mol % to about 4 mol %, from about 0.1 mol % to about 10 mol %, from about 0.1 mol % to about 8 mol %, from about 4 mol % to about 8 mol %, or from about 5 mol % to about 8 mol %. In some instances, the glass composition may be substantially free of $P_2O_5$.

In one or more embodiments, the glass composition may include $TiO_2$. In such embodiments, $TiO_2$ may be present in an amount less than about 6 mol %, less than about 4 mol %, less than about 2 mol %, or less than about 1 mol %. In one or more alternative embodiments, the glass composition may be substantially free, as defined herein, of $TiO_2$. In some embodiments, $TiO_2$ is present in an amount in the range from about 0.1 mol % to about 6 mol %, or from about 0.1 mol % to about 4 mol %. In some embodiments, the glass may be substantially free of $TiO_2$.

In some embodiments, the glass composition may include various compositional relationships. For example, the glass composition may include a ratio of the amount of $Li_2O$ (in mol %) to the total amount of $R_2O$ (in mol %) in the range from about 0.5 to about 1. In some embodiments, the glass composition may include a difference between the total amount of $R_2O$ (in mol %) to the amount of $Al_2O_3$ (in mol %) in the range from about −5 to about 0. In some instances the glass composition may include a difference between the total amount of $R_xO$ (in mol %) and the amount of $Al_2O_3$ in the range from about 0 to about 3. The glass composition of one or more embodiments may exhibit a ratio of the amount of MgO (in mol %) to the total amount of RO (in mol %) in the range from about 0 to about 2.

In some embodiments, the compositions used for the glass substrate may be batched with 0-2 mol % of at least one fining agent selected from a group that includes $Na_2SO_4$, NaCl, NaF, NaBr, $K_2SO_4$, KCl, KF, KBr, and $SnO_2$. The glass composition according to one or more embodiments may further include $SnO_2$ in the range from about 0 to about 2, from about 0 to about 1, from about 0.1 to about 2, from about 0.1 to about 1, or from about 1 to about 2. The glass compositions disclosed herein may be substantially free of $As_2O_3$ and/or $Sb_2O_3$.

In one or more embodiments, the composition may specifically include 62 mol % to 75 mol % SiO2; 10.5 mol % to about 17 mol % $Al_2O_3$; 5 mol % to about 13 mol % $Li_2O$; 0 mol % to about 4 mol % ZnO; 0 mol % to about 8 mol % MgO; 2 mol % to about 5 mol % $TiO_2$; 0 mol % to about 4 mol % $B_2O_3$; 0 mol % to about 5 mol % $Na_2O$; 0 mol % to about 4 mol % $K_2O$; 0 mol % to about 2 mol % $ZrO_2$; 0 mol % to about 7 mol % $P_2O_5$; 0 mol % to about 0.3 mol % $Fe_2O_3$; 0 mol % to about 2 mol % MnOx; and 0.05 mol % to about 0.2 mol % $SnO_2$.

In one or more embodiments, the composition may include 67 mol % to about 74 mol % SiO2; 11 mol % to about 15 mol % $Al_2O_3$; 5.5 mol % to about 9 mol % $Li_2O$; 0.5 mol % to about 2 mol % ZnO; 2 mol % to about 4.5 mol % MgO; 3 mol % to about 4.5 mol % $TiO_2$; 0 mol % to about 2.2 mol % $B_2O_3$; 0 mol % to about 1 mol % $Na_2O$; 0 mol % to about 1 mol % $K_2O$; 0 mol % to about 1 mol % $ZrO_2$; 0 mol % to about 4 mol % $P_2O_5$; 0 mol % to about 0.1 mol % $Fe_2O_3$; 0 mol % to about 1.5 mol % MnOx; and 0.08 mol % to about 0.16 mol % $SnO_2$.

In one or more embodiments, the composition may include 70 mol % to 75 mol % SiO2; 10 mol % to about 15 mol % $Al_2O_3$; 5 mol % to about 13 mol % $Li_2O$; 0 mol % to about 4 mol % ZnO; 0.1 mol % to about 8 mol % MgO; 0 mol % to about 5 mol % $TiO_2$; 0.1 mol % to about 4 mol % $B_2O_3$; 0.1 mol % to about 5 mol % $Na_2O$; 0 mol % to about 4 mol % $K_2O$; 0 mol % to about 2 mol % $ZrO_2$; 0 mol % to about 7 mol % $P_2O_5$; 0 mol % to about 0.3 mol % $Fe_2O_3$; 0 mol % to about 2 mol % MnOx; and 0.05 mol % to about 0.2 mol % $SnO_2$.

In one or more embodiments, the composition may include 52 mol % to about 63 mol % SiO2; 11 mol % to about 15 mol % $Al_2O_3$; 5.5 mol % to about 9 mol % $Li_2O$; 0.5 mol % to about 2 mol % ZnO; 2 mol % to about 4.5 mol % MgO; 3 mol % to about 4.5 mol % $TiO_2$; 0 mol % to about 2.2 mol % $B_2O_3$; 0 mol % to about 1 mol % $Na_2O$; 0 mol % to about 1 mol % $K_2O$; 0 mol % to about 1 mol % $ZrO_2$; 0 mol % to about 4 mol % $P_2O_5$; 0 mol % to about 0.1 mol % $Fe_2O_3$; 0 mol % to about 1.5 mol % MnOx; and 0.08 mol % to about 0.16 mol % $SnO_2$.

In some embodiments, the composition may be substantially free of any one or more of $B_2O_3$, $TiO_2$, $K_2O$ and $ZrO_2$.

In one or more embodiments, the composition may include at least 0.5 mol % $P_2O_5$, $Na_2O$ and, optionally, $Li_2O$, where $Li_2O$(mol %)/$Na_2O$(mol %)<1. In addition, these compositions may be substantially free of $B_2O_3$ and $K_2O$. In some embodiments, the composition may include ZnO, MgO, and $SnO_2$.

In some embodiments, the composition may comprise: from about 58 mol % to about 65 mol % $SiO_2$; from about 11 mol % to about 19 mol % $Al_2O_3$; from about 0.5 mol % to about 3 mol % $P_2O_5$; from about 6 mol % to about 18 mol % $Na_2O$; from 0 mol % to about 6 mol % MgO; and from 0 mol % to about 6 mol % ZnO. In certain embodiments, the composition may comprise from about 63 mol % to about 65 mol % $SiO_2$; from 11 mol % to about 17 mol % $Al_2O_3$; from about 1 mol % to about 3 mol % $P_2O_5$; from about 9 mol % to about 20 mol % $Na_2O$; from 0 mol % to about 6 mol % MgO; and from 0 mol % to about 6 mol % ZnO.

In some embodiments, the composition may include the following compositional relationships $R_2O$ (mol %)/$Al_2O_3$ (mol %)<2, where $R_2O=Li_2O+Na_2O$. In some embodiments, 65 mol %<$SiO_2$(mol %)+$P_2O_5$ (mol %)<67 mol %. In certain embodiments, $R_2O$ (mol %)+R'O(mol %)−$Al_2O_3$ (mol %)+$P_2O_5$ (mol %)>−3 mol %, where $R_2O=Li_2O+Na_2O$ and R'O is the total amount of divalent metal oxides present in the composition.

Other exemplary compositions of glass articles prior to being chemically strengthened, as described herein, are shown in Table 1.

TABLE 1

Exemplary compositions prior to chemical strengthening.

| Mol % | Ex. A | Ex. B | Ex. C | Ex. D | Ex. E | Ex. F |
|---|---|---|---|---|---|---|
| $SiO_2$ | 71.8 | 69.8 | 69.8 | 69.8 | 69.8 | 69.8 |
| $Al_2O_3$ | 13.1 | 13 | 13 | 13 | 13 | 13 |
| $B_2O_3$ | 2 | 2.5 | 4 | 2.5 | 2.5 | 4 |
| $Li_2O$ | 8 | 8.5 | 8 | 8.5 | 8.5 | 8 |
| MgO | 3 | 3.5 | 3 | 3.5 | 1.5 | 1.5 |
| ZnO | 1.8 | 2.3 | 1.8 | 2.3 | 2.3 | 1.8 |
| $Na_2O$ | 0.4 | 0.4 | 0.4 | 0.4 | 0.4 | 0.4 |
| $TiO_2$ | 0 | 0 | 0 | 1 | 1 | 1 |
| $Fe_2O_3$ | 0 | 0 | 0 | 0.8 | 0.8 | 0.8 |
| $SnO_2$ | 0.1 | 0.1 | 0.1 | 0.1 | 0.1 | 0.1 |

| Mol % | Ex. G | Ex. H | Ex. I | Ex. J | Ex. K | Ex. L | Ex. M | Ex. N |
|---|---|---|---|---|---|---|---|---|
| $SiO_2$ | 70.18 | 70.91 | 71.28 | 71.65 | 71.65 | 71.65 | 74.77 | 72.00 |
| $Al_2O_3$ | 12.50 | 12.78 | 12.93 | 13.07 | 13.07 | 13.07 | 10.00 | 12.50 |
| $B_2O_3$ | 1.91 | 1.95 | 1.98 | 2.00 | 2.00 | 2.00 | 1.99 | 2.00 |
| $Li_2O$ | 7.91 | 7.95 | 7.96 | 7.98 | 6.98 | 5.00 | 6.13 | 6.00 |
| $Na_2O$ | 4.43 | 2.43 | 1.42 | 0.41 | 1.41 | 3.40 | 3.97 | 0.50 |
| MgO | 2.97 | 2.98 | 2.99 | 3.00 | 3.00 | 3.00 | 2.94 | 2.10 |
| ZnO | 0.00 | 0.89 | 1.34 | 1.80 | 1.80 | 1.80 | 0.00 | 0.00 |
| CaO | 0.00 | 0.00 | 0.00 | 0.00 | 0.00 | 0.00 | 0.05 | 4.90 |
| $SnO_2$ | 0.10 | 0.10 | 0.10 | 0.10 | 0.10 | 0.10 | 0.10 | 0.10 |
| $Li_2O/R_2O$ | 0.64 | 0.77 | 0.85 | 0.95 | 0.83 | 0.60 | 0.61 | 0.92 |
| $R_2O-Al_2O_3$ | −0.16 | −2.41 | −3.54 | −4.68 | −4.68 | −4.67 | 0.10 | −6.00 |
| $R_xO-Al_2O_3$ | 2.81 | 1.47 | 0.79 | 0.12 | 0.12 | 0.13 | 3.09 | 1.00 |
| MgO/RO | 1.00 | 0.77 | 0.69 | 0.63 | 0.63 | 0.63 | 1.00 | 1.00 |
| $R_2O$ | 12.34 | 10.38 | 9.39 | 8.39 | 8.39 | 8.40 | 10.10 | 6.50 |
| RO | 2.97 | 3.88 | 4.34 | 4.79 | 4.79 | 4.79 | 2.99 | 7.00 |

Other exemplary compositions of glass-based articles prior to being chemically strengthened, as described herein, are shown in Table 1A. Table 1B lists selected physical properties determined for the examples listed in Table 1A. The physical properties listed in Table 1B include: density; low temperature and high temperature CTE; strain, anneal and softening points; $10^{11}$ Poise, 35 kP, 200 kP, liquidus, and zircon breakdown temperatures; zircon breakdown and liquidus viscosities; Poisson's ratio; Young's modulus; refractive index, and stress optical coefficient. In some embodiments, the glass-based articles and glass substrates described herein have a high temperature CTE of less than or equal to 30 ppm/° C. and/or a Young's modulus of at least 70 GPa and, in some embodiments, a Young's modulus of up to 80 GPa.

TABLE 1A

Exemplary compositions prior to chemical strengthening.

| Composition (mol %) | Ex. 1 | Ex. 2 | Ex. 3 | Ex. 4 | Ex. 5 | Ex. 6 | Ex. 7 |
|---|---|---|---|---|---|---|---|
| $SiO_2$ | 63.77 | 64.03 | 63.67 | 63.91 | 64.16 | 63.21 | 63.50 |
| $Al_2O_3$ | 12.44 | 12.44 | 11.83 | 11.94 | 11.94 | 11.57 | 11.73 |
| $P_2O_5$ | 2.43 | 2.29 | 2.36 | 2.38 | 1.92 | 1.93 | 1.93 |
| $Li_2O$ | 0.00 | 0.00 | 0.00 | 0.00 | 0.00 | 0.00 | 0.00 |
| $Na_2O$ | 16.80 | 16.81 | 16.88 | 16.78 | 16.80 | 17.63 | 16.85 |
| ZnO | 0.00 | 4.37 | 0.00 | 4.93 | 0.00 | 5.59 | 5.93 |
| MgO | 4.52 | 0.02 | 5.21 | 0.02 | 5.13 | 0.02 | 0.01 |
| $SnO_2$ | 0.05 | 0.05 | 0.05 | 0.05 | 0.05 | 0.05 | 0.05 |
| $R_2O/Al_2O_3$ | 1.35 | 1.35 | 1.43 | 1.41 | 1.41 | 1.52 | 1.44 |
| $Li_2O/Na_2O$ | 0.00 | 0.00 | 0.00 | 0.00 | 0.00 | 0.00 | 0.00 |
| $(R_2O + RO) - Al_2O_3 - P_2O_5$ | 6.45 | 6.46 | 7.89 | 7.40 | 8.07 | 9.74 | 9.14 |

| Composition (mol %) | Ex. 8 | Ex. 9 | Ex. 10 | Ex. 11 | Ex. 12 | Ex. 13 | Ex. 14 |
|---|---|---|---|---|---|---|---|
| $SiO_2$ | 63.37 | 63.43 | 63.56 | 63.58 | 63.66 | 63.62 | 63.67 |
| $Al_2O_3$ | 11.72 | 12.49 | 12.63 | 12.59 | 12.91 | 12.85 | 12.89 |
| $P_2O_5$ | 2.00 | 2.32 | 2.46 | 2.46 | 2.43 | 2.45 | 2.47 |
| $Li_2O$ | 0.00 | 0.00 | 1.42 | 2.87 | 0.00 | 1.42 | 2.92 |
| $Na_2O$ | 16.84 | 17.16 | 15.45 | 14.04 | 16.89 | 15.48 | 13.92 |
| ZnO | 6.00 | 4.54 | 4.43 | 4.41 | 4.04 | 4.12 | 4.06 |
| MgO | 0.02 | 0.02 | 0.02 | 0.02 | 0.02 | 0.02 | 0.02 |
| $SnO_2$ | 0.05 | 0.04 | 0.05 | 0.05 | 0.05 | 0.05 | 0.05 |
| $R_2O/Al_2O_3$ | 1.44 | 1.37 | 1.34 | 1.34 | 1.31 | 1.31 | 1.31 |
| $Li_2O/Na_2O$ | 0.00 | 0.00 | 0.09 | 0.20 | 0.00 | 0.09 | 0.21 |
| $(R_2O + RO) - Al_2O_3 - P_2O_5$ | 9.14 | 6.90 | 6.22 | 6.29 | 5.62 | 5.72 | 5.57 |

| Composition (mol %) | Ex. 15 | Ex. 16 | Ex. 17 | Ex. 18 | Ex. 19 | Ex. 20 | Ex. 21 |
|---|---|---|---|---|---|---|---|
| $SiO_2$ | 63.55 | 63.80 | 63.76 | 63.88 | 63.74 | 64.03 | 63.68 |
| $Al_2O_3$ | 12.92 | 12.90 | 12.95 | 13.48 | 13.37 | 13.26 | 13.19 |
| $P_2O_5$ | 2.35 | 2.34 | 2.37 | 2.31 | 2.34 | 2.29 | 2.46 |
| $Li_2O$ | 0.00 | 1.47 | 2.94 | 0.00 | 1.48 | 2.94 | 0.00 |
| $Na_2O$ | 17.97 | 16.36 | 14.85 | 17.20 | 15.96 | 14.37 | 16.84 |
| ZnO | 0.00 | 0.00 | 0.00 | 0.00 | 0.00 | 0.00 | 3.77 |
| MgO | 3.17 | 3.08 | 3.09 | 3.08 | 3.08 | 3.06 | 0.02 |
| $SnO_2$ | 0.05 | 0.04 | 0.05 | 0.05 | 0.04 | 0.04 | 0.05 |
| $R_2O/Al_2O_3$ | 1.39 | 1.38 | 1.37 | 1.28 | 1.30 | 1.31 | 1.28 |
| $Li_2O/Na_2O$ | 0.00 | 0.09 | 0.20 | 0.00 | 0.09 | 0.20 | 0.00 |
| $(R_2O + RO) - Al_2O_3 - P_2O_5$ | 5.87 | 5.67 | 5.56 | 4.48 | 4.81 | 4.83 | 4.98 |

| Composition (mol %) | Ex. 22 | Ex. 23 | Ex. 24 | Ex. 25 | Ex. 26 | Ex. 27 | Ex. 28 |
|---|---|---|---|---|---|---|---|
| $SiO_2$ | 63.66 | 63.76 | 63.67 | 63.73 | 63.73 | 63.64 | 63.76 |
| $Al_2O_3$ | 14.15 | 15.31 | 13.87 | 14.82 | 12.93 | 16.62 | 16.59 |
| $P_2O_5$ | 2.47 | 2.44 | 2.47 | 2.43 | 2.48 | 2.47 | 2.47 |
| $Li_2O$ | 1.49 | 2.98 | 1.50 | 2.96 | 0.00 | 2.52 | 4.91 |
| $Na_2O$ | 15.31 | 13.79 | 15.36 | 13.93 | 16.83 | 14.68 | 12.20 |
| ZnO | 2.85 | 1.64 | 0.00 | 0.00 | 2.98 | 0.00 | 0.00 |
| MgO | 0.03 | 0.03 | 3.09 | 2.08 | 1.00 | 0.03 | 0.03 |
| $SnO_2$ | 0.05 | 0.04 | 0.05 | 0.05 | 0.05 | 0.05 | 0.05 |
| $R_2O/Al_2O_3$ | 1.19 | 1.10 | 1.22 | 1.14 | 1.30 | 1.03 | 1.03 |
| $Li_2O/Na_2O$ | 0.10 | 0.22 | 0.10 | 0.21 | 0.00 | 0.17 | 0.40 |
| $(R_2O + RO) - Al_2O_3 - P_2O_5$ | 3.05 | 0.70 | 3.61 | 1.72 | 5.40 | −1.86 | −1.92 |

| Composition (mol %) | Ex. 29 | Ex. 30 | Ex. 31 | Ex. 32 | Ex. 33 | Ex. 34 | Ex. 35 |
|---|---|---|---|---|---|---|---|
| $SiO_2$ | 63.89 | 63.92 | 63.77 | 63.73 | 63.70 | 63.65 | 63.87 |
| $Al_2O_3$ | 16.55 | 15.29 | 15.27 | 15.30 | 15.27 | 15.22 | 15.29 |
| $P_2O_5$ | 2.47 | 2.24 | 2.31 | 2.39 | 2.40 | 2.48 | 2.37 |
| $Li_2O$ | 7.27 | 3.46 | 2.98 | 4.02 | 4.46 | 4.96 | 5.39 |
| $Na_2O$ | 9.74 | 13.46 | 13.99 | 12.91 | 12.51 | 11.99 | 11.44 |
| ZnO | 0.00 | 1.56 | 1.61 | 1.57 | 1.58 | 1.63 | 1.57 |
| MgO | 0.03 | 0.02 | 0.02 | 0.03 | 0.03 | 0.02 | 0.02 |
| $SnO_2$ | 0.04 | 0.04 | 0.04 | 0.05 | 0.04 | 0.05 | 0.04 |
| $R_2O/Al_2O_3$ | 1.03 | 1.11 | 1.11 | 1.11 | 1.11 | 1.11 | 1.10 |

TABLE 1A-continued

Exemplary compositions prior to chemical strengthening.

| | | | | | | | |
|---|---|---|---|---|---|---|---|
| $Li_2O/Na_2O$ | 0.75 | 0.26 | 0.21 | 0.31 | 0.36 | 0.41 | 0.47 |
| $(R_2O + RO) - Al_2O_3 - P_2O_5$ | −1.98 | 0.97 | 1.01 | 0.84 | 0.90 | 0.91 | 0.76 |

| Composition (mol %) | Ex. 36 | Ex. 37 | Ex. 38 | Ex. 39 | Ex. 40 | Ex. 41 | Ex. 42 |
|---|---|---|---|---|---|---|---|
| $SiO_2$ | 63.69 | 63.75 | 63.70 | 63.62 | 63.74 | 63.77 | 63.77 |
| $Al_2O_3$ | 15.26 | 15.30 | 15.27 | 15.23 | 15.27 | 15.27 | 15.33 |
| $P_2O_5$ | 2.45 | 2.42 | 2.45 | 2.46 | 2.47 | 2.46 | 2.44 |
| $Li_2O$ | 2.96 | 2.98 | 3.94 | 3.98 | 4.93 | 4.93 | 2.91 |
| $Na_2O$ | 13.50 | 13.46 | 12.54 | 12.57 | 11.49 | 11.50 | 13.94 |
| ZnO | 2.06 | 2.01 | 2.03 | 2.06 | 2.03 | 2.00 | 0.00 |
| MgO | 0.02 | 0.03 | 0.02 | 0.03 | 0.03 | 0.03 | 1.57 |
| $SnO_2$ | 0.05 | 0.04 | 0.04 | 0.05 | 0.04 | 0.05 | 0.04 |
| $R_2O/Al_2O_3$ | 1.08 | 1.08 | 1.08 | 1.09 | 1.08 | 1.08 | 1.10 |
| $Li_2O/Na_2O$ | 0.22 | 0.22 | 0.31 | 0.32 | 0.43 | 0.43 | 0.21 |
| $(R_2O + RO) - Al_2O_3 - P_2O_5$ | 0.83 | 0.77 | 0.80 | 0.95 | 0.73 | 0.73 | 0.66 |

| Composition (mol %) | Ex. 43 | Ex. 44 | Ex. 45 | Ex. 46 | Ex. 47 | Ex. 48 | Ex. 49 |
|---|---|---|---|---|---|---|---|
| $SiO_2$ | 63.69 | 63.81 | 63.65 | 63.71 | 63.62 | 63.65 | 63.62 |
| $Al_2O_3$ | 15.25 | 15.26 | 15.33 | 15.32 | 15.24 | 15.68 | 15.67 |
| $P_2O_5$ | 2.43 | 2.41 | 2.46 | 2.44 | 2.47 | 2.44 | 2.48 |
| $Li_2O$ | 4.00 | 4.89 | 2.96 | 4.01 | 4.91 | 6.07 | 6.06 |
| $Na_2O$ | 13.01 | 12.03 | 13.29 | 12.25 | 11.42 | 10.93 | 10.53 |
| ZnO | 0.00 | 0.00 | 2.24 | 2.20 | 2.27 | 1.17 | 1.57 |
| MgO | 1.57 | 1.56 | 0.03 | 0.03 | 0.02 | 0.02 | 0.02 |
| SnO2 | 0.05 | 0.04 | 0.05 | 0.04 | 0.05 | 0.04 | 0.05 |
| $R_2O/Al_2O_3$ | 1.12 | 1.11 | 1.06 | 1.06 | 1.07 | 1.08 | 1.06 |
| $Li_2O/Na_2O$ | 0.31 | 0.41 | 0.22 | 0.33 | 0.43 | 0.56 | 0.58 |
| $(R_2O + RO) - Al_2O_3 - P_2O_5$ | 0.90 | 0.81 | 0.73 | 0.73 | 0.91 | 0.08 | 0.04 |

| Composition (mol %) | Ex. 50 | Ex. 51 | Ex. 52 | Ex. 53 | Ex. 54 | Ex. 55 | Ex. 56 |
|---|---|---|---|---|---|---|---|
| $SiO_2$ | 63.60 | 63.89 | 63.84 | 63.90 | 63.88 | 64.74 | 60.17 |
| $Al_2O_3$ | 15.65 | 16.09 | 16.47 | 16.87 | 16.97 | 15.25 | 18.58 |
| $P_2O_5$ | 2.46 | 2.42 | 2.43 | 2.43 | 2.42 | 0.98 | 1.90 |
| $Li_2O$ | 6.13 | 6.80 | 7.84 | 8.75 | 9.78 | 5.28 | 5.16 |
| $Na_2O$ | 10.29 | 9.97 | 8.96 | 7.99 | 6.88 | 12.09 | 12.58 |
| ZnO | 1.81 | 0.78 | 0.39 | 0.00 | 0.00 | 1.61 | 1.55 |
| MgO | 0.02 | 0.02 | 0.02 | 0.02 | 0.02 | 0.02 | 0.02 |
| $SnO_2$ | 0.04 | 0.04 | 0.04 | 0.04 | 0.04 | 0.03 | 0.03 |
| $R_2O/Al_2O_3$ | 1.05 | 1.04 | 1.02 | 0.99 | 0.98 | 1.14 | 0.96 |
| $Li_2O/Na_2O$ | 0.60 | 0.68 | 0.87 | 1.10 | 1.42 | 0.44 | 0.41 |
| $(R_2O + RO) - Al_2O_3 - P_2O_5$ | 0.14 | −0.94 | −1.68 | −2.54 | −2.70 | 2.78 | −1.16 |

| Composition (mol %) | Ex. 57 | Ex. 58 | Ex. 59 | Ex. 60 | Ex. 61 | Ex. 62 | Ex. 63 | Ex. 64 |
|---|---|---|---|---|---|---|---|---|
| $SiO_2$ | 58.32 | 63.3 | 63.3 | 63.3 | 63.3 | 63.3 | 63.3 | 63.46 |
| $Al_2O_3$ | 18.95 | 15.25 | 15.65 | 16.2 | 15.1 | 15.425 | 15.7 | 15.71 |
| $P_2O_5$ | 2.42 | 2.5 | 2.5 | 2.5 | 2.5 | 2.5 | 2.5 | 2.45 |
| $Li_2O$ | 4.96 | 6 | 7 | 7.5 | 6 | 7 | 7.5 | 6.37 |
| $Na_2O$ | 13.74 | 10.7 | 9.7 | 9.45 | 10.55 | 9.475 | 8.95 | 10.69 |
| ZnO | 1.56 | 1.2 | 0.8 | 0 | 2.5 | 2.25 | 2 | 1.15 |
| MgO | 0.02 | 1 | 1 | 1 | 0 | 0 | 0 | 0.06 |
| $SnO_2$ | 0.03 | 0.05 | 0.05 | 0.05 | 0.05 | 0.05 | 0.05 | 0.04 |
| $R_2O/Al_2O_3$ | 0.99 | 1.10 | 1.07 | 1.05 | 1.10 | 1.07 | 1.05 | 1.09 |
| $Li_2O/Na_2O$ | 0.36 | 0.56 | 0.72 | 0.79 | 0.57 | 0.74 | 0.84 | 0.6 |
| $(R_2O + RO) - Al_2O_3 - P_2O_5$ | −1.09 | 1.15 | 0.35 | −0.75 | 1.45 | 0.80 | 0.25 | −1.1 |

TABLE 1B

Selected physical properties of the glasses listed in Table 1B.

|  | Ex. 1 | Ex. 2 | Ex. 3 | Ex. 4 | Ex. 5 | Ex. 6 | Ex. 7 |
|---|---|---|---|---|---|---|---|
| Density (g/cm$^3$) | 2.434 | 2.493 | 2.434 | 2.504 | 2.44 | 2.514 | 2.519 |
| Low temperature CTE 25-300° C. (ppm/° C.) | 8.9 | 8.62 | 8.95 | 8.6 | 8.82 | 8.71 | 8.54 |
| High temperature CTE (ppm/° C.) | 17.67 | 19.1 | 17.16 | 21 | 18.12 | 20 | 20.11 |
| Strain pt. (° C.) | 630 | 591 | 612 | 580 | 605 | 580 | 589 |
| Anneal pt. (° C.) | 683 | 641 | 662 | 628 | 651 | 629 | 639 |
| $10^{11}$ Poise temperature (° C.) | 770 | 725 | 748 | 710 | 734 | 711 | 721 |
| Softening pt. (° C.) | 937 | 888 | 919 | 873 | 909 | 868 | 874 |
| $T^{35\ kP}$ (° C.) |  |  |  | 1167 | 1180 | 1158 | 1160 |
| $T^{200\ kP}$ (° C.) |  |  |  | 1070 | 1083 | 1061 | 1064 |
| Zircon breakdown temperature (° C.) |  | 1205 |  | 1220 | 1170 | 1185 | 1205 |
| Zircon breakdown viscosity (P) |  |  |  | $1.56 \times 10^4$ | $4.15 \times 10^4$ | $2.29 \times 10^4$ | $1.74 \times 10^4$ |
| Liquidus temperature (° C.) |  | 980 |  | 990 | 975 | 990 | 1000 |
| Liquidus viscosity (P) |  |  |  | $1.15 \times 10^6$ | $2.17 \times 10^6$ | $9.39 \times 10^5$ | $7.92 \times 10^5$ |
| Poisson's ratio | 0.200 | 0.211 | 0.206 | 0.214 | 0.204 | 0.209 | 0.211 |
| Young's modulus (GPa) | 69.2 | 68.8 | 69.4 | 68.5 | 69.6 | 68.3 | 69.0 |
| Refractive index at 589.3 nm | 1.4976 | 1.5025 | 1.4981 | 1.5029 | 1.4992 | 1.5052 | 1.506 |
| Stress optical coefficient (nm/mm/MPa) | 2.963 | 3.158 | 3.013 | 3.198 | 2.97 | 3.185 | 3.234 |

|  | Ex. 8 | Ex. 9 | Ex. 10 | Ex. 11 | Ex. 12 | Ex. 13 | Ex. 14 |
|---|---|---|---|---|---|---|---|
| Density (g/cm$^3$) | 2.516 | 2.501 | 2.498 | 2.493 | 2.493 | 2.492 | 2.486 |
| Low temperature CTE 25-300° C. (ppm/° C.) | 8.35 | 8.67 | 8.87 | 8.49 | 8.65 | 8.71 | 8.49 |
| High temperature CTE (ppm/° C.) | 20.11 | 20.6 | 20.94 |  | 19.52 | 20.77 |  |
| Strain pt. (° C.) | 590 | 589 | 591 | 584 | 600 | 579 | 588 |
| Anneal pt. (° C.) | 641 | 639 | 640 | 628 | 652 | 620 | 630 |
| $10^{11}$ Poise temperature (° C.) | 726 | 724 | 720 | 704 | 738 | 695 | 704 |
| Softening pt. (° C.) | 888 | 890 | 865 | 857 | 900 | 867 | 860 |
| $T^{35\ kP}$ (° C.) | 1170 | 1176 | 1159 | 1139 | 1197 | 1169 |  |
| $T^{200\ kP}$ (° C.) | 1073 | 1080 | 1061 | 1041 | 1099 | 1070 |  |
| Zircon breakdown temperature (° C.) | 1195 | 1195 | 1210 | 1225 | 1195 | 1195 | 1220 |
| Zircon breakdown viscosity (P) | $2.33 \times 10^4$ | $2.58 \times 10^4$ | $1.60 \times 10^4$ | $9.94 \times 10^3$ | $3.63 \times 10^4$ | $2.35 \times 10^4$ |  |
| Liquidus temperature (° C.) | 1005 | 990 | 990 | 980 | 990 | 980 | 980 |
| Liquidus viscosity (P) | $8.69 \times 10^4$ | 1.48E+06 | 9.02E+05 | 7.10E+05 | 2.19E+06 | 1.33E+06 |  |
| Poisson's ratio | 0.211 | 0.205 | 0.208 | 0.209 | 0.209 | 0.210 | 0.217 |
| Young's modulus (GPa) | 69.0 | 68.7 | 71.4 | 73.5 | 68.4 | 71.6 | 74.0 |
| Refractive index at 589.3 nm | 1.506 | 1.5036 | 1.505 | 1.5063 | 1.5026 | 1.5041 | 1.5052 |
| Stress optical coefficient (nm/mm/MPa) | 3.234 | 3.194 | 3.157 | 3.131 | 3.18 | 3.156 | 3.131 |

TABLE 1B-continued

Selected physical properties of the glasses listed in Table 1B.

| | Ex. 15 | Ex. 16 | Ex. 17 | Ex. 18 | Ex. 19 | Ex. 20 | Ex. 21 |
|---|---|---|---|---|---|---|---|
| Density (g/cm$^3$) | 2.433 | 2.429 | 2.426 | 2.431 | 2.428 | 2.433 | 2.486 |
| Low temperature CTE 25-300° C. (ppm/° C.) | 9.15 | 9.16 | 8.83 | 8.97 | 8.97 | 8.79 | 8.45 |
| High temperature CTE (ppm/° C.) | 20 | 20 | 21 | 17.3 | 20 | | |
| Strain pt. (° C.) | 615 | 606 | 599 | 633 | 616 | 611 | 602 |
| Anneal pt. (° C.) | 662 | 659 | 653 | 684 | 670 | 665 | 653 |
| $10^{11}$ Poise temperature (° C.) | 747 | 745 | 741 | 771 | 758 | 751 | 739 |
| Softening pt. (° C.) | 935 | 903 | 901 | 943 | 918 | 905 | 910 |
| T$^{35\ kP}$ (° C.) | 1182 | 1166 | 1152 | 1221 | 1185 | 1167 | 1207 |
| T$^{200\ kP}$ (° C.) | 1083 | 1066 | 1051 | 1122 | 1084 | 1066 | 1108 |
| Zircon breakdown temperature (° C.) | | | | | | | |
| Zircon breakdown viscosity (P) | | | | | | | |
| Liquidus temperature (° C.) | | | | | | | |
| Liquidus viscosity (P) | | | | | | | |
| Poisson's ratio | 0.203 | 0.207 | 0.205 | 0.209 | 0.199 | | 0.207 |
| Young's modulus (GPa) | 68.9 | 71.2 | 72.7 | 69.4 | 70.9 | | 68.1 |
| Refractive index at 589.3 nm | 1.4964 | 1.4981 | 1.4991 | 1.4965 | 1.4984 | 1.5006 | 1.5019 |
| Stress optical coefficient (nm/mm/MPa) | 2.994 | 3.022 | 2.982 | 2.979 | 2.99 | 0 | 3.173 |

| | Ex. 22 | Ex. 23 | Ex. 24 | Ex. 25 | Ex. 26 | Ex. 27 | Ex. 28 |
|---|---|---|---|---|---|---|---|
| Density (g/cm$^3$) | 2.468 | 2.448 | 2.434 | 2.428 | 2.47 | 2.419 | 2.414 |
| Low temperature CTE 25-300° C. (ppm/° C.) | 8.6 | 8.23 | 8.91 | 8.25 | 8.66 | 8.52 | 8.17 |
| High temperature CTE (ppm/° C.) | 19.52 | | 19.49 | | | | 19.47 |
| Strain pt. (° C.) | 596 | 595 | 638 | 616 | 608 | 640 | 620 |
| Anneal pt. (° C.) | 644 | 649 | 695 | 656 | 654 | 700 | 677 |
| $10^{11}$ Poise temperature (° C.) | 728 | 741 | 785 | 732 | 736 | 798 | 771 |
| Softening pt. (° C.) | 905 | 922 | 941 | 925 | 911 | 978 | 946 |
| T$^{35\ kP}$ (° C.) | 1217 | 1227 | 1209 | 1215 | 1209 | 1283 | 1249 |
| T$^{200\ kP}$ (° C.) | 1115 | 1125 | 1109 | 1115 | 1107 | 1184 | 1150 |
| Zircon breakdown temperature (° C.) | 1185 | 1185 | 1180 | 1185 | | | 1185 |
| Zircon breakdown viscosity (P) | 5.86E+04 | 6.91E+04 | 5.59E+04 | 5.72E+04 | | | 1.05E+05 |
| Liquidus temperature (° C.) | 975 | 980 | 1080 | 1025 | | | 940 |
| Liquidus viscosity (P) | 4.14E+06 | 4.52E+06 | 3.56E+05 | 1.27E+06 | | | 2.92E+07 |
| Poisson's ratio | 0.210 | | 0.204 | 0.210 | 0.212 | | 0.213 |
| Young's modulus (GPa) | 71.4 | | 71.6 | 73.5 | 68.8 | | 76.9 |
| Refractive index at 589.3 nm | 1.502 | 1.5025 | 1.4996 | 1.5008 | 1.5006 | 1.4987 | 1.5014 |
| Stress optical coefficient (nm/mm/MPa) | 3.123 | 3.03 | 3.001 | 3.021 | 3.148 | 3.039 | 3.015 |

TABLE 1B-continued

Selected physical properties of the glasses listed in Table 1B.

| | Ex. 29 | Ex. 30 | Ex. 31 | Ex. 32 | Ex. 33 | Ex. 34 | Ex. 35 |
|---|---|---|---|---|---|---|---|
| Density (g/cm$^3$) | 2.408 | 2.446 | 2.448 | 2.446 | 2.445 | 2.443 | 2.442 |
| Low temperature CTE 25-300° C. (ppm/° C.) | 7.86 | 8.29 | 8.38 | 8.17 | 8.14 | 8.04 | 7.97 |
| High temperature CTE (ppm/° C.) | 18.57 | | | | | 19.71 | |
| Strain pt. (° C.) | 610 | 591 | 595 | 585 | 580 | 574 | 577 |
| Anneal pt. (° C.) | 665 | 645 | 649 | 638 | 633 | 627 | 629 |
| $10^{11}$ Poise temperature (° C.) | 755 | 736 | 740 | 726 | 722 | 717 | 717 |
| Softening pt. (° C.) | 924 | 915 | 919 | 894 | 894 | 895 | 890 |
| $T^{35\,kP}$ (° C.) | 1216 | 1223 | 1227 | 1216 | 1210 | 1203 | 1196 |
| $T^{200\,kP}$ (° C.) | 1120 | 1122 | 1126 | 1114 | 1108 | 1102 | 1095 |
| Zircon breakdown temperature (° C.) | 1210 | 1175 | 1180 | 1190 | 1195 | 1210 | 1205 |
| Zircon breakdown viscosity (P) | 3.86E+04 | 7.72E+04 | 7.55E+04 | 5.29E+04 | 4.43E+04 | 3.14E+04 | 3.04E+04 |
| Liquidus temperature (° C.) | 1080 | 990 | 975 | 975 | 975 | 975 | 980 |
| Liquidus viscosity (P) | 4.55E+05 | 3.28E+06 | 5.43E+06 | 3.80E+06 | 3.33E+06 | 3.02E+06 | 2.29E+06 |
| Poisson's ratio | 0.211 | 0.206 | 0.202 | 0.21 | 0.204 | 0.204 | 0.203 |
| Young's modulus (GPa) | 75.0 | 73.91 | 73.02 | 74.60 | 74.67 | 75.15 | 75.43 |
| Refractive index at 589.3 nm | 1.5053 | 1.503 | 1.5025 | 1.5035 | 1.5041 | 1.5046 | 1.5053 |
| Stress optical coefficient (nm/mm/MPa) | 3.002 | 3.074 | 3.083 | 3.071 | 3.059 | 3.016 | 3.053 |

| | Ex. 29 | Ex. 30 | Ex. 31 | Ex. 32 | Ex. 33 | Ex. 34 | Ex. 35 |
|---|---|---|---|---|---|---|---|
| Density (g/cm$^3$) | 2.408 | 2.446 | 2.448 | 2.446 | 2.445 | 2.443 | 2.442 |
| Low temperature CTE 25-300° C. (ppm/° C.) | 7.86 | 8.29 | 8.38 | 8.17 | 8.14 | 8.04 | 7.97 |
| High temperature CTE (ppm/° C.) | 18.57 | | | | | 19.71 | |
| Strain pt. (° C.) | 610 | 591 | 595 | 585 | 580 | 574 | 577 |
| Anneal pt. (° C.) | 665 | 645 | 649 | 638 | 633 | 627 | 629 |
| $10^{11}$ Poise temperature (° C.) | 755 | 736 | 740 | 726 | 722 | 717 | 717 |
| Softening pt. (° C.) | 924 | 915 | 919 | 894 | 894 | 895 | 890 |
| $T^{35\,kP}$ (° C.) | 1216 | 1223 | 1227 | 1216 | 1210 | 1203 | 1196 |
| $T^{200\,kP}$ (° C.) | 1120 | 1122 | 1126 | 1114 | 1108 | 1102 | 1095 |
| Zircon breakdown temperature (° C.) | 1210 | 1175 | 1180 | 1190 | 1195 | 1210 | 1205 |
| Zircon breakdown viscosity (P) | 3.86E+04 | 7.72E+04 | 7.55E+04 | 5.29E+04 | 4.43E+04 | 3.14E+04 | 3.04E+04 |
| Liquidus temperature (° C.) | 1080 | 990 | 975 | 975 | 975 | 975 | 980 |
| Liquidus viscosity (P) | 4.55E+05 | 3.28E+06 | 5.43E+06 | 3.80E+06 | 3.33E+06 | 3.02E+06 | 2.29E+06 |
| Poisson's ratio | 0.211 | 0.206 | 0.202 | 0.21 | 0.204 | 0.204 | 0.203 |
| Young's modulus (GPa) | 75.0 | 73.91 | 73.02 | 74.60 | 74.67 | 75.15 | 75.43 |
| Refractive index at 589.3 nm | 1.5053 | 1.503 | 1.5025 | 1.5035 | 1.5041 | 1.5046 | 1.5053 |
| Stress optical coefficient (nm/mm/MPa) | 3.002 | 3.074 | 3.083 | 3.071 | 3.059 | 3.016 | 3.053 |

TABLE 1B-continued

Selected physical properties of the glasses listed in Table 1B.

| | Ex. 36 | Ex. 37 | Ex. 38 | Ex. 39 | Ex. 40 | Ex. 41 | Ex. 42 |
|---|---|---|---|---|---|---|---|
| Density (g/cm$^3$) | 2.453 | 2.453 | 2.452 | 2.451 | 2.449 | 2.449 | 2.425 |
| Low temperature CTE 25-300° C. (ppm/° C.) | 8.17 | 8.14 | 7.97 | 8.01 | 7.79 | 7.9 | 8.54 |
| High temperature CTE (ppm/° C.) | | | | | 20.56 | | |
| Strain pt. (° C.) | 595 | 595 | 584 | 587 | 578 | 584 | 617 |
| Anneal pt. (° C.) | 649 | 649 | 638 | 640 | 630 | 637 | 663 |
| $10^{11}$ Poise temperature (° C.) | 740 | 741 | 729 | 730 | 718 | 726 | 746 |
| Softening pt. (° C.) | 918 | 921 | 905 | 907 | 894 | 901 | 929 |
| $T^{35\,kP}$ (° C.) | 1229 | 1232 | 1212 | 1219 | 1200 | 1204 | 1232 |
| $T^{200\,kP}$ (° C.) | 1128 | 1131 | 1111 | 1118 | 1100 | 1103 | 1132 |
| Zircon breakdown temperature (° C.) | 1185 | | 1200 | | 1210 | | |
| Zircon breakdown viscosity (P) | 7.20E+04 | | 4.26E+04 | | 3.00E+04 | | |
| Liquidus temperature (° C.) | 995 | | 990 | | 965 | | |
| Liquidus viscosity (P) | 3.33E+06 | | 2.51E+06 | | 3.71E+06 | | |
| Poisson's ratio | 0.208 | | 0.206 | | 0.206 | | |
| Young's modulus (GPa) | 73.70 | | 74.67 | | 75.50 | | |
| Refractive index at 589.3 nm | 1.5032 | | 1.5042 | | 1.5054 | | 1.5005 |
| Stress optical coefficient (nm/mm/MPa) | 3.093 | | 3.071 | | 3.072 | | 3.033 |

| | Ex. 43 | Ex. 44 | Ex. 45 | Ex. 46 | Ex. 47 | Ex. 48 | Ex. 49 | Ex. 50 |
|---|---|---|---|---|---|---|---|---|
| Density (g/cm$^3$) | 2.424 | 2.422 | 2.455 | 2.454 | 2.454 | 2.434 | 2.439 | 2.443 |
| Low temperature coefficient of thermal expansion 25-300° C. (ppm/° C.) | 8.48 | 8.34 | 8.03 | 7.88 | 7.76 | 7.87 | 7.71 | 7.63 |
| High temperature coefficient of thermal expansion (ppm/° C.) | | | | | | | | |
| Strain pt. temperature (° C.) | 614 | 594 | 595 | 586 | 579 | 580 | 581 | 579 |
| Anneal pt. temperature (° C.) | 659 | 640 | 649 | 639 | 630 | 633 | 633 | 632 |
| $10^{11}$ Poise temperature (° C.) | 739 | 722 | 740 | 729 | 718 | 722 | 721 | 721 |
| Softening pt. temperature (° C.) | 912 | 899 | 918 | 909 | 898 | 892 | 893 | 895 |
| 35 kP temperature (° C.) | 1216 | 1204 | | 1212 | 1200 | 1203 | 1203 | 1203 |
| 200 kP temperature (° C.) | 1116 | 1102 | | 1113 | 1099 | 1105 | 1102 | 1103 |
| Zircon breakdown temperature (° C.) | | | | | | | | |
| Zircon breakdown viscosity (P) | | | | | | | | |
| Liquidus temperature (° C.) | | | 985 | | 965 | 1005 | 1010 | 1030 |
| Liquidus viscosity (P) | | | | | 4.E+06 | 1.78E+06 | 1.34E+06 | 8.98E+05 |
| Poisson's ratio | | | | | | 0.211 | 0.21 | 0.213 |
| Young's modulus (GPa) | | | | | | 76.32 | 76.60 | 76.81 |
| Refractive index at 589.3 nm | 1.5014 | 1.5026 | 1.5036 | 1.5047 | 1.5061 | 1.505 | 1.5059 | 1.5064 |

TABLE 1B-continued

Selected physical properties of the glasses listed in Table 1B.

| | | | | | | | | |
|---|---|---|---|---|---|---|---|---|
| Stress optical coefficient (nm/mm/MPa) | 2.965 | 2.981 | 3.082 | 3.057 | 3.063 | 3.025 | 3.004 | 3.046 |

| | Ex. 51 | Ex. 52 | Ex. 53 | Ex. 54 | Ex. 55 | Ex. 56 | Ex. 57 |
|---|---|---|---|---|---|---|---|
| Density (g/cm$^3$) | 2.424 | 2.431 | 2.403 | 2.4 | 2.45 | 2.462 | 2.468 |
| Low temperature CTE 25-300° C. (ppm/° C.) | 77.1 | 76.1 | 74.3 | 73.1 | 80.2 | 79.7 | 83.6 |
| High temperature CTE (ppm/° C.) | | | | | | | |
| Strain pt. (° C.) | 588 | 599 | 611 | 612 | 580 | 611 | 597 |
| Anneal pt. (° C.) | 640 | 651 | 665 | 665 | 631 | 663 | 649 |
| $10^{11}$ Poise temperature (° C.) | 728 | 738 | 753 | 752 | 718 | 750 | 735 |
| Softening pt. (° C.) | 900.4 | 907.5 | 916 | 912.5 | 892.2 | 915.6 | 899.4 |
| $T^{35\ kP}$ (° C.) | 1204 | 1209 | 1209 | 1202 | 1206 | 1205 | 1184 |
| $T^{200\ kP}$ (° C.) | 1106 | 1113 | 1113 | 1106 | 1102 | 1111 | 1093 |
| Zircon breakdown temperature (° C.) | | | | | | | |
| Zircon breakdown viscosity (P) | | | | | | | |
| Liquidus temperature (° C.) | 1060 | 1115 | 1160 | 1205 | | | |
| Liquidus viscosity (P) | 5.11E+05 | 1.90E+05 | 8.18E+04 | 3.32E+04 | | | |
| Poisson's ratio | 0.211 | 0.212 | 0.208 | 0.214 | | | |
| Young's modulus (GPa) | 77.01 | 78.05 | 77.57 | 78.74 | | | |
| Refractive index at 589.3 nm | 1.5054 | 1.5055 | 1.5059 | 1.5072 | | | |
| Stress optical coefficient (nm/mm/MPa) | 3.011 | 2.98 | 2.982 | 2.964 | | | |

| | Ex. 64 |
|---|---|
| Density (g/cm$^3$) | 2.428 |
| CTE 25-300° C. (ppm/° C.) | 7.8 |
| Strain pt. (° C.) | 571 |
| Anneal pt. (° C.) | 622 |
| $10^{11}$ Poise temperature (° C.) | |
| Softening pt. (° C.) | 881.4 |
| $T^{35\ kP}$ (° C.) | |
| $T^{200\ kP}$ (° C.) | 1645 |
| Zircon breakdown temperature (° C.) | |
| Zircon breakdown viscosity (P) | |
| Liquidus temperature (° C.) | 1000 |
| Liquidus viscosity (P) | 1524280 |
| Poisson's ratio | 0.211 |
| Young's modulus (GPa) | 76.3 |
| Refractive index at 589.3 nm | 1.51 |
| Stress optical coefficient (nm/mm/MPa) | 3.02 |

Where the glass article includes a glass-ceramic, the crystal phases may include β-spodumene, rutile, gahnite or other known crystal phases and combinations thereof.

The glass article may be substantially planar, although other embodiments may utilize a curved or otherwise shaped or sculpted substrate. In some instances, the glass article may have a 3D or 2.5D shape. The glass article may be substantially optically clear, transparent and free from light scattering. The glass article may have a refractive index in the range from about 1.45 to about 1.55. As used herein, the refractive index values are with respect to a wavelength of 550 nm.

Additionally or alternatively, the thickness of the glass article may be constant along one or more dimension or may vary along one or more of its dimensions for aesthetic and/or functional reasons. For example, the edges of the glass article may be thicker as compared to more central regions of the glass article. The length, width and thickness dimensions of the glass article may also vary according to the article application or use.

The glass article may be characterized by the manner in which it is formed. For instance, where the glass article may be characterized as float-formable (i.e., formed by a float process), down-drawable and, in particular, fusion-formable or slot-drawable (i.e., formed by a down draw process such as a fusion draw process or a slot draw process).

A float-formable glass article may be characterized by smooth surfaces and uniform thickness is made by floating molten glass on a bed of molten metal, typically tin. In an example process, molten glass that is fed onto the surface of the molten tin bed forms a floating glass ribbon. As the glass ribbon flows along the tin bath, the temperature is gradually decreased until the glass ribbon solidifies into a solid glass article that can be lifted from the tin onto rollers. Once off the bath, the glass article can be cooled further and annealed to reduce internal stress. Where the glass article is a glass ceramic, the glass article formed from the float process may be subjected to a ceramming process by which one or more crystalline phases are generated.

Down-draw processes produce glass articles having a uniform thickness that possess relatively pristine surfaces. Because the average flexural strength of the glass article is controlled by the amount and size of surface flaws, a pristine surface that has had minimal contact has a higher initial strength. When this high strength glass article is then further strengthened (e.g., chemically), the resultant strength can be higher than that of a glass article with a surface that has been lapped and polished. Down-drawn glass articles may be drawn to a thickness of less than about 2 mm. In addition, down drawn glass articles have a very flat, smooth surface that can be used in its final application without costly grinding and polishing. Where the glass article is a glass ceramic, the glass article formed from the down draw process may be subjected to a ceramming process by which one or more crystalline phases are generated.

The fusion draw process, for example, uses a drawing tank that has a channel for accepting molten glass raw material. The channel has weirs that are open at the top along the length of the channel on both sides of the channel. When the channel fills with molten material, the molten glass overflows the weirs. Due to gravity, the molten glass flows down the outside surfaces of the drawing tank as two flowing glass films. These outside surfaces of the drawing tank extend down and inwardly so that they join at an edge below the drawing tank. The two flowing glass films join at this edge to fuse and form a single flowing glass article. The fusion draw method offers the advantage that, because the two glass films flowing over the channel fuse together, neither of the outside surfaces of the resulting glass article comes in contact with any part of the apparatus. Thus, the surface properties of the fusion drawn glass article are not affected by such contact. Where the glass article is a glass ceramic, the glass article formed from the fusion process may be subjected to a ceramming process by which one or more crystalline phases are generated.

The slot draw process is distinct from the fusion draw method. In slow draw processes, the molten raw material glass is provided to a drawing tank. The bottom of the drawing tank has an open slot with a nozzle that extends the length of the slot. The molten glass flows through the slot/nozzle and is drawn downward as a continuous glass article and into an annealing region. Where the glass article is a glass ceramic, the glass article formed from the slot draw process may be subjected to a ceramming process by which one or more crystalline phases are generated.

In some embodiments, the glass article may be formed using a thin rolling process, as described in U.S. Pat. No. 8,713,972, entitled "Precision Glass Roll Forming Process and Apparatus", U.S. Pat. No. 9,003,835, entitled "Precision Roll Forming of Textured Sheet Glass", U.S. Patent Publication No. 20150027169, entitled "Methods And Apparatus For Forming A Glass Ribbon", and U.S. Patent Publication No. 20050099618, entitled "Apparatus and Method for Forming Thin Glass Articles", the contents of which are incorporated herein by reference in their entirety. More specifically the glass article may be formed by supplying a vertical stream of molten glass, forming the supplied stream of molten glass or glass-ceramic with a pair of forming rolls maintained at a surface temperature of about 500° C. or higher or about 600° C. or higher to form a formed glass ribbon having a formed thickness, sizing the formed ribbon of glass with a pair of sizing rolls maintained at a surface temperature of about 400° C. or lower to produce a sized glass ribbon having a desired thickness less than the formed thickness and a desired thickness uniformity. The apparatus used to form the glass ribbon may include a glass feed device for supplying a supplied stream of molten glass; a pair of forming rolls maintained at a surface temperature of about 500° C. or higher, the forming rolls being spaced closely adjacent each other defining a glass forming gap between the forming rolls with the glass forming gap located vertically below the glass feed device for receiving the supplied stream of molten glass and thinning the supplied stream of molten glass between the forming rolls to form a formed glass ribbon having a formed thickness; and a pair of sizing rolls maintained at a surface temperature of about 400° C. or lower, the sizing rolls being spaced closely adjacent each other defining a glass sizing gap between the sizing rolls with the glass sizing gap located vertically below the forming rolls for receiving the formed glass ribbon and thinning the formed glass ribbon to produce a sized glass ribbon having a desired thickness and a desired thickness uniformity.

In some instances, the thin rolling process may be utilized where the viscosity of the glass does not permit use of fusion or slot draw methods. For example, thin rolling can be utilized to form the glass articles when the glass exhibits a liquidus viscosity less than 100 kP.

The glass article may be acid polished or otherwise treated to remove or reduce the effect of surface flaws.

Another aspect of this disclosure pertains to a method of forming a fracture-resistant glass article. The method includes providing a glass substrate having a first surface and a second surface defining a thickness of about 1 millimeter or less and generating a stress profile in the glass substrate, as described herein to provide the fracture-resistant glass article. In one or more embodiments, generating the stress profile comprises ion exchanging a plurality of alkali ions into the glass substrate to form an alkali metal oxide concentration gradient comprising a non-zero concentration of alkali metal oxide extending along the thickness. In one example, generating the stress profile includes immersing the glass substrate in a molten salt bath including nitrates of Na+, K+, Rb+, Cs+ or a combination thereof, having a temperature of about 350° C. or greater (e.g., about 350° C. to about 500° C.). In one example, the molten bath may include $NaNO_3$ and may have a temperature of about 485° C. In another example, the bath may include $NaNO_3$ and have a temperature of about 430° C. The glass substrate may be immersed in the bath for about 2 hours or more, up to about 48 hours (e.g., from about 12 hours to about 48 hours, from about 12 hours to about 32 hours, from about 16 hours to about 32 hours, from about 16 hours to about 24 hours, or from about 24 hours to about 32 hours).

In some embodiments, the method may include chemically strengthening or ion exchanging the glass substrate in more than one step using successive immersion steps in more than one bath. For example, two or more baths may be used successively. The composition of the one or more baths may include a single metal (e.g., Ag+, Na+, K+, Rb+, or Cs+) or a combination of metals in the same bath. When more than one bath is utilized, the baths may have the same or different composition and/or temperature as one another. The immersion times in each such bath may be the same or may vary to provide the desired stress profile.

In one or more embodiments, a second bath or subsequent baths may be utilized to generate a greater surface CS. In some instances, the method includes immersing the glass material in the second or subsequent baths to generate a greater surface CS, without significantly influencing the chemical depth of layer and/or the DOC. In such embodiments, the second or subsequent bath may include a single metal (e.g., $KNO_3$ or $NaNO_3$) or a mixture of metals ($KNO_3$ and $NaNO_3$). The temperature of the second or subsequent bath may be tailored to generate the greater surface CS. In some embodiments, the immersion time of the glass material in the second or subsequent bath may also be tailored to generate a greater surface CS without influencing the chemical depth of layer and/or the DOC. For example, the immersion time in the second or subsequent baths may be less than 10 hours (e.g., about 8 hours or less, about 5 hours or less, about 4 hours or less, about 2 hours or less, about 1 hour or less, about 30 minutes or less, about 15 minutes or less, or about 10 minutes or less).

In one or more alternative embodiments, the method may include one or more heat treatment steps which may be used in combination with the ion-exchanging processes described herein. The heat treatment includes heat treating the glass article to obtain a desired stress profile. In some embodiments, heat treating includes annealing, tempering or heating the glass material to a temperature in the range from about 300° C. to about 600° C. The heat treatment may last for 1 minute up to about 18 hours. In some embodiments, the heat treatment may be used after one or more ion-exchanging processes, or between ion-exchanging processes.

EXAMPLES

Various embodiments will be further clarified by the following examples.

Example 1

Glass articles according to Examples 1A-1B and Comparative Examples 1C-1G were made by providing glass substrates having a nominal glass composition of 58 mol % $SiO_2$, 16.5 mol % $Al_2O_3$, 17 mol % $Na_2O$, 3 mol % MgO, and 6.5 mol % $P_2O_5$. The glass substrates had a thickness of 0.4 mm and length and width dimensions of 50 mm. The glass substrates were chemically strengthened by an ion exchange process that included immersing in a molten salt bath of 80% KNO3 and 20% NaNO3 having a temperature of about 420° C. for the durations shown in Table 2. The resulting glass articles were then subjected to AROR testing as described above and by abrading a major surface of each of the samples using 90 grit SiC particles at a pressure of 5 psi, 15 psi or 25 psi, as also shown in Table 2. Table 2 shows the average equibiaxial flexural strength or failure load of the glass articles.

TABLE 2

| Chemical strengthening conditions and AROR results for Example 1. | | | |
|---|---|---|---|
| Ex. | Ion Exchange Conditions | At 5 psi Average kgf (stdev) | 15 psi Average kgf (stdev) | 25 psi Average kgf (stdev) |
| 1C | 420° C./4 hours | 49.4 (7.1) | 17.4 (7.2) | 0.3 (0.9) |
| 1D | 420° C./8 hours | 49.9 (7.1) | 36.5 (6.7) | 19.3 (6.4) |
| 1A | 420° C./16 hours | 47.5 (6.0) | 38.3 (2.8) | 30.0 (5.4) |
| 1B | 420° C./32 hours | 36.9 (4.3) | 30.9 (3.1) | 26.2 (2.8) |
| 1E | 420° C./64 hours | 18.7 (1.5) | 15.3 (0.9) | 13.5 (1.2) |
| 1F | 420° C./128 hours | 5.9 (0.5) | 5.4 (0.3) | 4.5 (0.3) |

Figure 11:
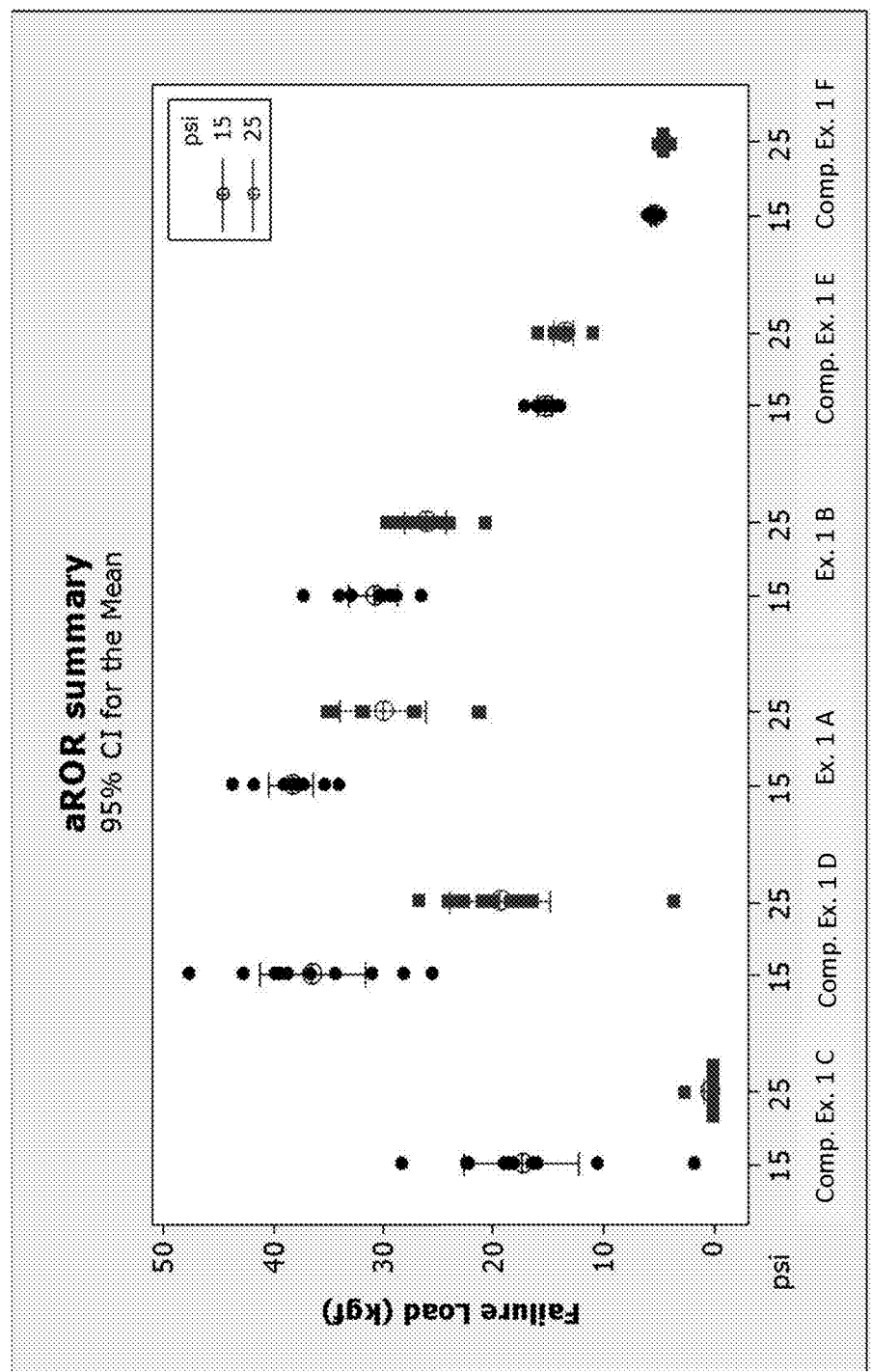
FIG. 11 is a graph showing AROR test results for Example 1.

The average equibiaxial flexural strength or failure load of the Examples after abrasion at 15 psi and 25 psi are plotted in FIG. 11. As shown in FIG. 11, Examples 1A and 1B exhibited the greatest average equibiaxial flexural strength after being abraded at 25 psi. Accordingly, the AROR performance of Examples 1A and 1B demonstrate that these glass articles exhibit a highly diced fracture pattern, which indicates improved retained strength, especially for deeper abrasion depths that result from higher abrasion pressures.

Example 2

Glass articles according to Examples 2A-2C and Comparative Examples 2D-2F were made by providing glass substrates and chemically strengthening the glass substrates. The glass substrates used for Examples 2A-2C and Comparative 2E-2F had a nominal glass composition of 69.2 mol % $SiO_2$, 12.6 mol % $Al_2O_3$, 1.8 mol % $B_2O_3$, 7.7 mol % $Li_2O$, 0.4 mol % $Na_2O$, 2.9 mol % MgO, 1.7 mol % ZnO, 3.5 mol % $TiO_2$ and 0.1 mol % $SnO_2$. The substrate used for Comparative Example 2D had the same composition as Example 1.

The glass substrates had a thickness of 1 mm and length and width dimensions permitting assembly with a known mobile device housing. The glass substrates were chemically strengthened by the ion exchange processes shown in Table 3. The CT and DOC values for Examples 2A-2C were measured by SCALP and are also shown in Table 3.

TABLE 3

Ion exchange conditions and drop testing results for Example 2.

| Example | Molten Bath Composition | Molten Bath Temperature (° C.) | Immersion Time (hours) | CT (MPa) | DOC (μm) |
|---|---|---|---|---|---|
| Ex. 2A | 100% NaNO3 | 430 | 24 | 128 | 160 |
| Ex. 2B | 100% NaNO3 | 430 | 29 | 153 | 200 |
| Ex. 2C | 100% NaNO3 | 430 | 33 | 139 | 200 |
| Comp. Ex. 2D | | | | | |
| Comp. Ex. 2E | 100% NaNO3 | 390 | 3.5 | | |
| Comp. Ex. 2F | 100% NaNO3 | 430 | 48 | | |

Figure 12:
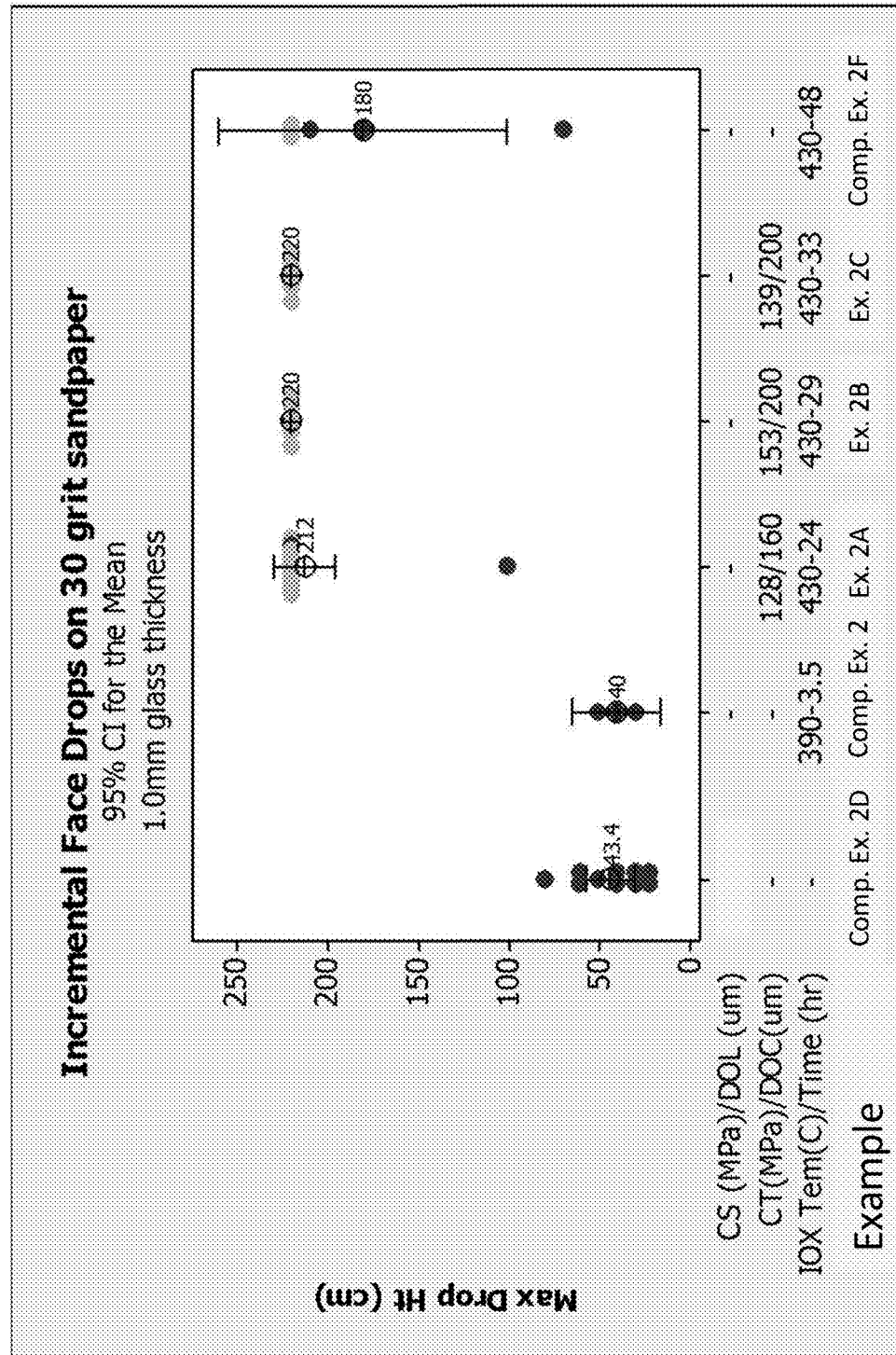
FIG. 12 is a graph showing drop test results for Example 2.

Comparative Example 2D was ion exchanged to exhibit an error function stress profile with a DOC exceeding 75 micrometers (as measured by Roussev I applying IWKB analysis). The resulting glass articles were then retrofitted to identical mobile device housings and subjected to drop testing as described above onto 30 grit sand paper. FIG. 12 shows the maximum failure height for the Examples. As shown in FIG. 12, Examples 2A-2C exhibited significantly greater maximum failure heights (i.e., 212 cm, 220 cm, and 220 cm, respectively) and exhibited dicing behavior. Example 2F, which has the same composition, did not exhibit the same dicing behavior and exhibited a lower maximum failure height, as compared to Examples 2A-2C.

Example 3

Glass articles according to Examples 3A-3K and Comparative Examples 3L-3X were made by providing glass substrates and strengthening the glass substrates. The substrates used for Examples 3A-3D had the same composition as Example 1 and the substrates used for Examples 3L-3X had a nominal glass composition of 69 mol % $SiO_2$, 10.3 mol % $Al_2O_3$, 15.2 mol % $Na_2O$, 5.4 mol % MgO, and 0.2 mol % $SnO_2$.

The glass substrates had a thickness of 0.4 mm and length and width dimensions of 50 mm by 50 mm. The glass substrates were chemically strengthened by ion exchange. Examples 3A-3K were ion exchanged in a molten salt bath of 80% $KNO_3$ and 20% $NaNO_3$ having a temperature of 460° C. for 12 hours. Comparative Examples 3L-3X were ion exchanged such that each resulting glass article exhibits a surface CS of 912 MPa and a DOC of 37 μm, as measured by FSM.

The resulting glass articles were then subjected to fracture by impacting one major surface of each article with a tungsten carbide conospherical scribe for a single strike from a drop distance (as indicated in Tables 4 and 5) and assessing the breakage or fracture pattern in terms of how many fragments resulted, whether the glass article fractured immediately or did not fracture at all, and the frangibility of the glass article.

TABLE 4

Failure characteristics and fracture mechanics of Examples 3A-3K.

| Ex. | Strike Count | Fragment Count (#) | Frangible (Y/N) | Drop Distance (inches) | Time to fracture |
|---|---|---|---|---|---|
| 3A | 1 | 100+ | Yes | 0.611 | Instant |
| 3B | 1 | DNB | DNB | 0.561 | DNB |
| 3C | 1 | DNB | DNB | 0.511 | DNB |
| 3D | 1 | DNB | DNB | 0.461 | DNB |
| 3E | 1 | DNB | DNB | 0.411 | DNB |
| 3F | 1 | DNB | DNB | 0.361 | DNB |
| 3G | 1 | DNB | DNB | 0.311 | DNB |
| 3H | 1 | 100+ | Yes | 0.261 | Instant |
| 3I | 1 | DNB | DNB | 0.211 | DNB |
| 3J | 1 | DNB | DNB | 0.161 | DNB |
| 3K | 1 | DNB | DNB | 0.111 | DNB |

* DNB = did not break

TABLE 5

Failure characteristics and fracture mechanics of Comparative Examples 3L-3X.

| Ex. | Strike Count | Fragment Count (#) | Frangible (Y/N) | Drop Distance (inches) | Time to fracture |
|---|---|---|---|---|---|
| 3L | 1 | 9 | No | 0.226 | Instant |
| 3M | 1 | 7 | No | 0.221 | Instant |
| 3N | 1 | 5 | Yes | 0.216 | 30 seconds |
| 3O | 1 | 6 | Yes | 0.211 | 30 seconds |
| 3P | 1 | 2 | No | 0.206 | 30 seconds |
| 3Q | 1 | 7 | Yes | 0.201 | 1 minute |
| 3R | 1 | DNB | DNB | 0.196 | DNB |
| 3S | 1 | 5 | Yes | 0.191 | 30 seconds |
| 3T | 1 | 6 | Yes | 0.186 | 10 seconds |
| 3U | 1 | 9 | Yes | 0.181 | 10 seconds |
| 3V | 1 | 6 | Yes | 0.176 | 15 seconds |
| 3W | 1 | 10+ | Yes | 0.171 | 10 seconds |
| 3X | 1 | 8 | Yes | 0.111 | 30 seconds |

* DNB = did not break

As shown in Tables 4-5, it is clear that glass articles chemically strengthened to a condition near the frangibility limit (i.e., Comparative Examples 3L-3X) are much more likely to experience a delayed failure, when compared to glass articles that were chemically strengthened to a condition a high degree of dicing/fragmentation occurs upon fracture (i.e., Examples 3A-3K). Specifically, more than 80% of Comparative Examples 3L-3X failed in a delayed manner, while the samples in Table 4 either failed immediately, or did not break. Moreover, Comparative Examples 3L-3X exhibited fewer, larger, more splintered fragments than Examples 3A-4K, which failed with a high degree of dicing and exhibited fragments with low aspect ratios.

Example 4

Glass articles according to Examples 4A-4B and Comparative Examples 4C-4F were made by providing glass substrates having the same nominal composition as Example 1 and strengthening the glass substrates. The glass substrates had a thickness of 0.4 mm and were chemically strengthened by an ion exchange process in which the glass substrates were immersed in a molten salt bath of 80% $KNO_3$ and 20% $NaNO_3$ having a temperature of 430° C. for the durations shown in Table 6.

TABLE 6

Ion exchange durations for Example 5.

| Example | Immersion time (hours) |
|---|---|
| Example 4A | 16 |
| Example 4B | 32 |
| Comparative Ex. 4C | 4 |
| Comparative Ex. 4D | 8 |
| Comparative Ex. 4E | 64 |
| Comparative Ex. 4F | 128 |

Figure 13:
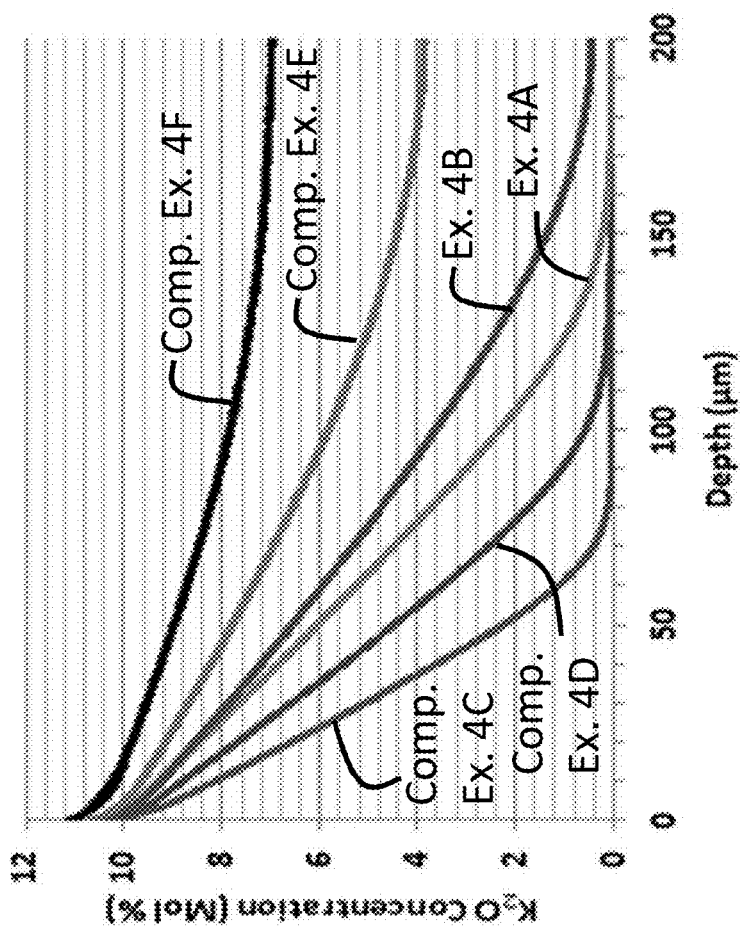
FIG. 13 is a plot showing the concentration of K$_2$O as a function of ion exchange depth for Example 4.

The concentration of $K_2O$ in the glass articles was measured using Glow-Discharge Optical Emission Spectroscopy (GDOES). In FIG. 13, the mol % (expressed as $K_2O$) of the larger K+ ion that is replacing the smaller Na+ in the glass substrate is represented on the vertical axis, and plotted as a function of ion-exchange depth. Examples 4A and 4B exhibited a higher stored tensile energy (and central tension) than the other profiles, and maximize the DOC as well as the magnitude of the surface compression.

Figure 14:
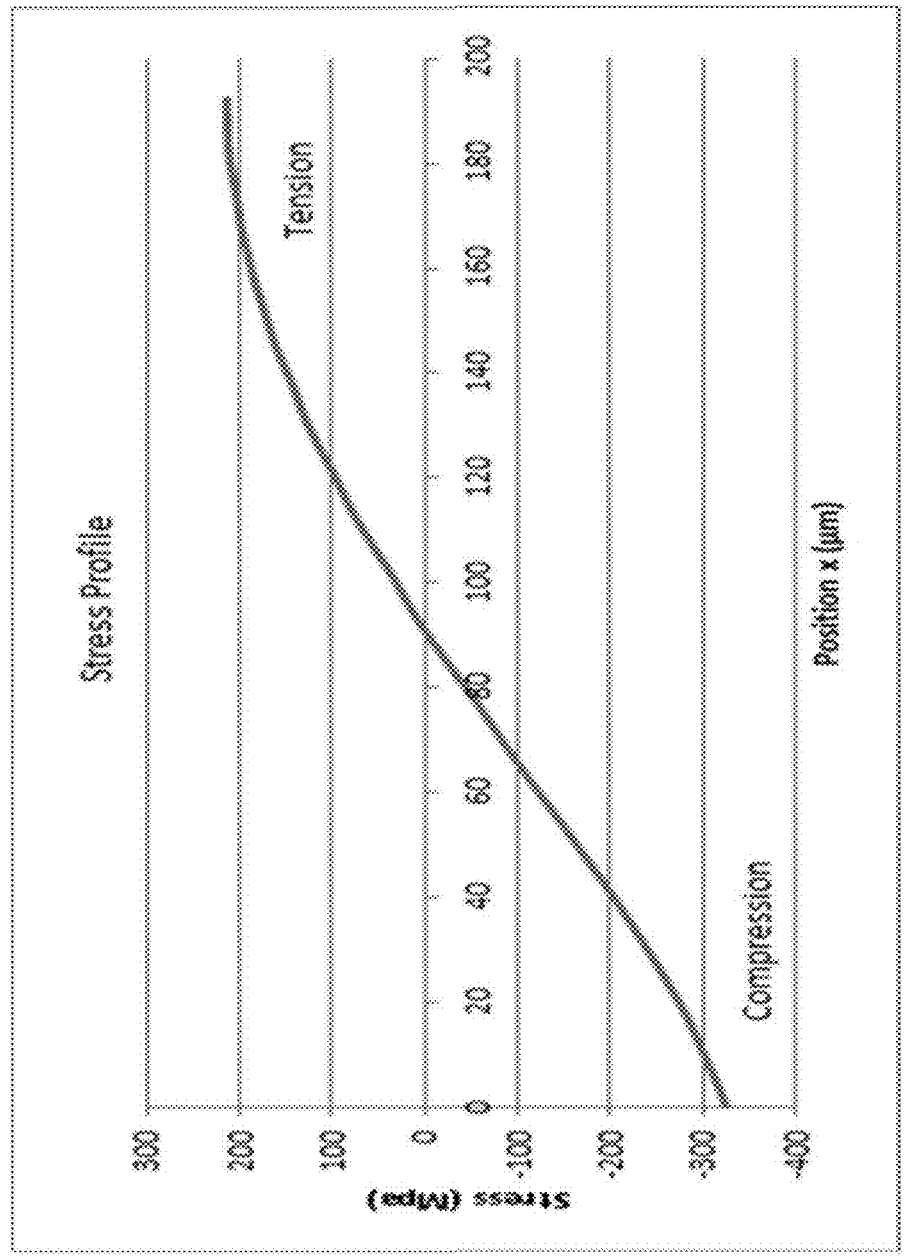
FIG. 14 is a plot showing the stress profile of Example 4G.

FIG. 14 shows the stress profile, as measured by Roussev I applying IWKB analysis, of Example 4G which was formed by providing the same substrate as Examples 4A and 4B but and immersing in a molten salt bath of 70% $KNO_3$ and 30% $NaNO_3$ having a temperature of 460° C. for 12 hours.

Example 5

Glass articles according to Examples 5A-5D (with Examples B and C being comparative) were made by providing glass substrates having the same nominal composition as Example 2A-2C and strengthening the glass substrates. The glass substrates were chemically strengthened by the ion exchange processes shown in Table 7.

TABLE 7

Ion exchange conditions for Example 5.

| Example | Molten Bath Composition | Molten Bath Temperature (° C.) | Immersion duration (hours) |
|---|---|---|---|
| 5A | 80% $KNO_3$/ 20% $NaNO_3$ | 460 | 12 |
| Comparative 5B | 65% $KNO_3$/ 35% $NaNO_3$ | 460 | 12 |
| Comparative 5C | 100% $NaNO_3$ | 430 | 4 |
| 5D | 100% $NaNO_3$ | 430 | 16 |

Figure 15B:
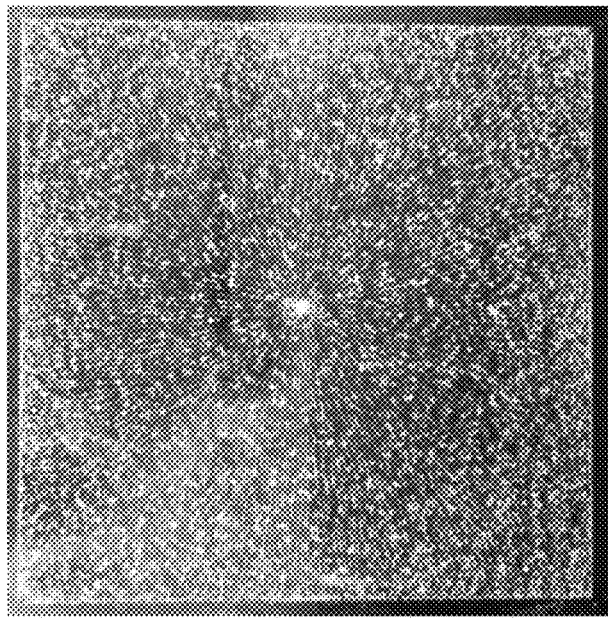
FIGS. 15A-15D are fracture images of Example 5.
Figure 15A:
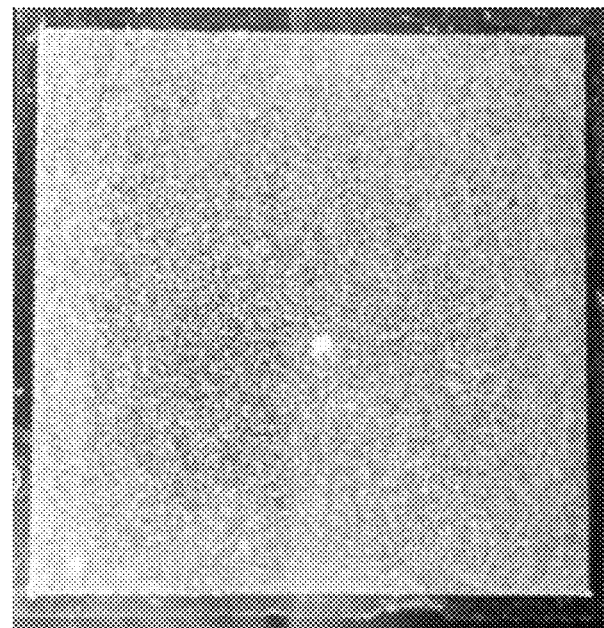

Example 5A and Comparative Example 5B were adhered to a transparent substrate using a pressure sensitive adhesive supplied by 3M under the tradename 468MP, applied in the same manner and identical thicknesses. Example 5A and Comparative Example 5B were fractured and the resulting fractured glass articles were evaluated. FIGS. 15A and 15B show fracture images of Example 5A and Comparative Example 5B, respectively. As shown in FIG. 15A, Example 5A exhibited higher dicing behavior and resulted in fragments having an aspect ratio of less than about 2. As shown in FIG. 15B, Comparative Example 5B resulted in fragments having a higher aspect ratio.

Figure 15D:
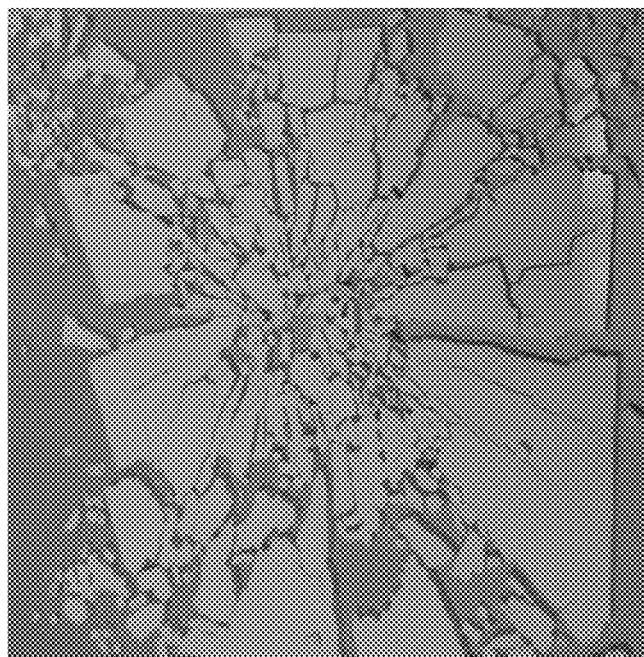
Figure 15C:
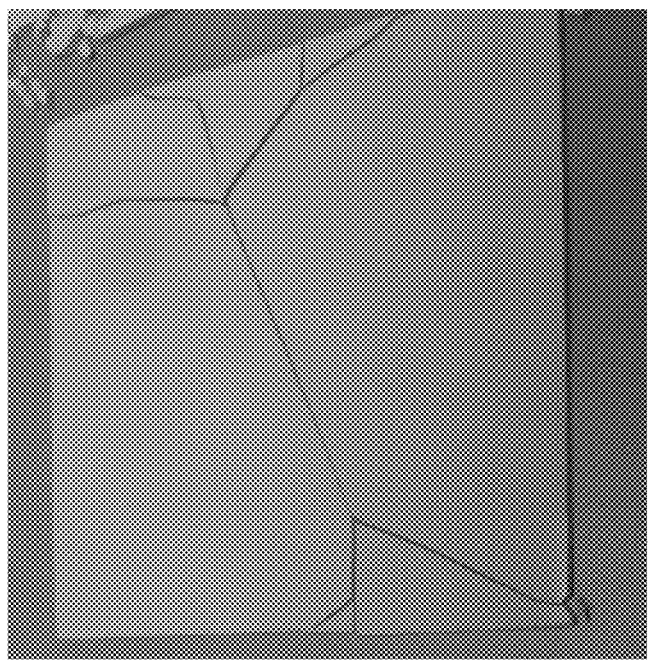

Comparative Example 5C and Example 5D were not constrained by an adhesive and were fractured. The resulting fractured glass articles were evaluated. FIGS. 15C and 15D show fracture images of Comparative Example 5C and Example 5D, respectively. As shown in FIG. 15C, Comparative Example 5C exhibited larger fragments. As shown in FIG. 15D, Example 5D resulted in fragments indicating dicing. It is believed that the sub-fragments (not shown) did not extend through the thickness of the glass article.

Example 6

Figure 16A:
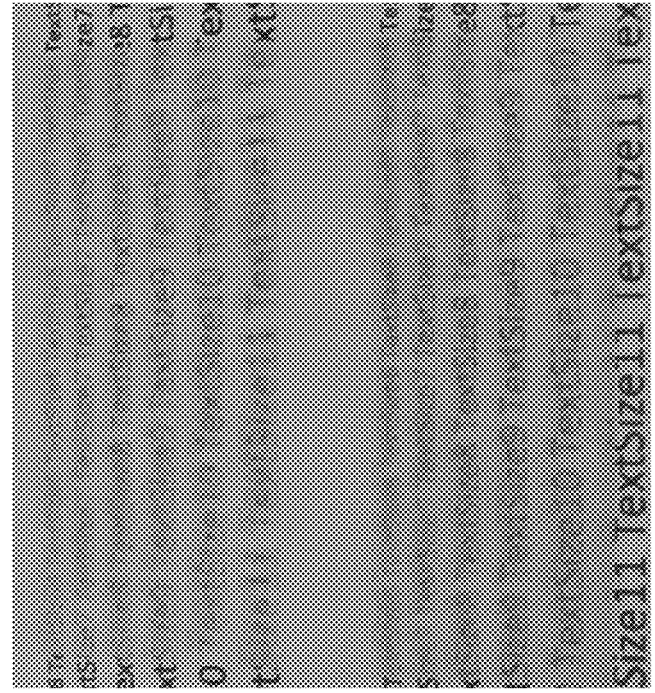
Figure 16B:
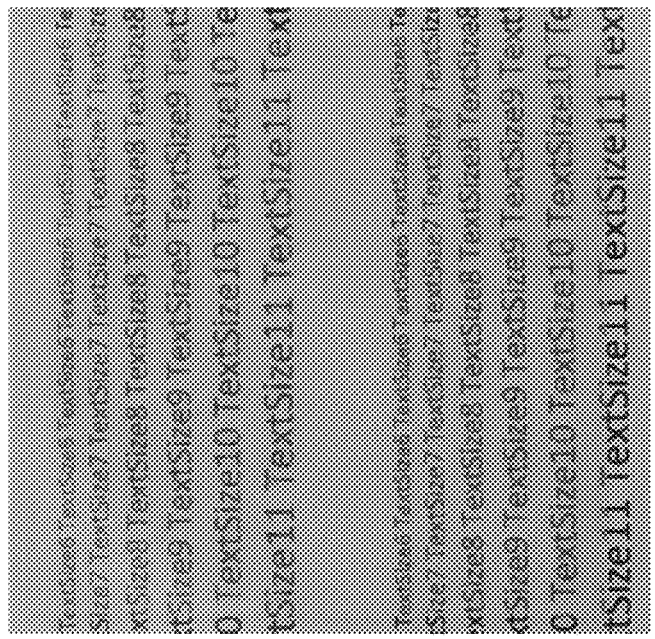

A glass article according to Example 6 was made by providing a glass substrate having the same nominal composition as Examples 3A-3K and strengthened in the same manner. Example 6 was evaluated for haze or readability after fracture, at different viewing angles. After fracture, Example 6 exhibited a high degree of dicing but still exhibited good readability at a 90° viewing angle, relative to the surface plane or major surface of the glass article. The readability drops as the viewing angle decreases, as illustrated by the images of FIGS. 16A-16D. FIG. 16A demonstrates text placed behind Example 6 is still visible and readable at a viewing angle of 90 degrees relative to the surface plane or major surface of the glass article. FIG. 16B shows the test is somewhat visible and readable at a viewing angle of about 67.5 degrees. The text is not clear or readable at viewing angles of 45 degrees and 22.5 degrees relative to the surface plane or major surface of the glass article, according to FIGS. 16C-16D. Accordingly, Example 6 can function as a privacy screen when used in a display such that only the viewer may read or see the display clearly, while others beside the viewer would not be able to read the display clearly.

Example 7

Glass articles according to Examples 7A-7C were made by providing glass substrates having a 2.5-dimensional shape but each having a different thickness (i.e., Example 7A had a thickness of 1 mm, Example 7B had a thickness of 0.8 mm and Example 7C had a thickness of 0.5 mm). A 2.5-dimensional shape includes a flat major surface and an opposite curved major surface. The composition of the glass substrates was the same as Examples 2A-2C. The stored tensile energy of each substrate was calculated as a function of ion exchange time using a molten bath having a temperature of 430° C. Stored tensile energy was calculated using the total amount of stress over the CT region (327 in FIG. 4) measured by SCALP. The calculated stored tensile energy was plotted as a function of ion exchange time in FIG. 17. For purposes of illustration, a dotted line at a stored tensile energy value of 10 J/m$^2$ has been drawn to represent an approximate threshold for frangibility. The highlighted area represents the ion-exchange conditions for a single part having a thickness range from 0.5-1.0 mm that exhibit the behaviors described herein. Specifically, this range enables optimized mechanical performance and a similar degree of dicing across the area of the part, when and if the part fractures.

Figure 17:
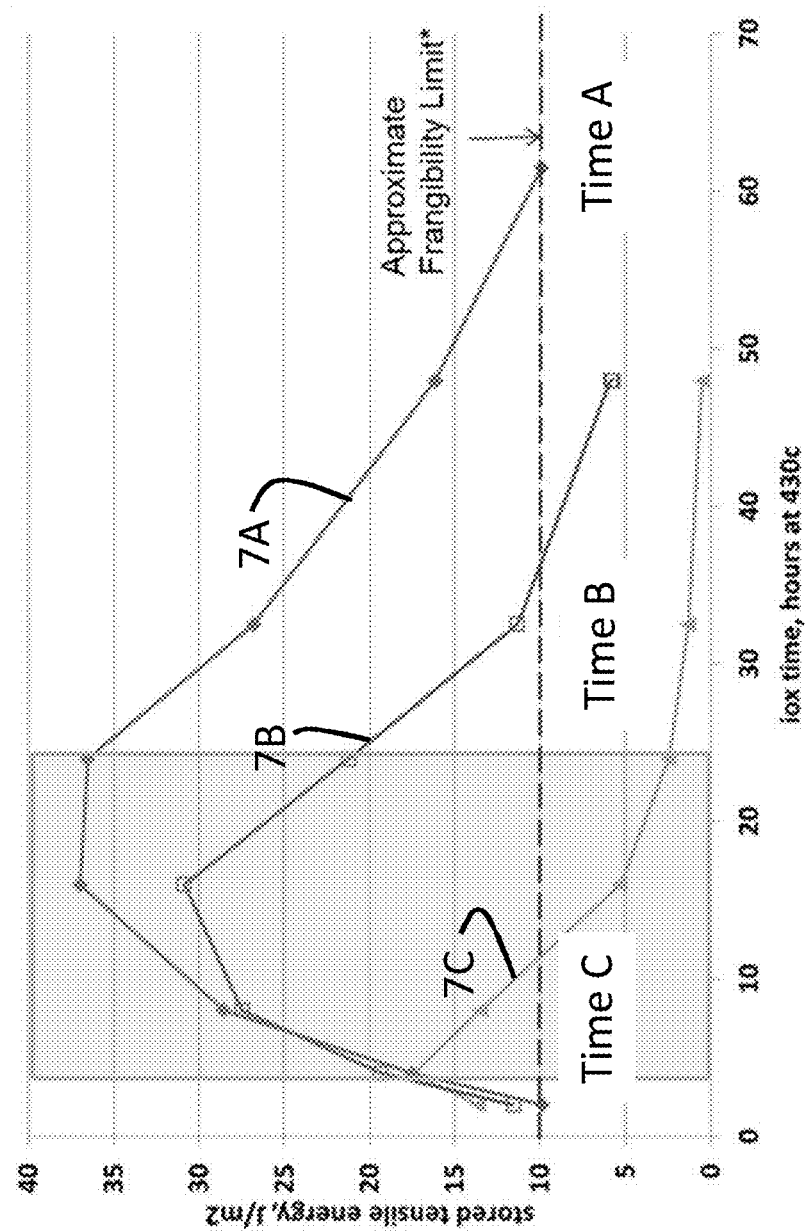
FIG. 17 is a plot of calculated stored tensile energy as a function of ion-exchange time, for Example 7.

If known frangibility limits are used to determine the ion exchange parameters for various thicknesses, at Time A the ion exchange time where the stored tensile energy reaches below 10 J/m$^2$, a glass substrate having a thickness of 1 mm would be non-frangible, and a glass substrate with a thickness of 0.5 mm would have low CS. At time C, a glass substrate having a thickness of 0.5 mm is non-frangible, and a glass substrate having a thickness between 1 mm and 0.8 mm regions would be considered frangible. Accordingly, when using the current definition of frangibility, FIG. 17 shows that one would choose an ion-exchange time in a given bath at a designated temperature that is significantly longer for a relatively thick part, or region of a non-uniformly thick part, than one would choose for a thinner part, or a thinner region, of an intentionally non-uniformly thick part. In order to provide a fully-finished 2.5D part that has substantially improved drop performance and reliability, and a relatively uniform degree of fragmentation, or dicing, it may be desirable to ion-exchange the part for a shorter period of time in order to install a higher degree of stored tensile energy than would choose to limit the degree of fragmentation or dicing.

Figure 18:
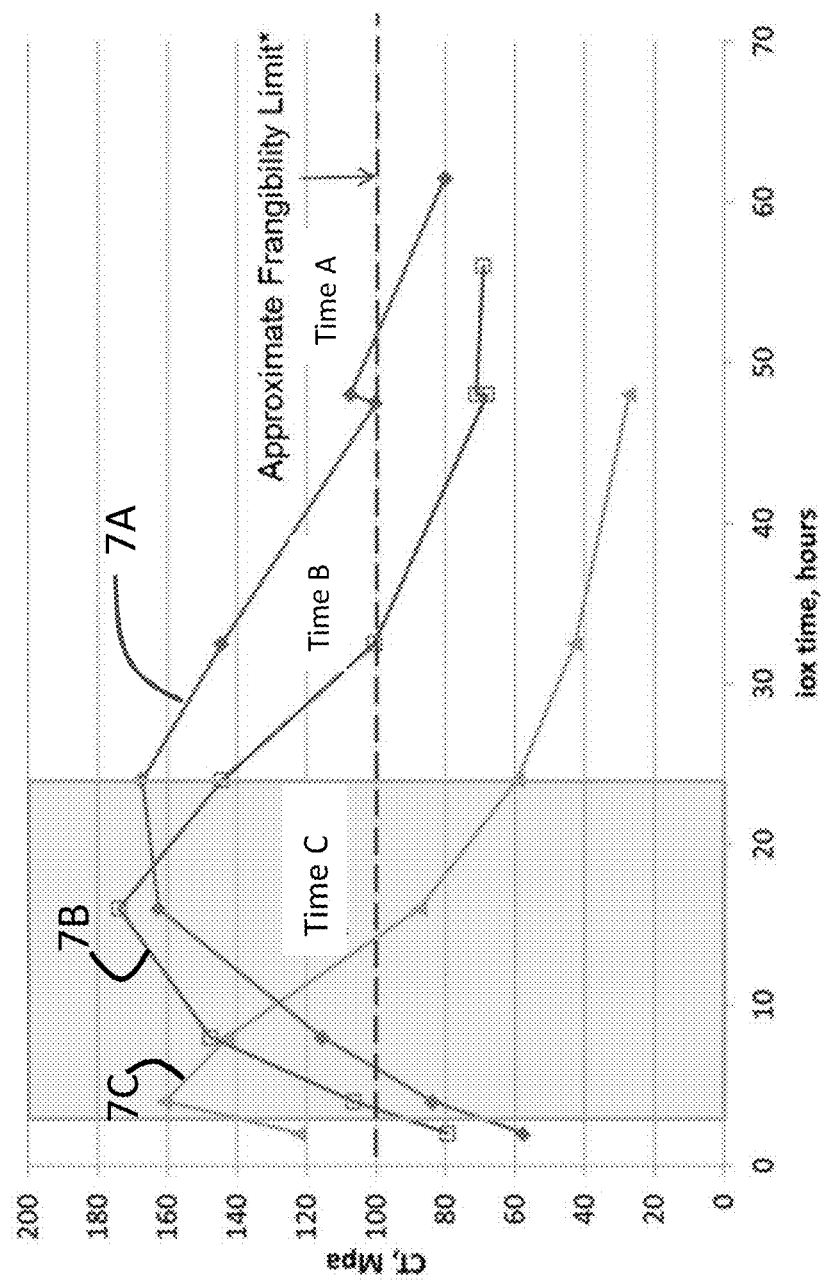
FIG. 18 is a plot of calculated central tension as a function of ion-exchange time, for Example 7.

FIG. 18 represents the samples shown in FIG. 17, except that the installed tensile energy represented in 11 is now represented as central tension (CT), which has been used as a more common descriptor of the tensile energy in the central region of the ion-exchanged specimens.

Example 8

Figure 19:
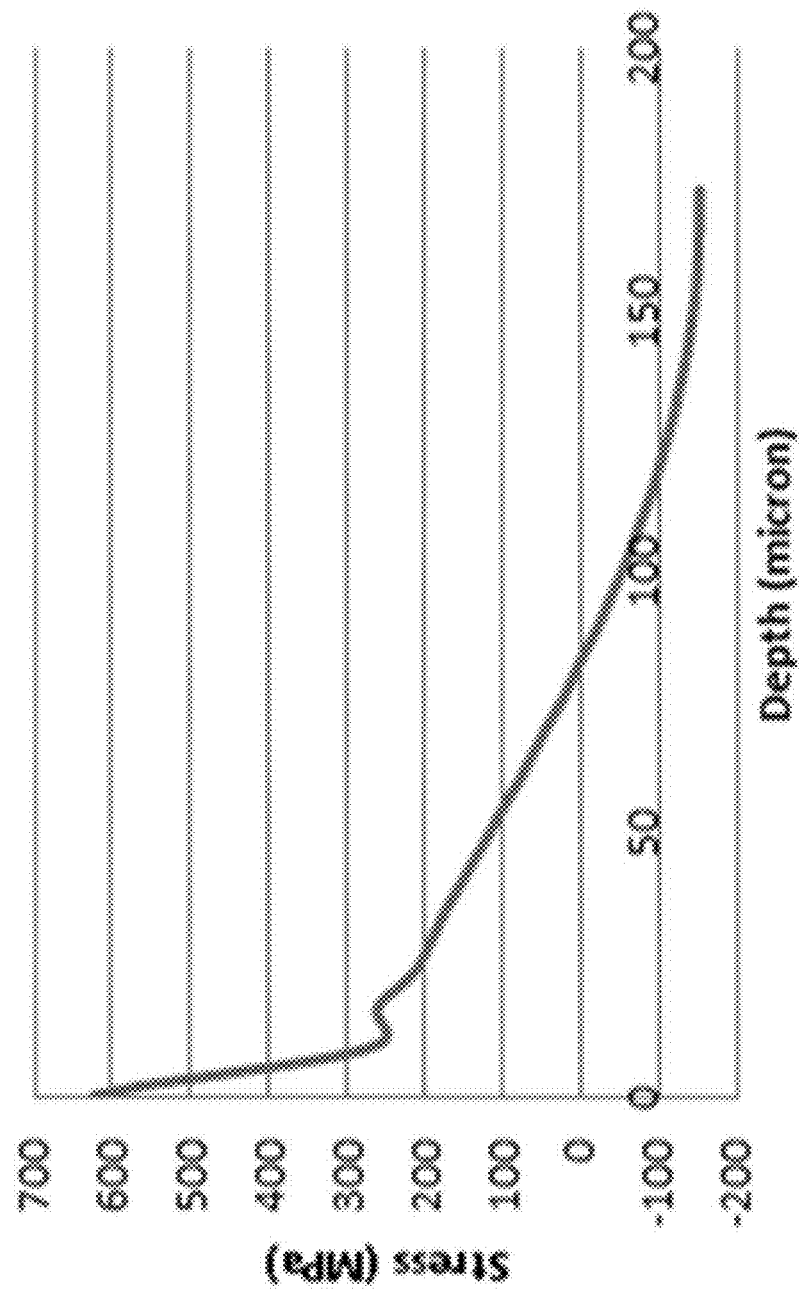
FIG. 19 is a plot showing the stress profile of Example 6, with compressive and tensile stress plotted as function of depth.

Example 8 included a glass article made by providing a glass substrate having the same nominal composition as Example 1 and strengthening the glass substrate. The glass substrate had a thickness of 0.4 mm and was chemically strengthened by a two-step ion exchange process in which the glass substrate was first immersed in a first molten salt bath of 80% $KNO_3$ and 20% $NaNO_3$ having a temperature of 460° C. for 12 hours, removed from the first molten salt bath and immersed in a second molten salt bath of 100% $KNO_3$ having a temperature of 390° C. for 12 minutes. The resulting glass article had a surface compressive stress of 624.5 MPa, a DOC of about 83.3 micrometers (which is equivalent to 0.208t and a max CT of about 152.6 MPa, measured by Roussev I applying IWKB analysis. FIG. 19 shows the compressive stress (shown as negative values) and tensile stress (shown as positive values) as a function of depth in micrometers.

Aspect (1) of this disclosure pertains to a strengthened glass article comprising: a first surface and a second surface opposing the first surface defining a thickness (t) of about 1.1 mm or less; a compressive stress layer extending from the first surface to a depth of compression (DOC) of greater than about 0.11·t; wherein, after the glass article fractures according to a Frangibility Test, the glass article includes a plurality of fragments, wherein at least 90% of the plurality of fragments have an aspect ratio of about 5 or less.

Aspect (2) of this disclosure pertains to the strengthened glass article of Aspect (1), wherein the glass article fractures into the plurality of fragments in 1 second or less, as measured by the Frangibility Test.

Aspect (3) of this disclosure pertains to the strengthened glass article of Aspect (1) or Aspect (2), wherein at least 80% of the plurality of fragments have a maximum dimension that is less than or equal to 3·t.

Aspect (4) of this disclosure pertains to the strengthened glass article of any one of Aspects (1) through Aspect (3), wherein at least 50% of plurality of fragments comprises an aspect ratio of 2 or less.

Aspect (5) of this disclosure pertains to the strengthened glass article of any one of Aspects (1) through Aspect (4), wherein at least 50% of the plurality of fragments comprises a volume of less than or equal to about 10 $mm^3$.

Aspect (6) of this disclosure pertains to the strengthened glass article of any one of Aspects (1) through Aspect (5), wherein the plurality of fragments comprises an ejected portion of fragments, wherein the ejected portion of fragments comprises 10% or less of the plurality of fragments.

Aspect (7) of this disclosure pertains to the strengthened glass article of any one of Aspects (1) through Aspect (6), wherein the glass article comprises a first weight prior to fracture and the wherein the plurality of fragments comprises an ejected portion of fragments and a non-ejected portion of fragments, the non-ejected portion of fragments having a second weight, and the difference between the first weight and the second weight is 1% of the first weight.

Aspect (8) of this disclosure pertains to the strengthened glass article of any one of Aspects (1) through Aspect (7), wherein the probability of the glass article fracturing into the plurality of fragments within 1 second or less, as measured by a Frangibility Test, is 99% or greater.

Aspect (9) of this disclosure pertains to the strengthened glass article of any one of Aspects (1) through Aspect (8), wherein the glass article comprises a stored tensile energy of 20 $J/m^2$ or greater.

Aspect (10) of this disclosure pertains to the strengthened glass article of any one of Aspects (1) through Aspect (9), wherein the glass article comprises a surface compressive stress and a central tension, wherein the ratio of central tension to surface compressive stress is in the range from about 0.1 to about 1.

Aspect (11) of this disclosure pertains to the strengthened glass article of Aspect (10), wherein the central tension is 100 MPa/$\sqrt{(t/1\ mm)}$ or greater (in units of MPa), wherein t is in mm.

Aspect (12) of this disclosure pertains to the strengthened glass article of any one of Aspect (10) through Aspect (11), wherein the central tension is 50 MPa or greater.

Aspect (13) of this disclosure pertains to the strengthened glass article of any one of Aspect (10) through Aspect (12), wherein the surface compressive stress is 150 MPa or greater.

Aspect (14) of this disclosure pertains to the strengthened glass article of any one of Aspect (10) through Aspect (13), wherein the surface compressive stress is 400 MPa or greater.

Aspect (15) of this disclosure pertains to the strengthened glass article of any one of Aspect (10) through Aspect (14), wherein the DOC comprises about 0.2t or greater.

Aspect (16) of this disclosure pertains to the strengthened glass article of any one of Aspect (1) through Aspect (15), wherein the glass article comprises an alkali aluminosilicate glass, alkali containing borosilicate glass, an alkali alumino-phosphosilicate glass or alkali aluminoborosilicate glass.

Aspect (17) of this disclosure pertains to the strengthened glass article of any one of Aspect (1) through Aspect (16), wherein the glass article is disposed on a containment layer.

Aspect (18) of this disclosure pertains to a strengthened glass article comprising: a first surface and a second surface opposing the first surface defining a thickness (t) of about 1.1 mm or less; a compressive stress layer extending from the first surface to a depth of compression (DOC) of about greater than about 0.11·t, wherein the glass article exhibits a load to failure of about 10 kgf or greater, after being abraded with 90-grit SiC particles at a pressure of 25 psi for 5 seconds.

Aspect (19) of this disclosure pertains to the strengthened glass article of Aspect (18), wherein the glass article comprises a stored tensile energy of 20 $J/m^2$ or greater.

Aspect (20) of this disclosure pertains to the strengthened glass article of any one of Aspect (18) or Aspect (19), The strengthened glass article of claim 18 or claim 19, wherein the glass article comprises a surface compressive stress and a central tension, wherein the ratio of central tension to surface compressive stress is in the range from about 0.1 to about 1.

Aspect (21) of this disclosure pertains to the strengthened glass article of Aspect (20), wherein the central tension (CT) is 50 MPa or greater.

Aspect (22) of this disclosure pertains to the strengthened glass article of Aspect (20) or Aspect (21), wherein the surface compressive stress is 150 MPa or greater.

Aspect (23) of this disclosure pertains to the strengthened glass article of any one of Aspect (20) through Aspect (22), wherein the surface compressive stress is 400 MPa or greater.

Aspect (24) of this disclosure pertains to the strengthened glass article of any one of Aspect (20) through Aspect (23), wherein the DOC comprises about 0.2t or greater.

Aspect (25) of this disclosure pertains to the strengthened glass article of any one of Aspect (18) through Aspect (24), wherein the glass article comprises an alkali aluminosilicate glass, alkali containing borosilicate glass, alkali aluminophosphosilicate glass or alkali aluminoborosilicate glass.

Aspect (26) of this disclosure pertains to the strengthened glass article of any one of Aspect (20) through Aspect (25), wherein the glass article is adhered to a substrate.

Aspect (27) of this disclosure pertains to a device comprising: a strengthened glass substrate; a containment layer; and a support, wherein the strengthened glass substrate comprises a first surface and a second surface opposing the first surface defining a thickness (t) of about 1.1 mm or less, a compressive stress layer extending from the first surface to a depth of compression (DOC) of greater than about 0.11·t and, and a central tension (CT) of 50 MPa or greater, wherein the device comprises a tablet, a transparent display, a mobile phone, a video player, an information terminal device, an e-reader, a laptop computer, or a non-transparent display.

Aspect (28) pertains to the device of Aspect (27), wherein, after the glass article fractures according to a Frangibility Test, the glass article includes a plurality of fragments having an aspect ratio of about 5 or less.

Aspect (29) pertains to the device of Aspect (27) or Aspect (28), wherein the glass article fractures into the plurality of fragments in 1 second or less, as measured by the Frangibility Test.

Aspect (30) pertains to the device of Aspect (28) or Aspect (29), wherein at least 80% of the plurality of fragments have a maximum dimension that is less than or equal to 5·t.

Aspect (31) pertains to the device of any one of Aspects (28) through Aspect (30), wherein at least 50% of plurality of fragments each comprise an aspect ratio of 2 or less.

Aspect (32) pertains to the device of any one of Aspects (28) through Aspect (31), wherein at least 50% of the plurality of fragments comprises a volume of less than or equal to about 10 mm$^3$.

Aspect (33) pertains to the device of any one of Aspects (28) through Aspect (32), wherein the plurality of fragments comprises an ejected portion of fragments, wherein the ejected portion of fragments comprises 10% or less of the plurality of fragments.

Aspect (34) pertains to the device of any one of Aspects (28) through Aspect (33), wherein the glass article comprises a first weight prior to fracture and the wherein the plurality of fragments comprises an ejected portion of fragments and a non-ejected portion of fragments, the non-ejected portion of fragments having a second weight, and the difference between the first weight and the second weight is 1% of the first weight.

Aspect (35) pertains to the device of any one of Aspects (28) through Aspect (34), wherein the probability of the glass article fracturing into the plurality of fragments within 1 second or less, as measured by the Frangibility Test, is 99% or greater.

Aspect (36) pertains to the device of any one of Aspects (28) through Aspect (35), wherein the glass article comprises a stored tensile energy of 20 J/m$^2$ or greater.

Aspect (37) pertains to the device of any one of Aspects (27) through Aspect (36), wherein the glass article comprises a surface compressive stress and a central tension, wherein the ratio of central tension to surface compressive stress is in the range from about 0.1 to about 1.

Aspect (38) pertains to the device of Aspect (37), wherein the surface compressive stress is 150 MPa or greater.

Aspect (39) pertains to the device of any one of Aspects (27) through Aspect (38), The device of any one of claims 27-38, wherein the DOC comprises about 0.2t or greater.

Aspect (40) pertains to the device of any one of Aspects (27) through Aspect (39), wherein the glass article comprises an alkali aluminosilicate glass, alkali containing borosilicate glass, alkali aluminophosphosilicate glass or alkali aluminoborosilicate glass.

Aspect (41) pertains to the device of any one of Aspects (27) through Aspect (40), wherein the glass article is disposed on a containment layer.

Aspect (42) pertains to a strengthened glass article comprising: a first surface and a second surface opposing the first surface defining a thickness (t) of about 1.1 mm or less; a compressive stress layer extending from the first surface to a depth of compression (DOC) of greater than about 0.11·t; wherein, after the glass article is laminated to a containment layer and is fractured according to a Frangibility Test, the glass article comprises fractures, and wherein at least 5% of the fractures extend only partially through the thickness.

Aspect (43) pertains to the strengthened glass article of Aspect (42), wherein the glass article fractures into the plurality of fragments in 1 second or less, as measured by the Frangibility Test.

Aspect (44) pertains to the strengthened glass article of Aspect (42) or Aspect (43), wherein the glass article comprises a stored tensile energy of 20 J/m$^2$ or greater.

Aspect (45) pertains to the strengthened glass article of any one of Aspect (42) through Aspect (44), wherein the glass article comprises a surface compressive stress and a central tension, wherein the ratio of central tension to surface compressive stress is in the range from about 0.1 to about 1.

Aspect (46) pertains to the strengthened glass article of Aspect (45), wherein the central tension is 50 MPa or greater.

Aspect (47) pertains to the strengthened glass article of Aspect (45) or Aspect (46), wherein the surface compressive stress is 150 MPa or greater.

Aspect (48) pertains to the strengthened glass article of any one of Aspect (42) through Aspect (47), wherein the DOC comprises about 0.2t or greater.

Aspect (49) pertains to the strengthened glass article of any one of Aspect (42) through Aspect (48), wherein the glass article comprises an alkali aluminosilicate glass, alkali containing borosilicate glass or alkali aluminoborosilicate glass.

Aspect (50) pertains to the strengthened glass article of any one of Aspect (42) through Aspect (49), wherein the glass article is disposed on a containment layer.

Aspect (51) pertains to a consumer electronic product comprising: a housing having a front surface; electrical components provided at least partially internal to the housing, the electrical components including at least a controller, a memory, and a display; and a cover glass disposed at the front surface of the housing and over the display, the cover glass comprising a strengthened glass article, wherein the strengthened glass article comprises: a first surface and a second surface opposing the first surface defining a thickness (t) of about 1.1 mm or less; a compressive stress layer extending from the first surface to a depth of compression (DOC) of greater than about 0.11·t; and a central tension (CT) of about 50 MPa or greater.

Aspect (52) pertains to the consumer electronics device of Aspect (51), wherein, after the glass article fractures according to a Frangibility Test, the glass article includes a plurality of fragments having an aspect ratio of about 5 or less, and Aspect (53) pertains to the consumer electronics device of Aspect (52), wherein the glass article fractures into the plurality of fragments in 1 second or less, as measured by the Frangibility Test.

Aspect (54) pertains to the consumer electronics device of Aspect (52) or Aspect (53), wherein at least 80% of the plurality of fragments have a maximum dimension that is less than or equal to 2·t.

Aspect (55) pertains to the consumer electronics device of any one of Aspect (52) through Aspect (54), wherein at least 50% of plurality of fragments each comprise an aspect ratio of 2 or less.

Aspect (56) pertains to the consumer electronics device of any one of Aspect (52) through Aspect (55), wherein at least 50% of the plurality of fragments comprises a volume of less than or equal to about 10 mm³.

Aspect (57) pertains to the consumer electronics device of any one of Aspect (52) through Aspect (56), wherein the plurality of fragments comprises an ejected portion of fragments, wherein the ejected portion of fragments comprises 10% or less of the plurality of fragments.

Aspect (58) pertains to the consumer electronics device of any one of Aspect (52) through Aspect (57), wherein the glass article comprises a first weight prior to fracture and the wherein the plurality of fragments comprises an ejected portion of fragments and a non-ejected portion of fragments, the non-ejected portion of fragments having a second weight, and the difference between the first weight and the second weight is 1% of the first weight.

Aspect (59) pertains to the consumer electronics device of any one of Aspect (53) through Aspect (58), wherein the probability of the glass article fracturing into the plurality of fragments within 1 second or less, as measured by the Frangibility Test, is 99% or greater.

Aspect (60) pertains to the consumer electronics device of any one of Aspect (51) through Aspect (59), wherein the glass article comprises a stored tensile energy of 20 J/m² or greater.

Aspect (61) pertains to the consumer electronics device of any one of Aspect (51) through Aspect (60), wherein the glass article comprises a surface compressive stress and a central tension, wherein the ratio of central tension to surface compressive stress is in the range from about 0.1 to about 1.

Aspect (62) pertains to the consumer electronics device of Aspect (61), wherein the surface compressive stress is 150 or greater.

Aspect (63) pertains to the consumer electronics device of any one of Aspect (51) through Aspect (62), wherein the DOC comprises about 0.2t or greater.

Aspect (64) pertains to the consumer electronics device of any one of Aspect (51) through Aspect (63), wherein the glass article comprises an alkali aluminosilicate glass, alkali containing borosilicate glass, alkali aluminophosphosilicate or alkali aluminoborosilicate glass.

Aspect (65) pertains to the consumer electronics device of any one of Aspect (51) through Aspect (64), wherein the glass article is disposed on a containment layer.

Aspect (66) pertains to the consumer electronics device of any one of Aspect (51) through Aspect (65), wherein the consumer electronic product comprises a tablet, a transparent display, a mobile phone, a video player, an information terminal device, an e-reader, a laptop computer, or a non-transparent display.

Aspect (67) pertains to a package product comprising: a housing comprising an opening, an exterior surface and an interior surface defining an enclosure; wherein the housing comprises a strengthened glass article, wherein the strengthened glass article comprises: a first surface and a second surface opposing the first surface defining a thickness (t) of about 1.1 mm or less; a compressive stress layer extending from the first surface to a depth of compression (DOC) of greater than about 0.11·t; and a central tension (CT) of 50 MPa or greater.

Aspect (68) pertains to the package product of Aspect (67), wherein, after the glass article fractures according to a Frangibility Test, the glass article includes a plurality of fragments having an aspect ratio of about 5 or less, and wherein the glass article fractures into the plurality of fragments in 1 second or less, as measured by the Frangibility Test.

Aspect (69) pertains to the package product of Aspect (68), wherein at least 80% of the plurality of fragments have a maximum dimension that is less than or equal to 2·t.

Aspect (70) pertains to the consumer electronics device of Aspect (68) or Aspect (69), wherein at least 50% of plurality of fragments each comprise an aspect ratio of 2 or less.

Aspect (71) pertains to the package product of any one of Aspect (68) through Aspect (70), wherein at least 50% of the plurality of fragments comprises a volume of less than or equal to about 10 mm³.

Aspect (72) pertains to the package product of any one of Aspect (68) through Aspect (71), wherein the plurality of fragments comprises an ejected portion of fragments, wherein the ejected portion of fragments comprises 10% or less of the plurality of fragments.

Aspect (73) pertains to the package product of any one of Aspect (68) through Aspect (72), wherein the glass article comprises a first weight prior to fracture and the wherein the plurality of fragments comprises an ejected portion of fragments and a non-ejected portion of fragments, the non-ejected portion of fragments having a second weight, and the difference between the first weight and the second weight is 1% of the first weight.

Aspect (74) pertains to the package product of any one of Aspect (68) through Aspect (73), wherein the probability of the glass article fracturing into the plurality of fragments within 1 second or less, as measured by the Frangibility Test, is 99% or greater.

Aspect (75) pertains to the package product of any one of Aspect (67) through Aspect (74), wherein the glass article comprises a stored tensile energy of 20 J/m² or greater.

Aspect (76) pertains to the package product of any one of Aspect (67) through Aspect (75), wherein the glass article comprises a surface compressive stress and a central tension, wherein the ratio of central tension to surface compressive stress is in the range from about 0.1 to about 1.

Aspect (77) pertains to the package product of Aspect (76), wherein the surface compressive stress is 150 or greater.

Aspect (78) pertains to the package product of any one of Aspect (67) through Aspect (77), wherein the DOC comprises about 0.2t or greater.

Aspect (79) pertains to the package product of any one of Aspect (67) through Aspect (78), wherein the glass article comprises an alkali aluminosilicate glass, alkali containing borosilicate glass, alkali aluminophosphosilicate or alkali aluminoborosilicate glass.

Aspect (80) pertains to the package product of any one of Aspect (67) through Aspect (72), wherein the glass article is disposed on a containment layer.

Aspect (82) pertains to the package product of any one of Aspect (67) through Aspect (80), further comprising a pharmaceutical material.

Aspect (83) pertains to the package product of any one of Aspect (67) through Aspect (81), further comprising a cap disposed in the opening.

It will be apparent to those skilled in the art that various modifications and variations can be made without departing from the spirit or scope of the invention.

What is claimed is:

1. A strengthened glass article comprising:
   a first surface and a second surface opposing the first surface defining a thickness (t);
   a compressive stress layer extending from the first surface to a depth of compression (DOC) of greater than 0.16·t as measured by scattered light polariscope, wherein the compressive stress at a Potassium depth of layer is from 120 MPa to 300 MPa; and
   a maximum central tension that is greater than or equal to 50 MPa as measured by scattered light polariscope.

2. The strengthened glass article of claim 1, wherein the glass article fractures into a plurality of fragments according to a Frangibility Test, and at least one of:
   at least 80% of the plurality of fragments have a maximum dimension that is less than or equal to 3·t;
   at least 50% of plurality of fragments comprises an aspect ratio of 2 or less; or
   at least 50% of the plurality of fragments comprises a volume of less than or equal to about 10 mm$^3$.

3. The strengthened glass article of claim 2, wherein the ratio of the maximum central tension to surface compressive stress is in the range from about 0.1 to about 1.

4. The strengthened glass article of claim 3, wherein the glass article comprises an alkali aluminosilicate glass, alkali containing borosilicate glass, an alkali aluminophosphosilicate glass or alkali aluminoborosilicate glass.

5. The strengthened glass article of claim 4, further comprising:
   a CT region of the stress profile, wherein the CT region is defined by the equation:

$$\text{Stress}(x) = \text{MaxCT} - (((\text{MaxCT} \cdot (n+1))/0.5^n) \cdot |(x/t) - 0.5|^n),$$

wherein MaxCT is the maximum CT value and is provided as a positive value in units of MPa, x is position along the thickness (t) in micrometers, and n is between 1.5 and 5.

6. The strengthened glass article of claim 5, wherein the maximum central tension is 100 MPa or greater.

7. The strengthened glass article of claim 6, wherein the glass article comprises a stored tensile energy of 40 J/m$^2$ or greater.

8. The strengthened glass article of claim 7, wherein t is 3 mm or less.

9. The strengthened glass article of claim 8, wherein, after the glass article fractures according to a Frangibility Test, the glass article includes a plurality of fragments, wherein at least 90% of the plurality of fragments have an aspect ratio of about 5 or less.

10. The strengthened glass article of claim 1, as and when used for the manufacture of a consumer electronic product comprising:
    a housing having a front surface;
    electrical components provided at least partially internal to the housing, the electrical components including at least a controller, a memory, and a display; and
    a cover glass disposed at the front surface of the housing and over the display, or disposed as a back cover, the cover glass comprising a strengthened glass article.

11. A strengthened glass article comprising:
    a first surface and a second surface opposing the first surface defining a thickness (t);
    a compressive stress layer extending from the first surface to a depth of compression (DOC) of greater than 0.2·t as measured by scattered light polariscope; and
    a maximum central tension of 85 MPa or more as measured by scattered light polariscope, and a stored tensile energy of 40 J/m$^2$ or more,
    wherein the compressive stress at a Potassium depth of layer is from 120 to 350 MPa.

12. The strengthened glass article of claim 11, further comprising:
    a CT region of the stress profile, wherein the CT region is defined by the equation:

$$\text{Stress}(x) = \text{MaxCT} - (((\text{MaxCT} \cdot (n+1))/0.5^n) \cdot |(x/t) - 0.5|^n),$$

wherein MaxCT is the maximum CT value and is provided as a positive value in units of MPa, x is position along the thickness (t) in micrometers, and n is between 1.5 and 5.

13. The strengthened glass article of claim 12, wherein t is 3 mm or less.

14. The strengthened glass article of claim 13, wherein the central tension is 100 MPa or more.

15. The strengthened glass article of claim 14, wherein, after the glass article fractures according to a Frangibility Test, the glass article includes a plurality of fragments, wherein at least 90% of the plurality of fragments have an aspect ratio of about 5 or less.

16. The strengthened glass article of claim 11, as and when used for the manufacture of a consumer electronic product comprising:
    a housing having a front surface;
    electrical components provided at least partially internal to the housing, the electrical components including at least a controller, a memory, and a display; and
    a cover glass disposed at the front surface of the housing and over the display, or disposed as a back cover, the cover glass comprising a strengthened glass article.

* * * * *

UNITED STATES PATENT AND TRADEMARK OFFICE
CERTIFICATE OF CORRECTION

PATENT NO. : 11,613,103 B2
APPLICATION NO. : 16/804271
DATED : March 28, 2023
INVENTOR(S) : Steven Edward DeMartino et al.

Page 1 of 1

It is certified that error appears in the above-identified patent and that said Letters Patent is hereby corrected as shown below:

On the Title Page

On the page 5, in Column 2, item [56], under "Other Publications", Line 9, delete "Materias," and insert -- Materials, --.
On the page 5, in Column 2, item [56], under "Other Publications", Line 27, delete "1992." and insert -- 1992). --.
On the page 6, in Column 1, item [56], under "Other Publications", Line 14, delete "(2005" and insert -- (2005). --.
On the page 6, in Column 1, item [56], under "Other Publications", Line 33, delete "(1988." and insert -- (1988). --.
On the page 6, in Column 1, item [56], under "Other Publications", Line 39, delete "(2001." and insert -- (2001). --.
On the page 6, in Column 1, item [56], under "Other Publications", Line 41, delete "vurbature" and insert -- curvature --.
On the page 6, in Column 1, item [56], under "Other Publications", Line 41, delete "Materias," and insert -- Materials, --.
On the page 6, in Column 1, item [56], under "Other Publications", Lines 52-53, delete "crystallizationof" and insert -- crystallization of --.
On the page 6, in Column 1, item [56], under "Other Publications", Line 56, delete "(2011." and insert -- (2011). --.
On the page 6, in Column 2, item [56], under "Other Publications", Line 50, delete "Engineerred" and insert -- Engineered --.
On the page 6, in Column 2, item [56], under "Other Publications", Line 51, delete "Jounral" and insert -- Journal --.
On the page 7, in Column 1, item [56], under "Other Publications", Line 10, delete "(2003." and insert -- (2003). --.
On the page 7, in Column 2, item [56], under "Other Publications", Line 14, delete "Pages" and insert -- Pages; --.
On the page 8, in Column 1, item [56], under "Other Publications", Line 3, delete "Opinoin" and insert -- Opinion --.

Signed and Sealed this
Twenty-eighth Day of October, 2025

John A. Squires
*Director of the United States Patent and Trademark Office*